(12) United States Patent
Shuto et al.

(10) Patent No.: US 11,024,368 B2
(45) Date of Patent: Jun. 1, 2021

(54) SEMICONDUCTOR CIRCUIT AND SEMICONDUCTOR CIRCUIT SYSTEM

(71) Applicant: SONY SEMICONDUCTOR SOLUTIONS CORPORATION, Kanagawa (JP)

(72) Inventors: Yusuke Shuto, Kanagawa (JP); Keizo Hiraga, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 104 days.

(21) Appl. No.: 16/347,448

(22) PCT Filed: Nov. 1, 2017

(86) PCT No.: PCT/JP2017/039520
§ 371 (c)(1),
(2) Date: May 3, 2019

(87) PCT Pub. No.: WO2018/088297
PCT Pub. Date: May 17, 2018

(65) Prior Publication Data
US 2019/0333574 A1    Oct. 31, 2019

(30) Foreign Application Priority Data

Nov. 14, 2016 (JP) ............................. JP2016-221977

(51) Int. Cl.
*G11C 11/412* (2006.01)
*G11C 14/00* (2006.01)
(Continued)

(52) U.S. Cl.
CPC .......... *G11C 11/412* (2013.01); *G11C 14/009* (2013.01); *G11C 14/0072* (2013.01);
(Continued)

(58) Field of Classification Search
CPC .................................................. G11C 14/0081
See application file for complete search history.

(56) References Cited

U.S. PATENT DOCUMENTS

| 6,914,845 B2 * | 7/2005 | Ooishi ............... G11C 14/0081 365/154 |
| 2003/0223283 A1 * | 12/2003 | Kunikiyo ............ G11C 11/1655 365/200 |

(Continued)

FOREIGN PATENT DOCUMENTS

| JP | 2004-133969 | 4/2004 |
| JP | 2016-018573 | 2/2016 |
| WO | WO 2016/185903 | 3/2018 |

OTHER PUBLICATIONS

International Search Report prepared by the Japan Patent Office dated Jan. 24, 2018, for International Application No. PCT/JP2017/039520.

*Primary Examiner* — Douglas King
(74) *Attorney, Agent, or Firm* — Sheridan Ross P.C.

(57) ABSTRACT

A semiconductor circuit according to the disclosure includes a first circuit that can generate an inverted voltage of a voltage at a first-node and apply the inverted voltage to a second-node, a second circuit that can generate an inverted voltage of the voltage at the second-node and apply the inverted voltage to the first-node, a first transistor coupling the first-node to the third-node by turning on, a first storage element having a first terminal coupled to the third-node and a second terminal supplied with a control voltage and being able to take a first or second resistance state, a first voltage setting circuit that is coupled to the third-node and can set a voltage at the third-node to a voltage corresponding to a voltage at a predetermined node out of the first and second nodes, and a driver controlling an operation of the first transistor and setting the control voltage.

41 Claims, 67 Drawing Sheets

(51) Int. Cl.
    *G11C 11/418*        (2006.01)
    *G11C 11/419*        (2006.01)
(52) U.S. Cl.
    CPC ........ *G11C 14/0081* (2013.01); *G11C 11/418* (2013.01); *G11C 11/419* (2013.01)

(56) References Cited

U.S. PATENT DOCUMENTS

| | | |
|---|---|---|
| 2004/0066669 A1 | 4/2004 | Ooishi |
| 2007/0195616 A1* | 8/2007 | Fallah .................... G11C 29/02 365/194 |
| 2016/0005450 A1 | 1/2016 | Takeno et al. |

* cited by examiner

[ FIG. 1 ]
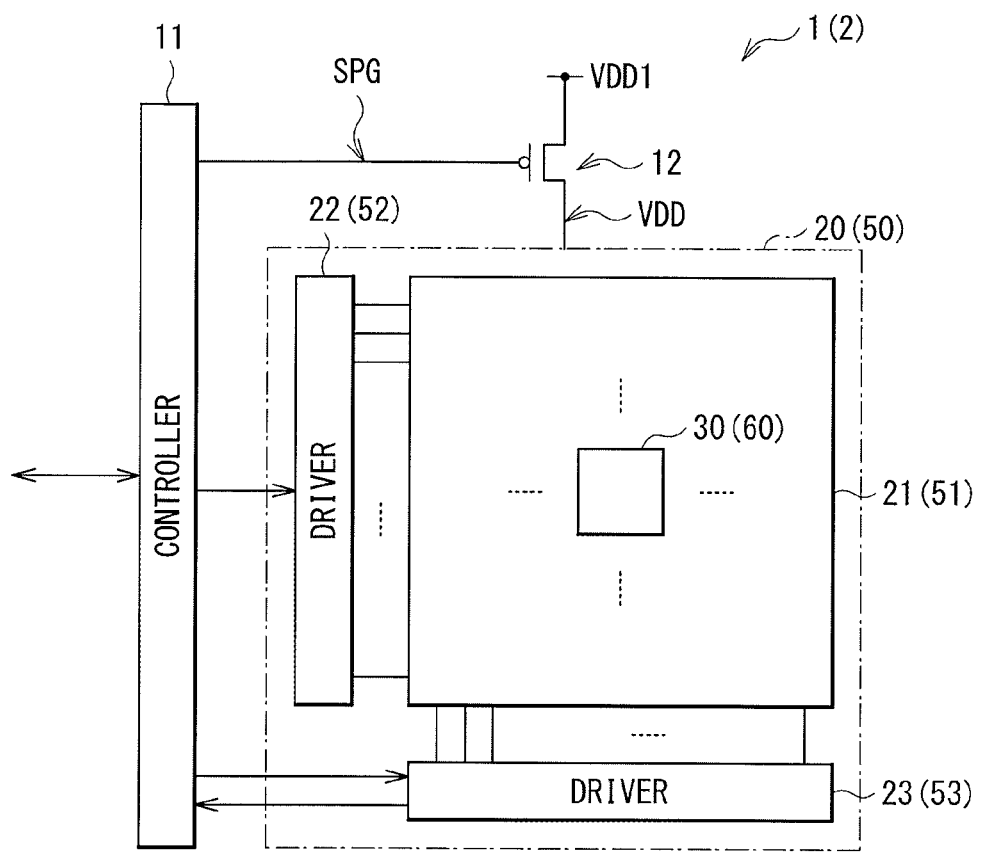

[FIG. 2]
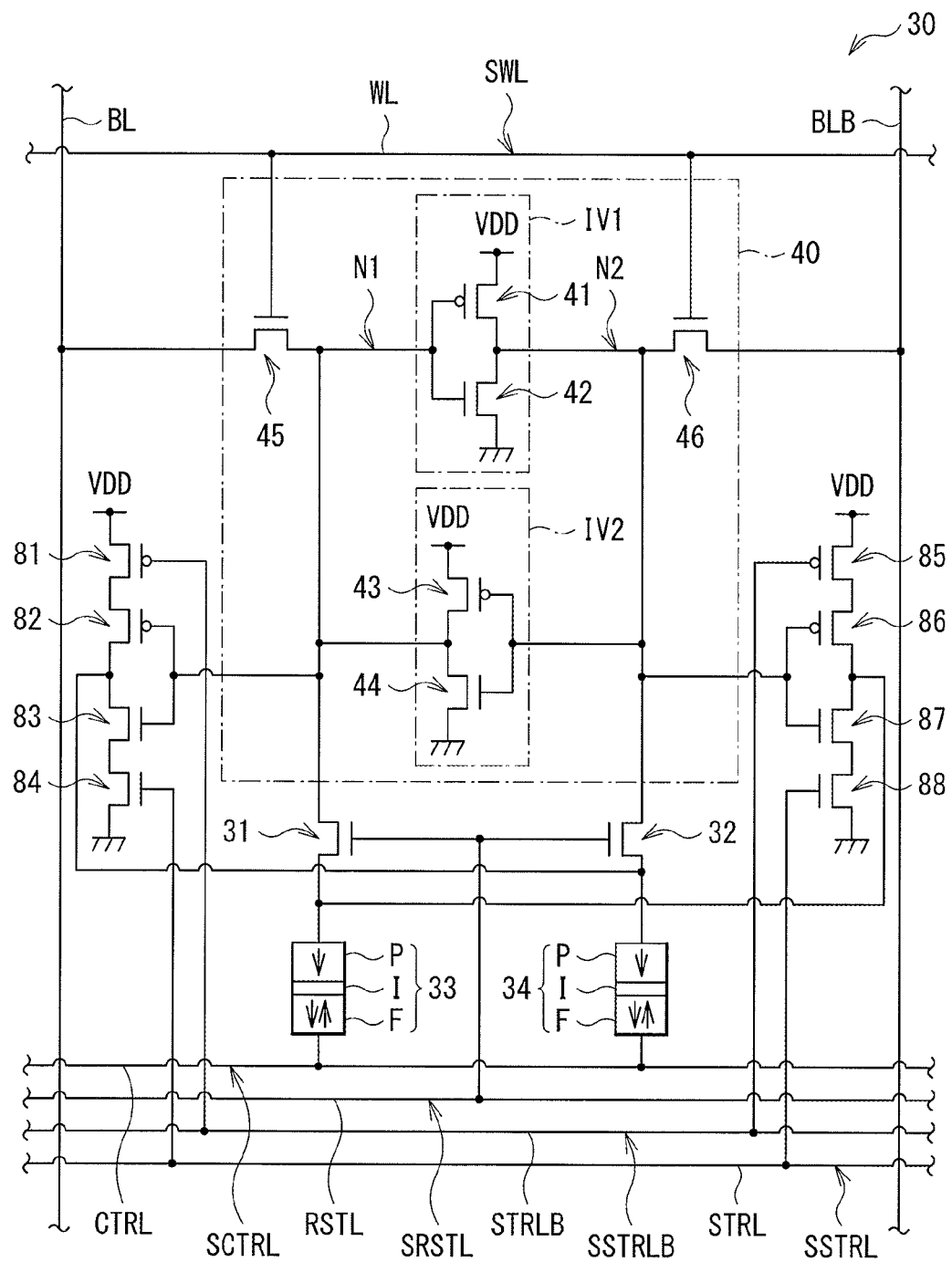

[FIG. 3]
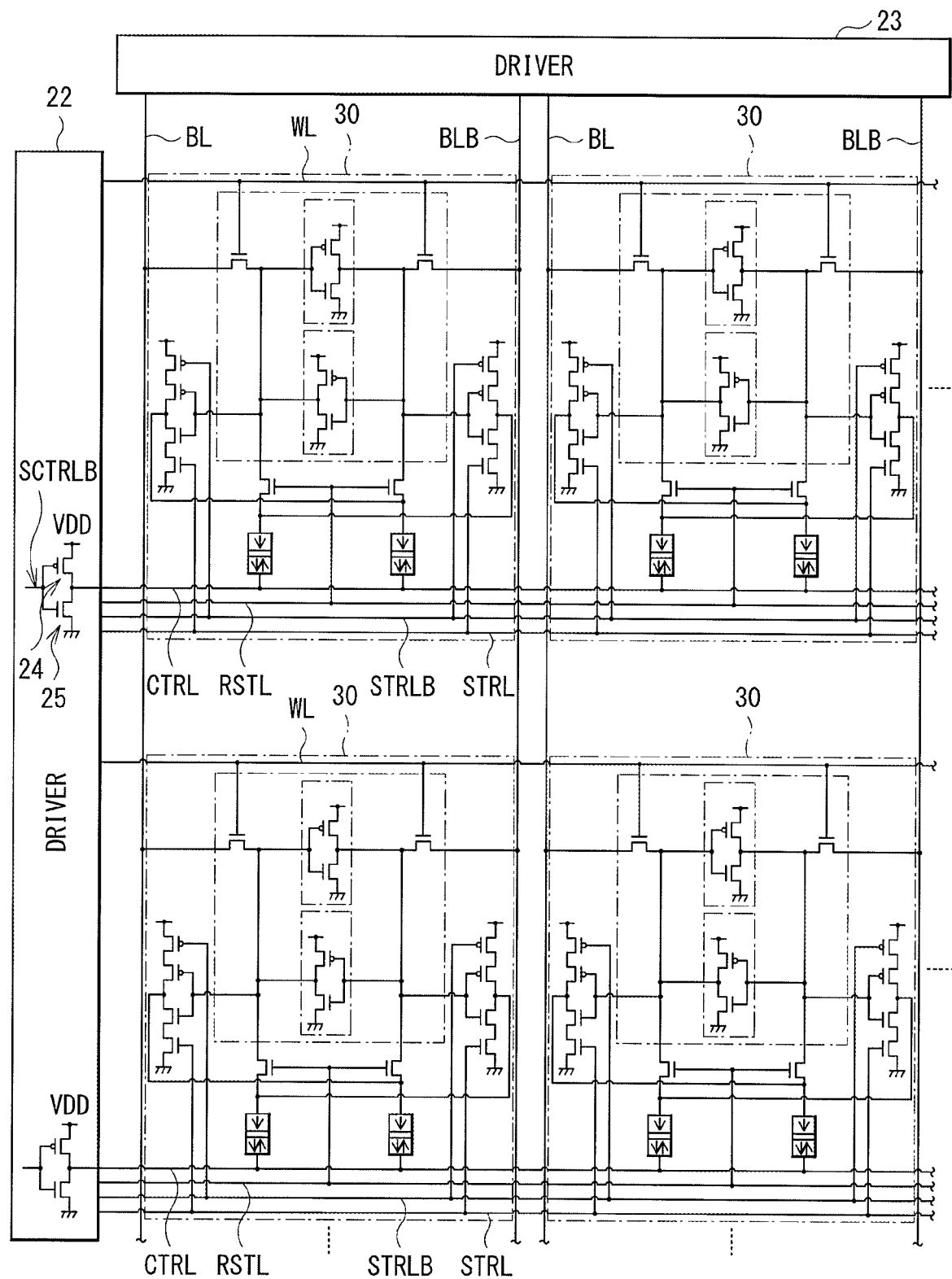

[ FIG. 4 ]
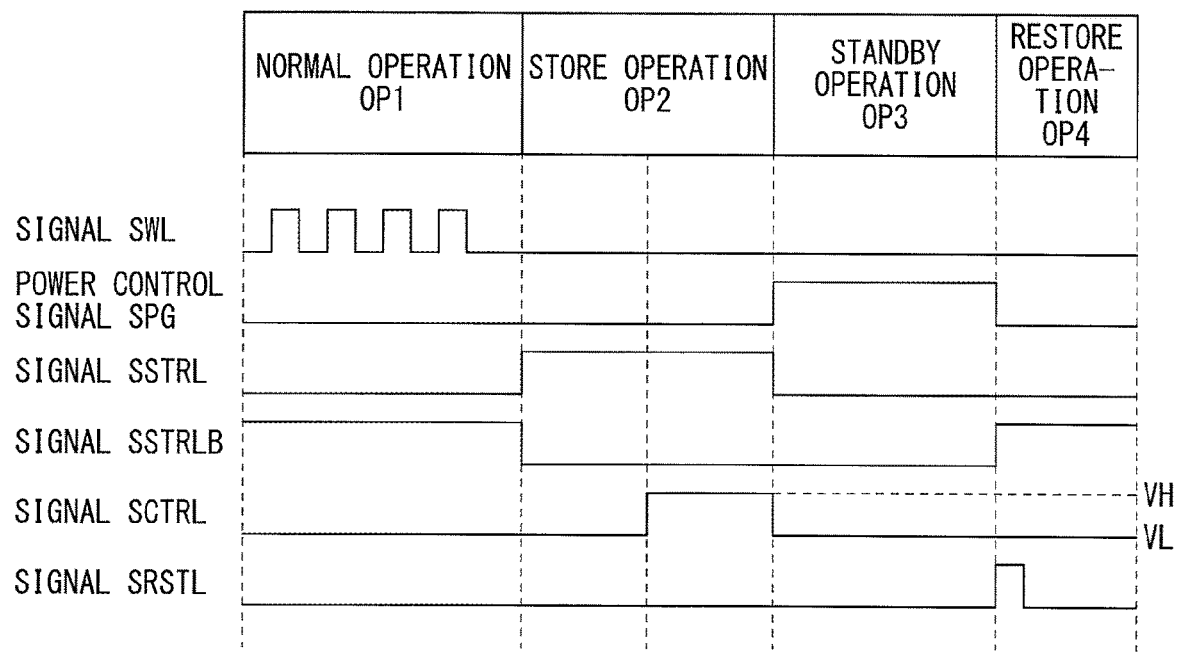
[ FIG. 5A ]
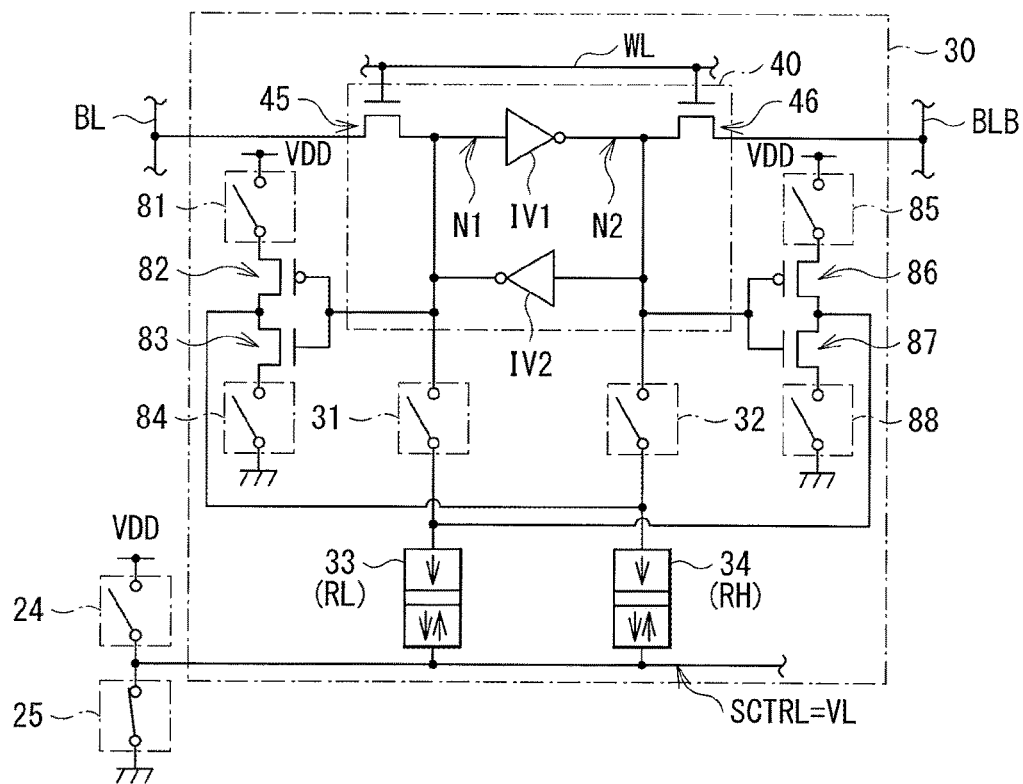

[FIG. 5B]
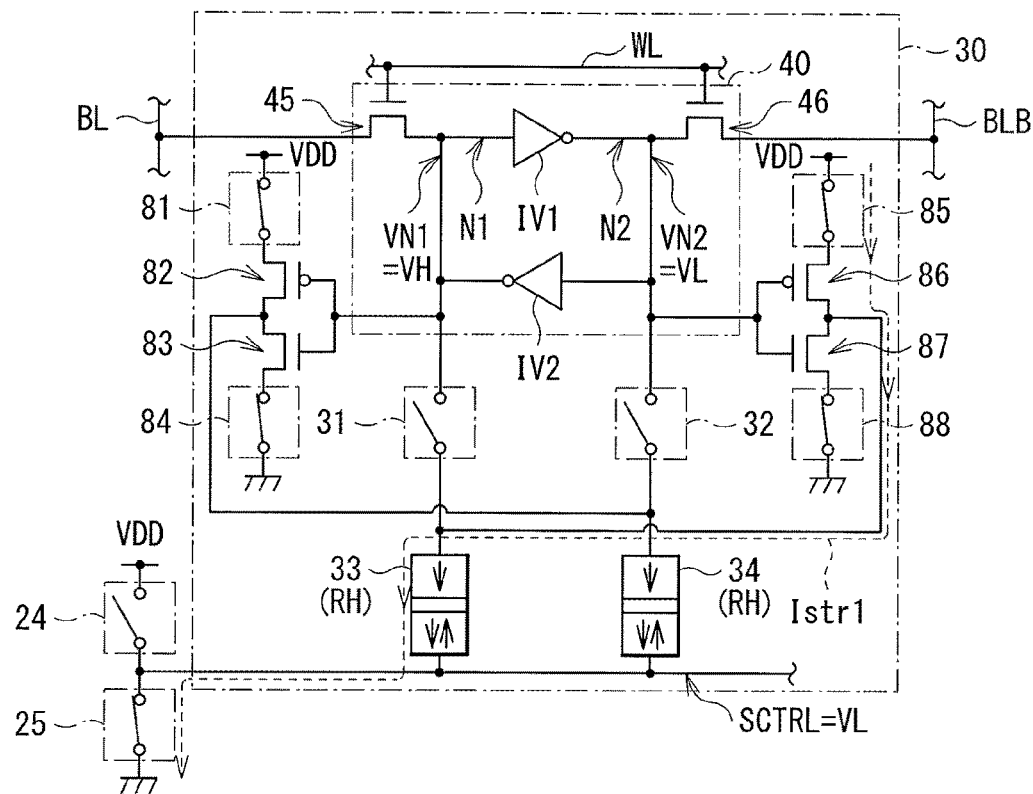
[FIG. 5C]
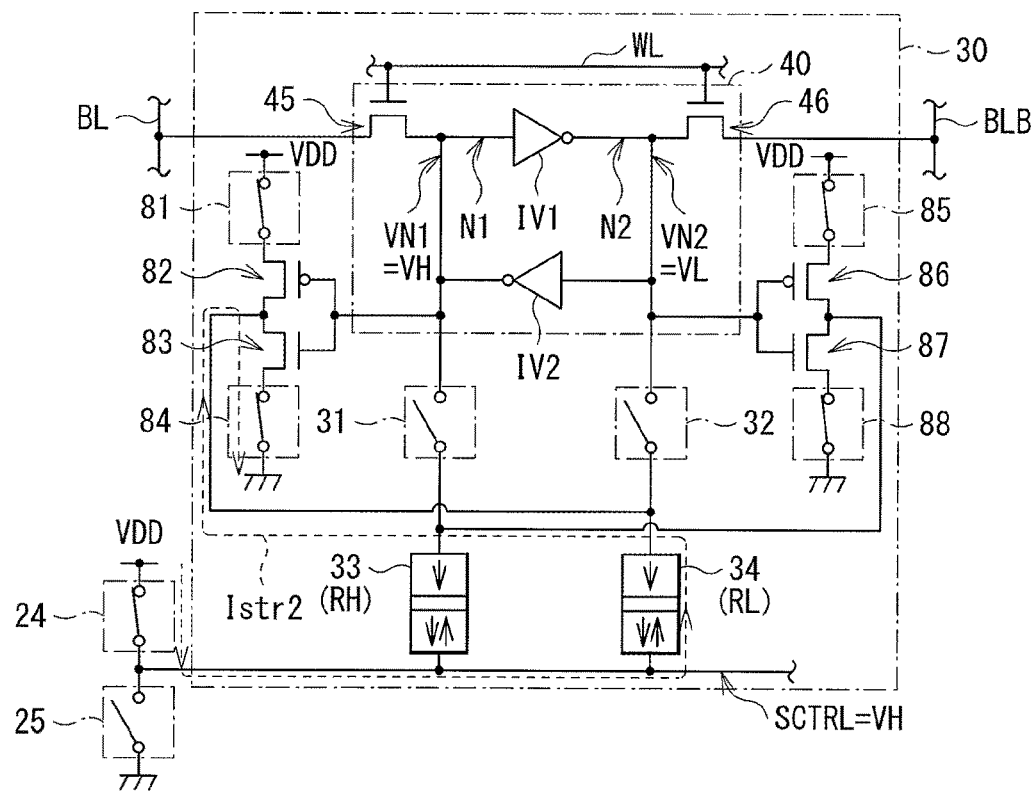

[ FIG. 5D ]
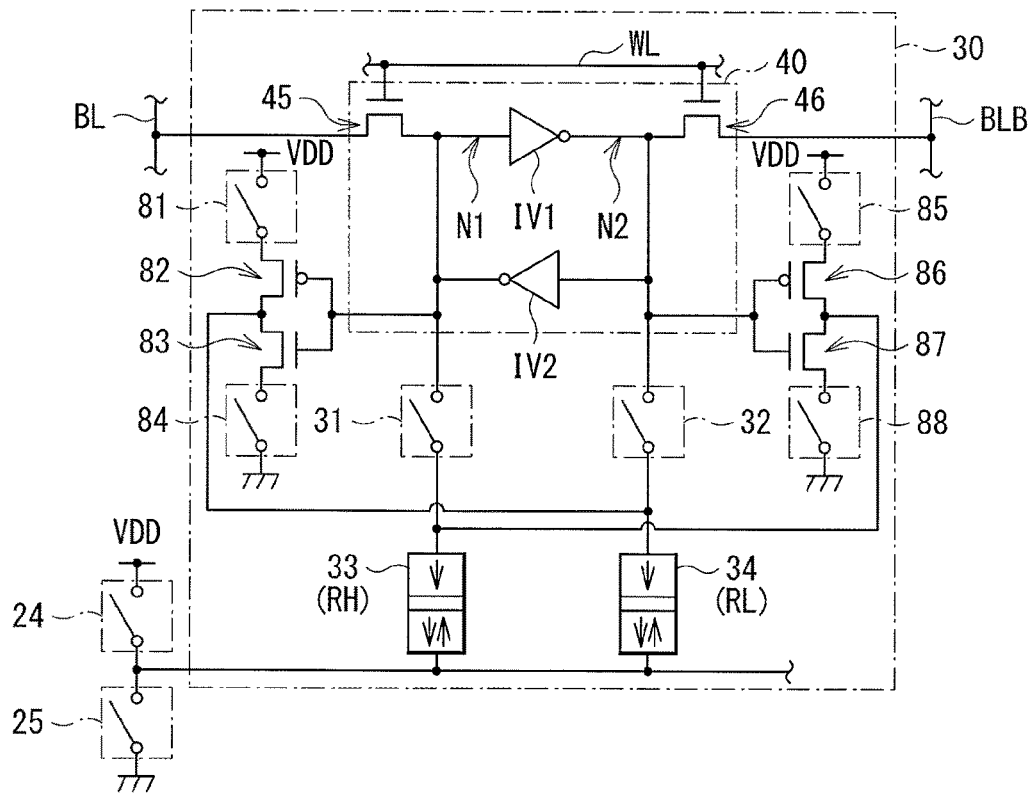
[ FIG. 5E ]
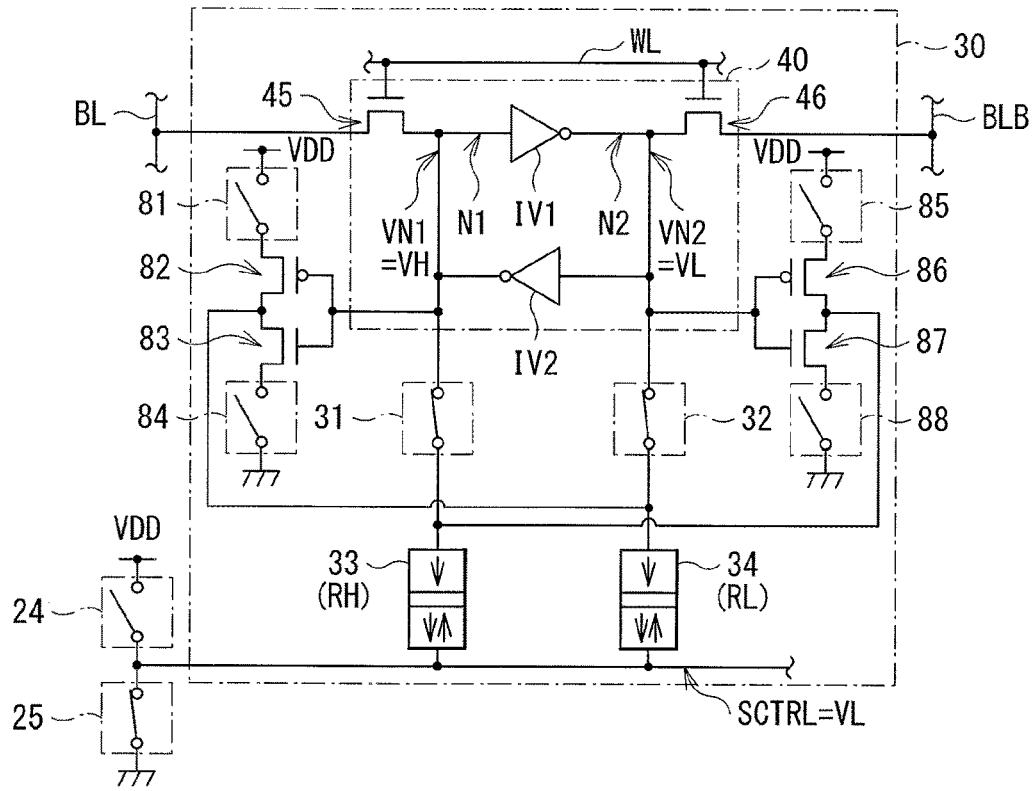

[ FIG.6 ]
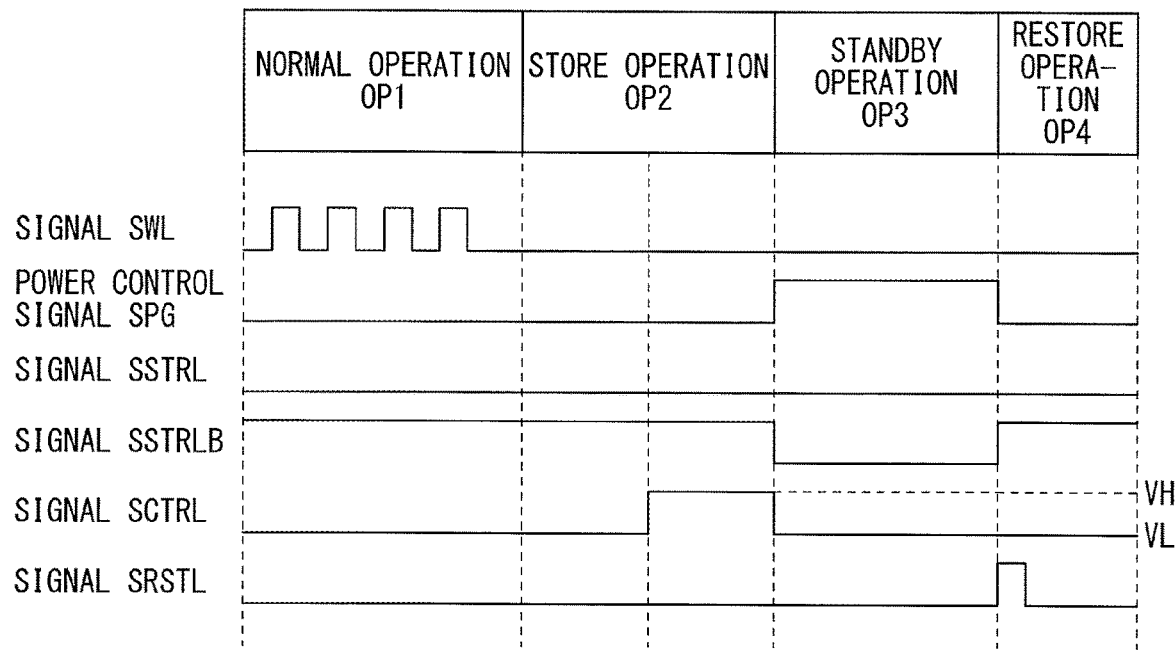

[FIG. 7]
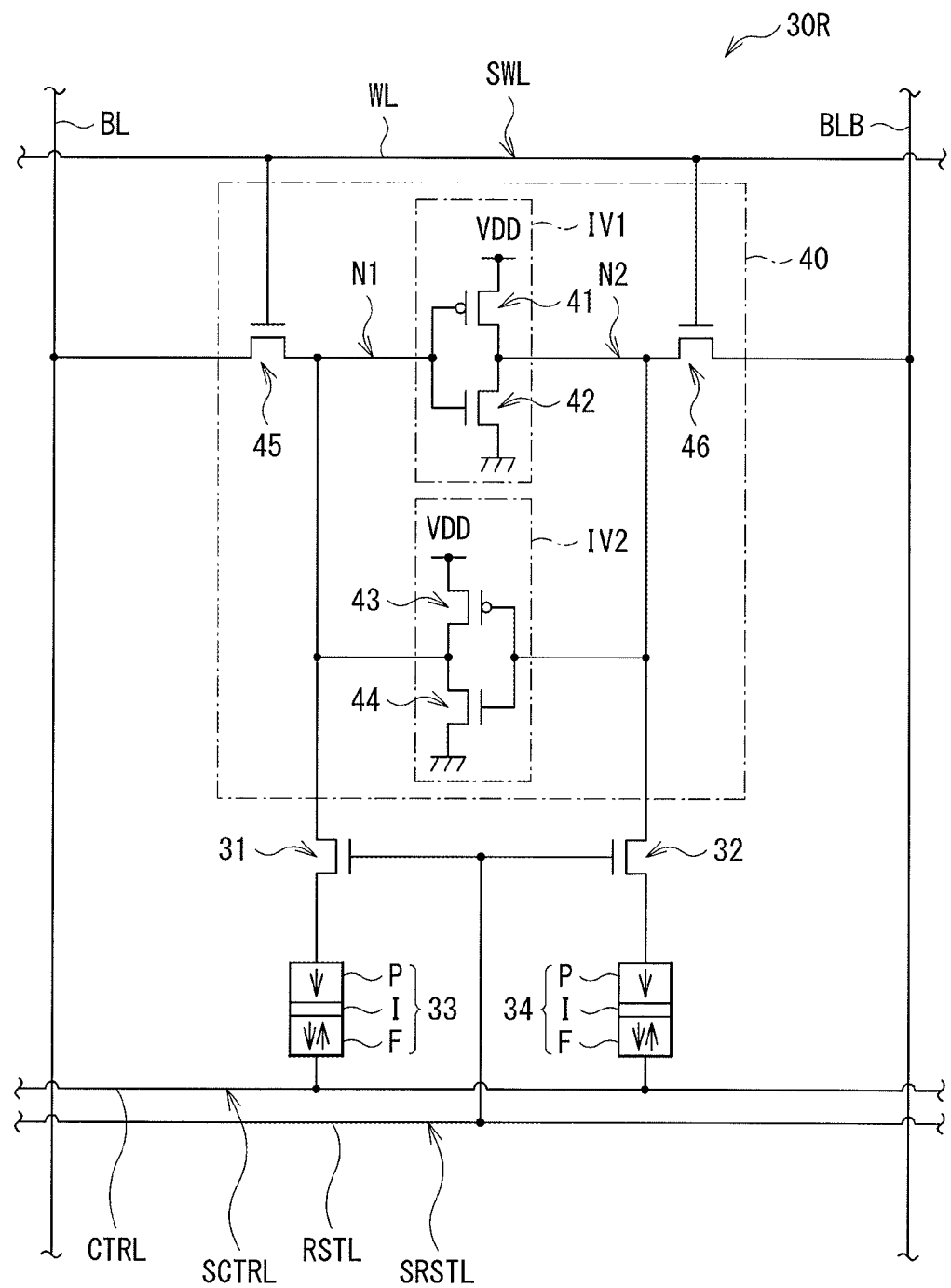

[FIG. 8]
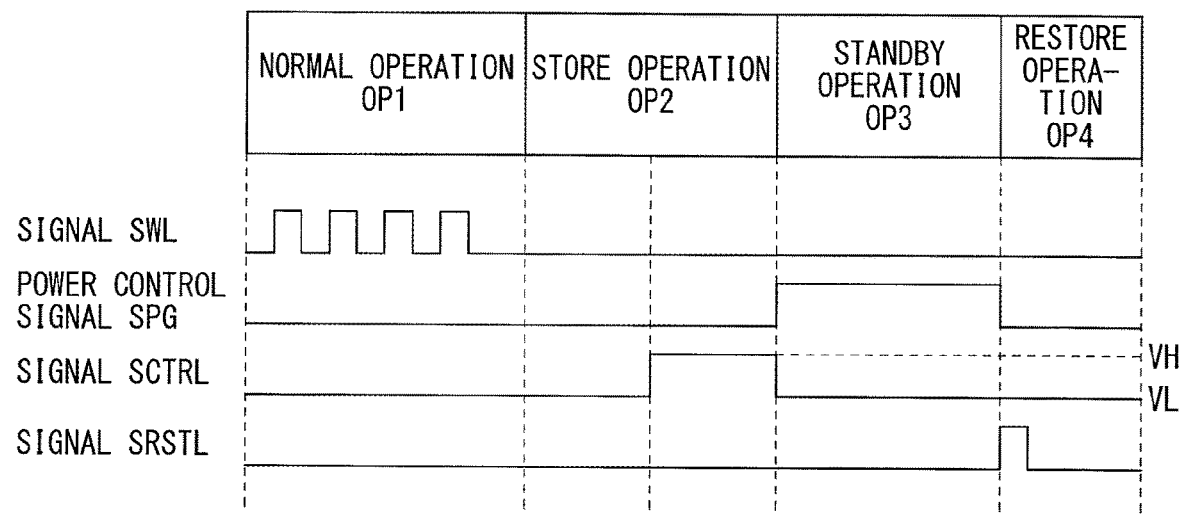

[FIG. 9A]
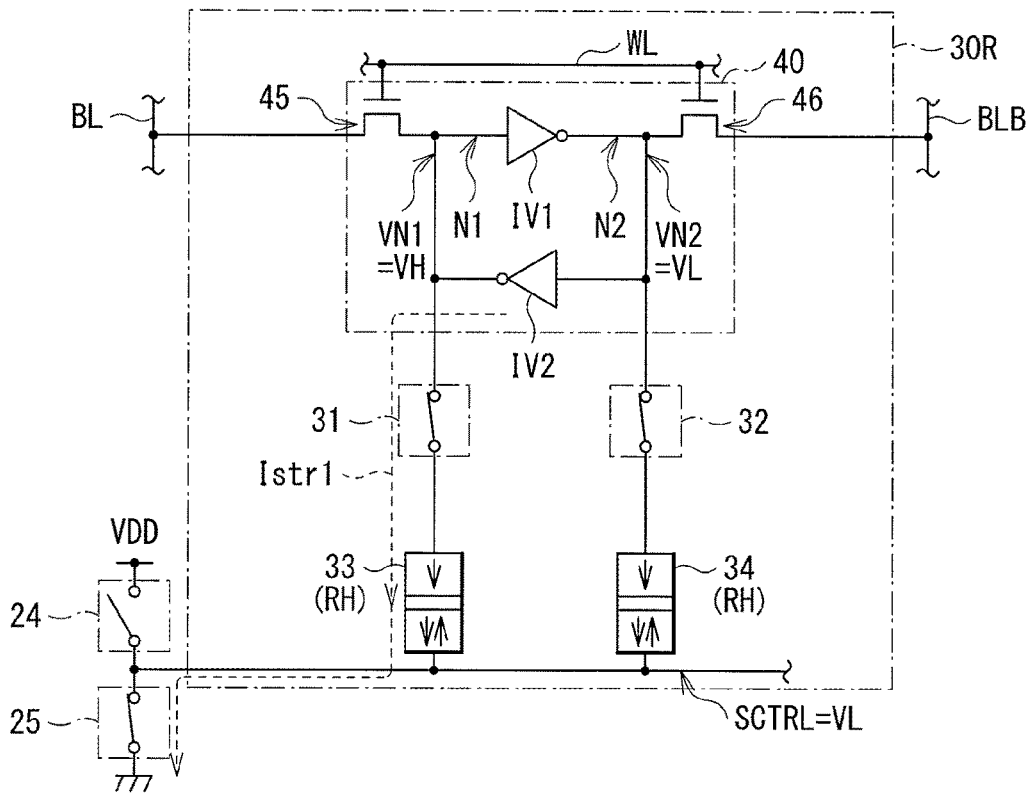
[FIG. 9B]
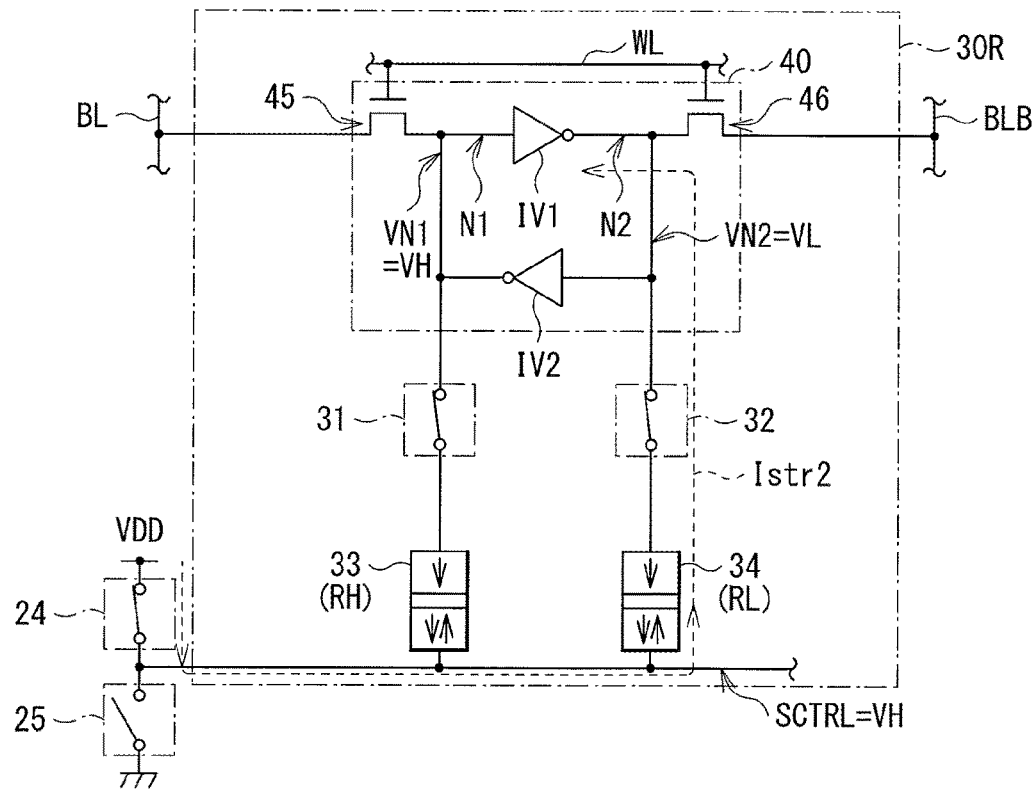

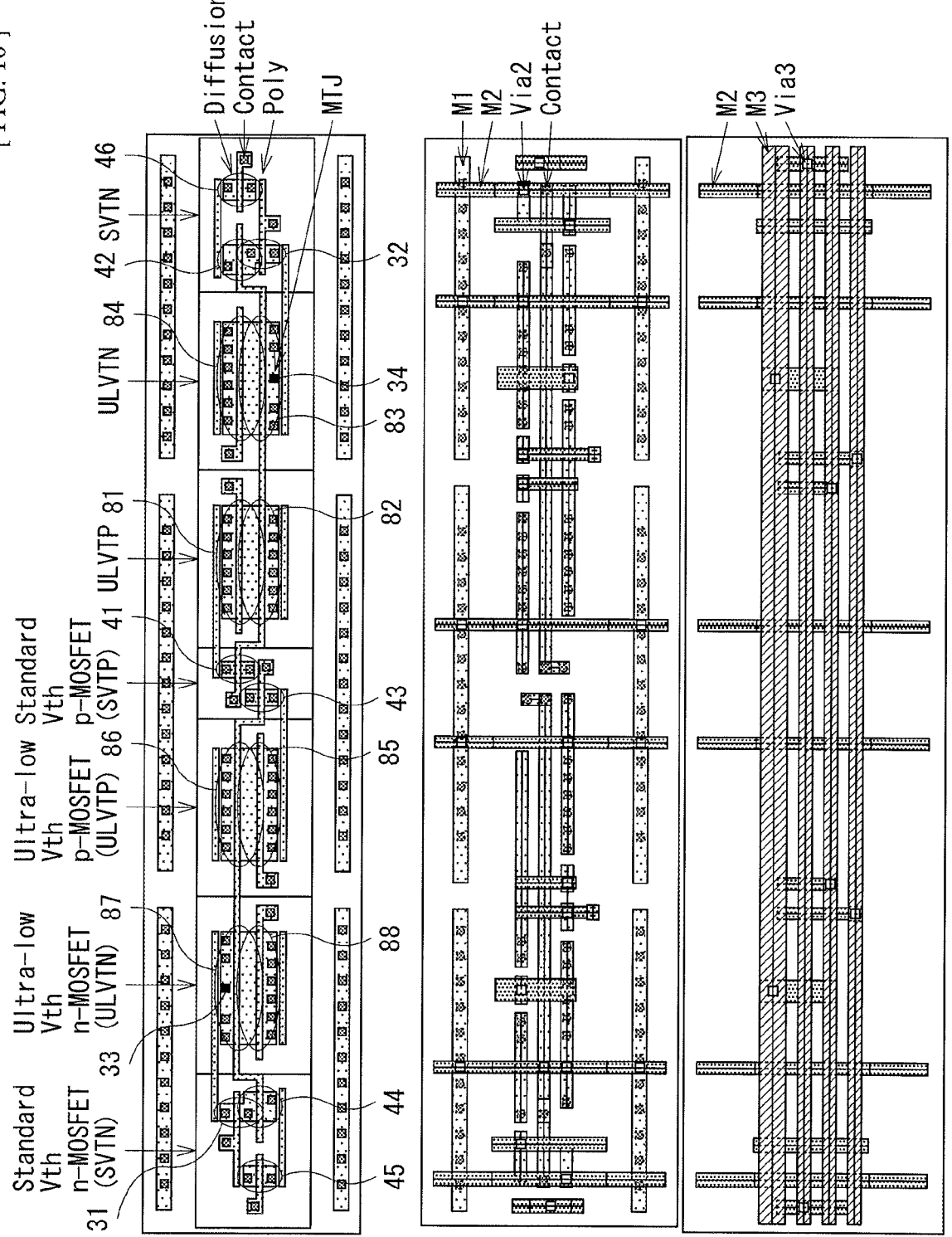
[FIG. 10]

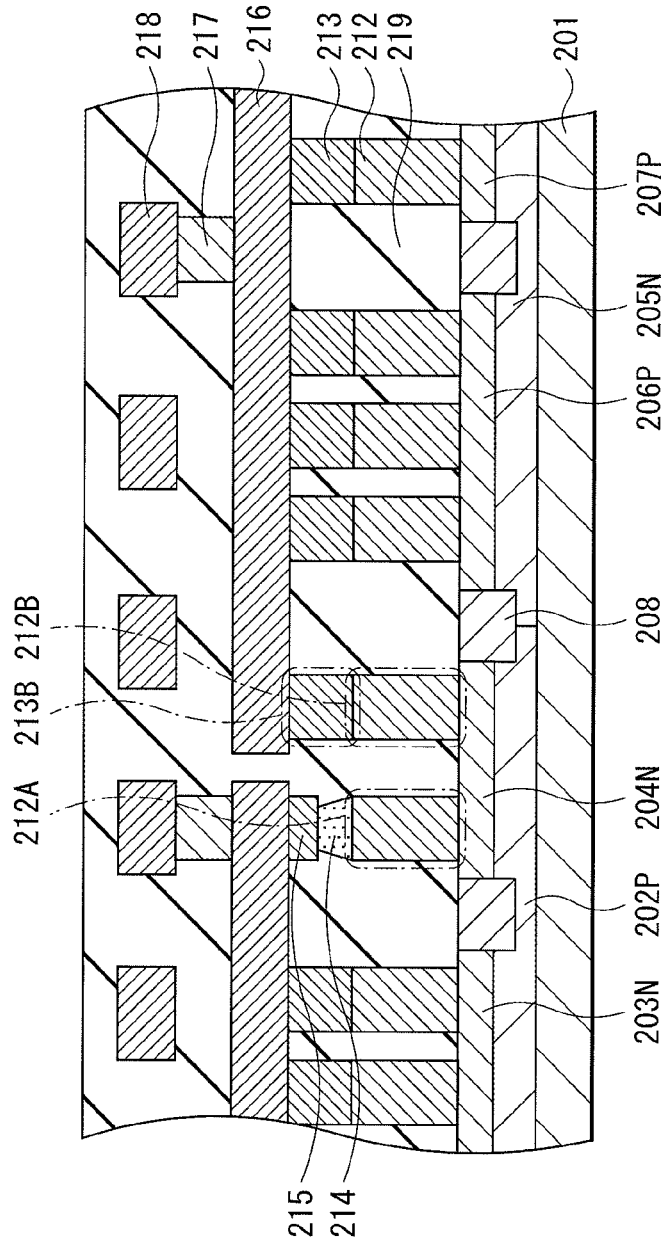
[FIG. 11]

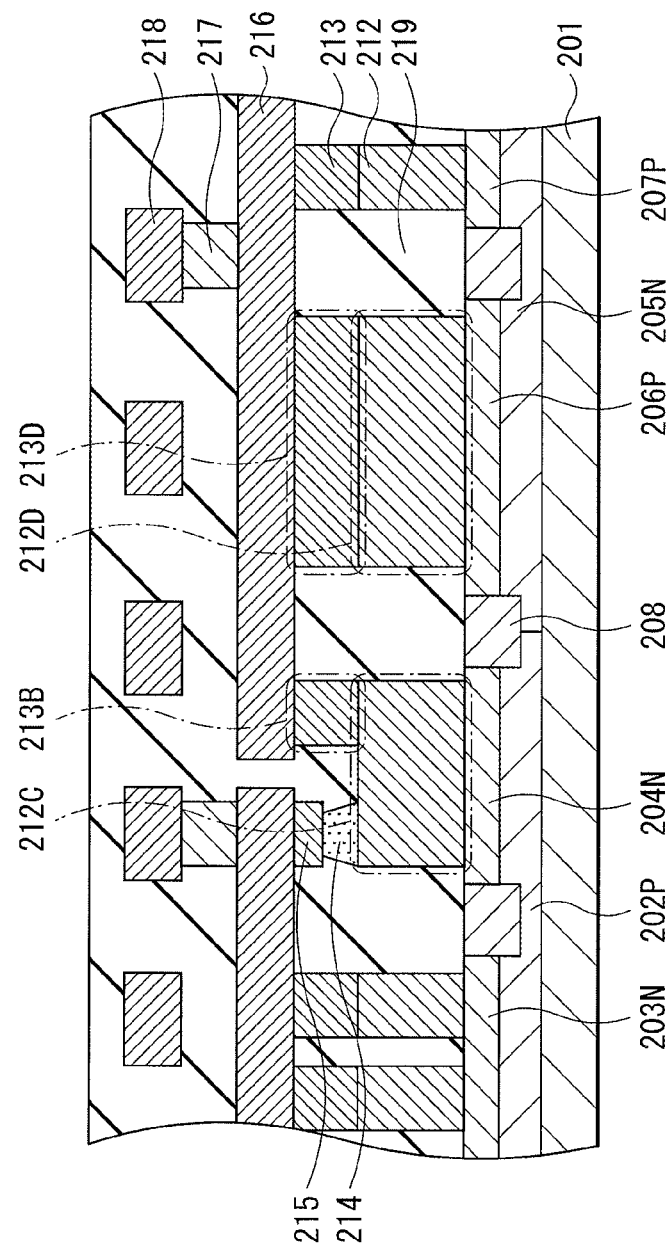
[FIG.12]

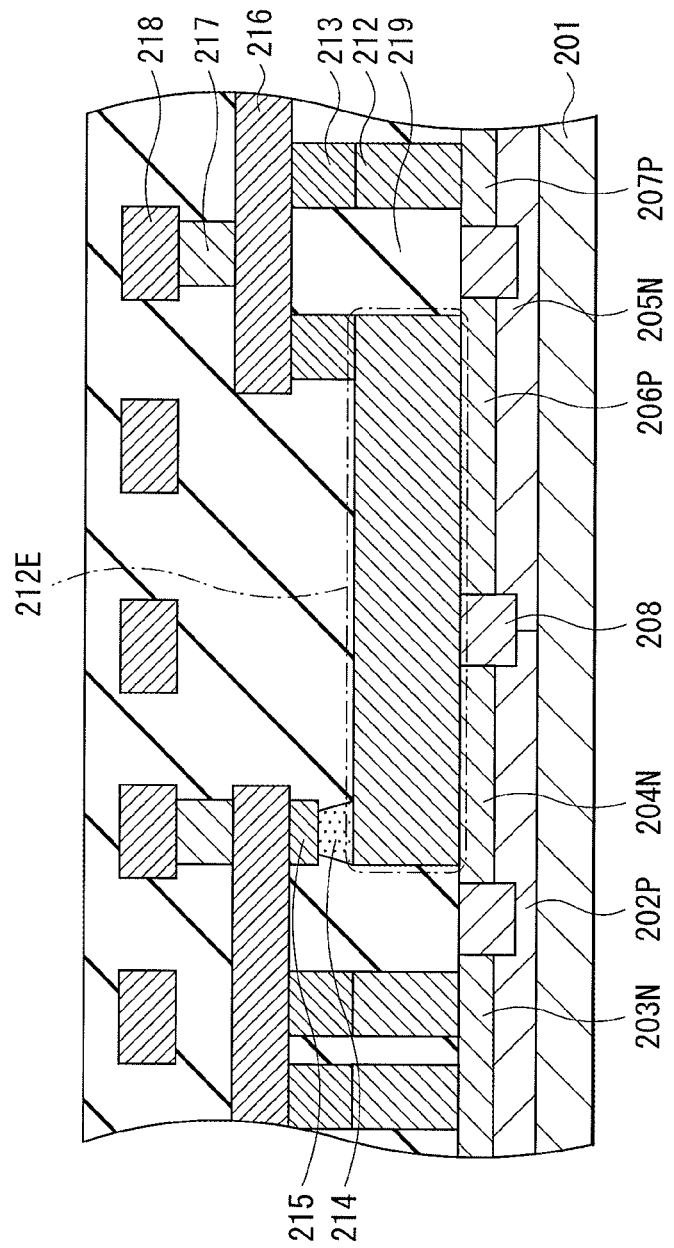
[FIG. 13]

[ FIG. 14 ]
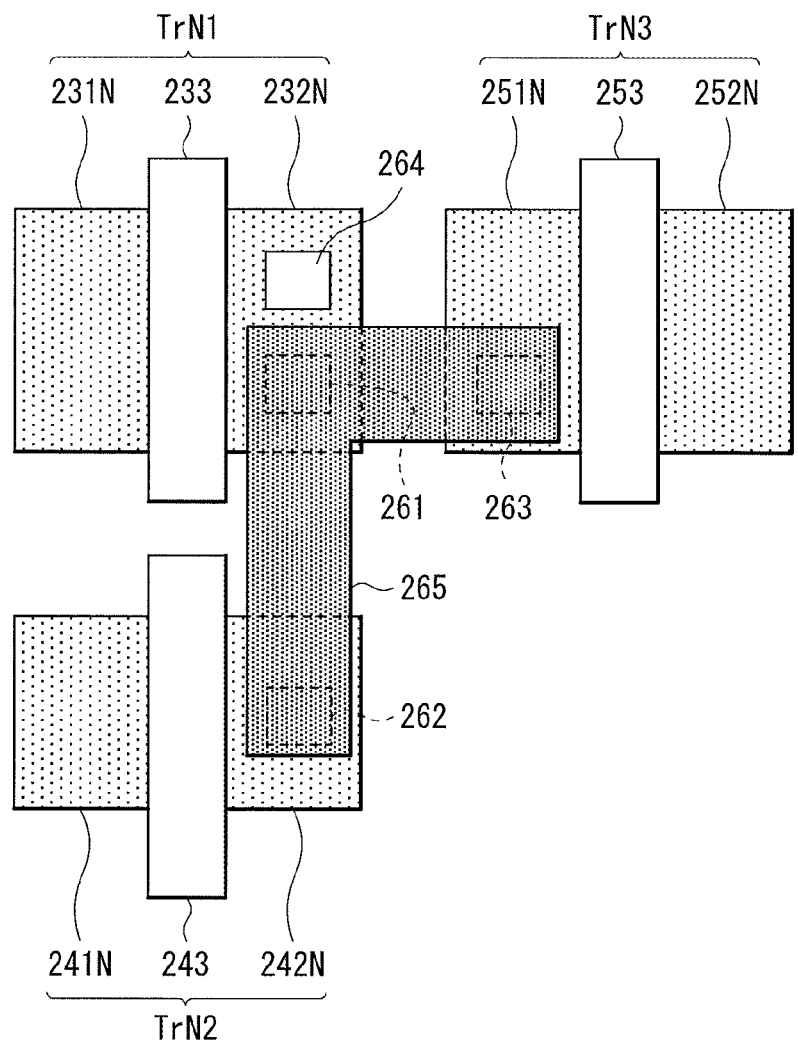

[ FIG. 15 ]
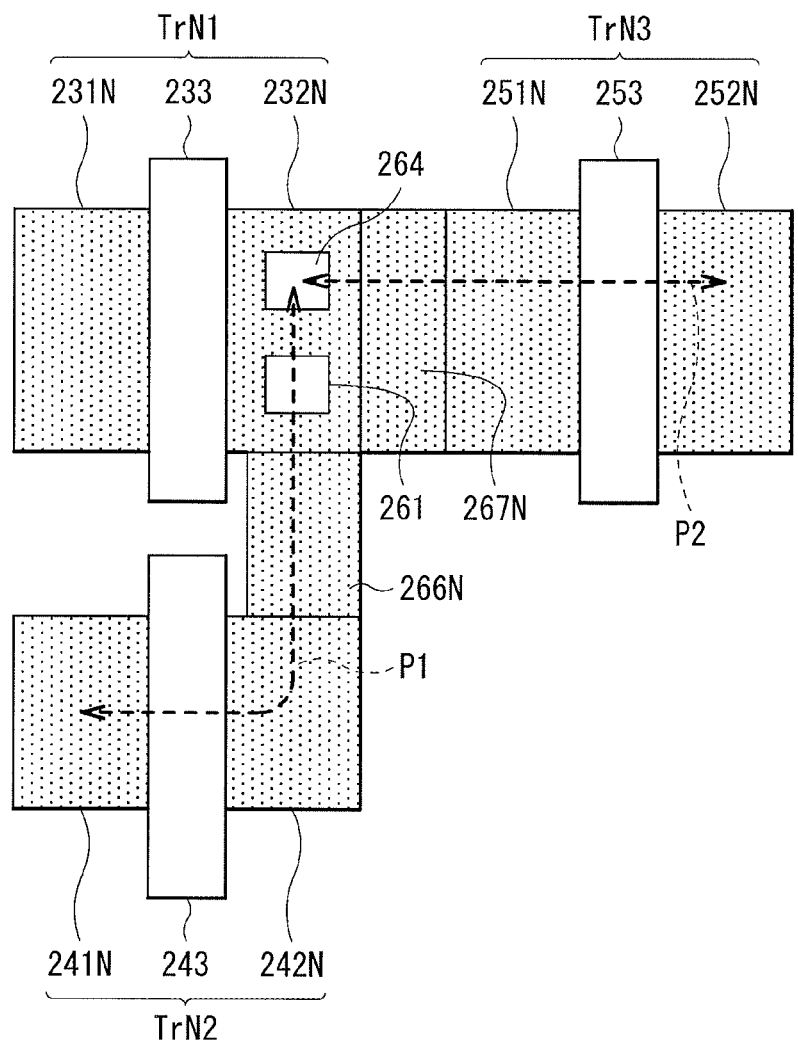

[FIG. 16]
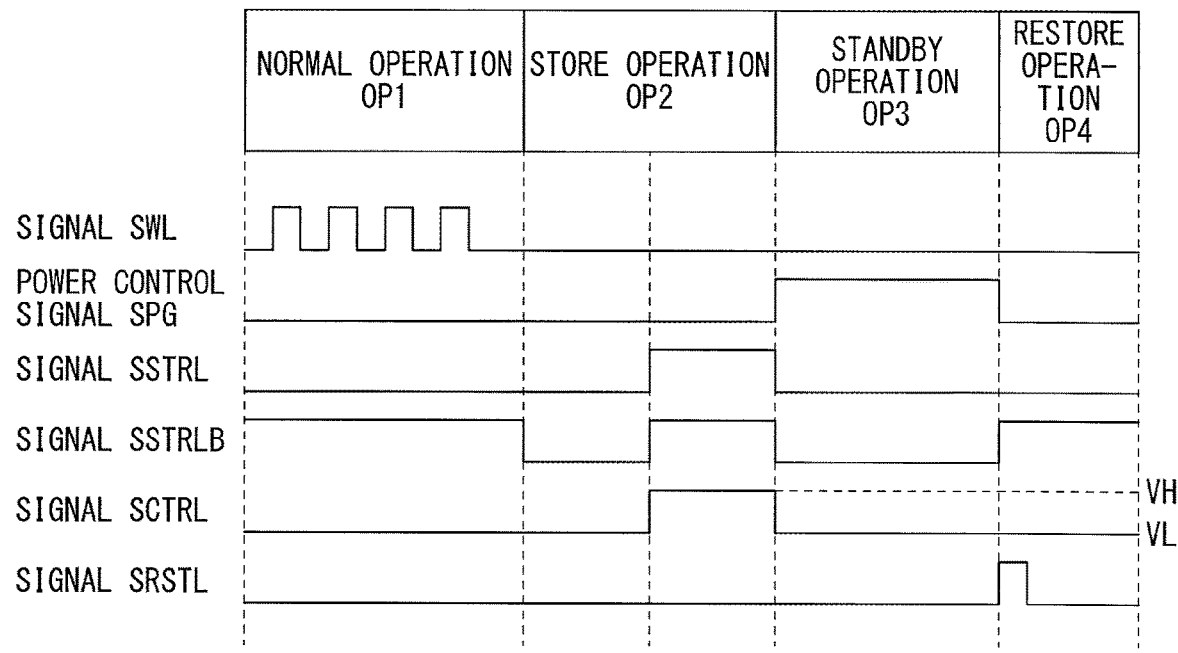

[ FIG. 17A ]
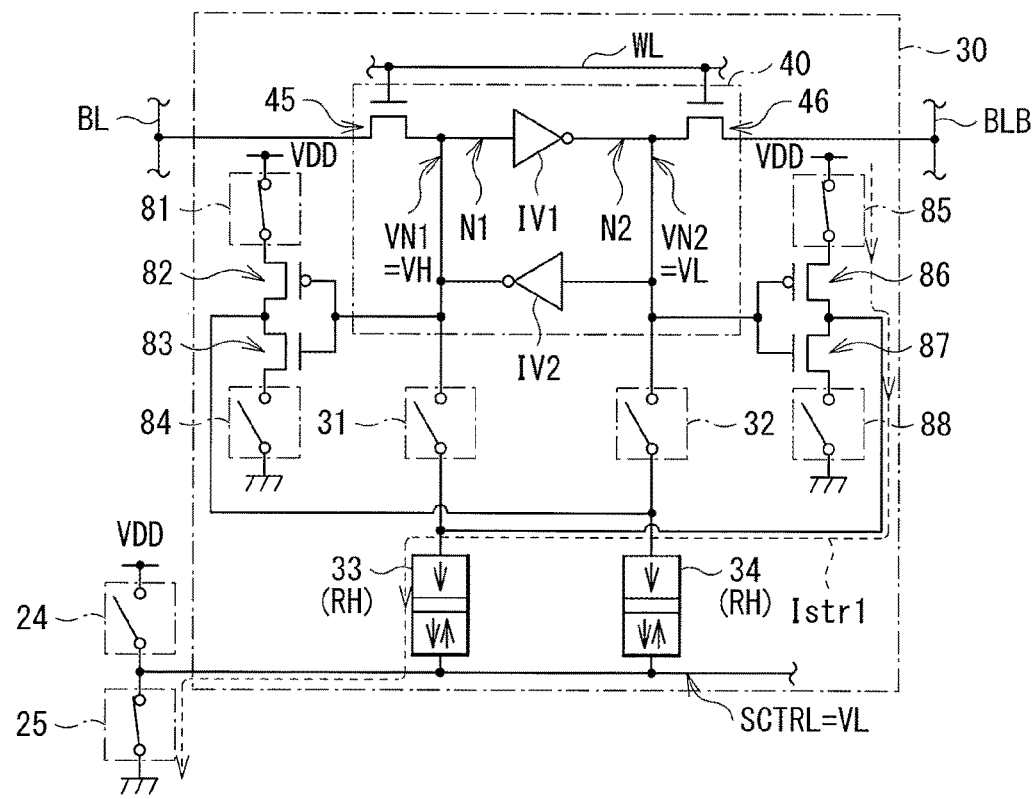
[ FIG. 17B ]
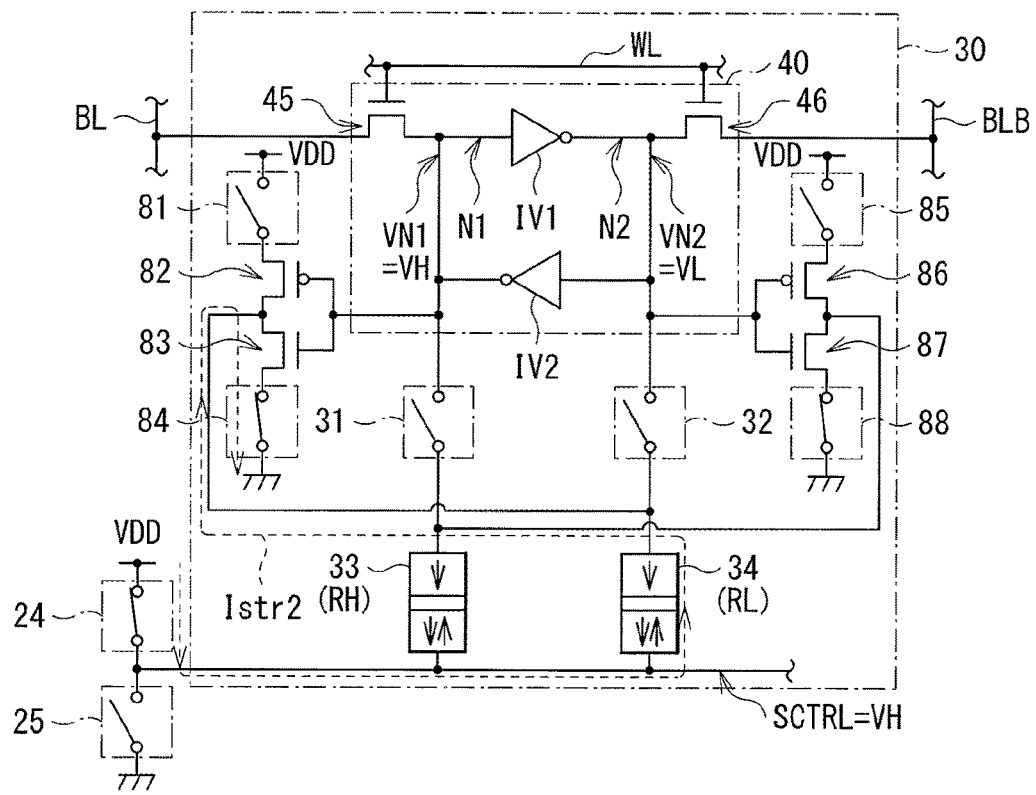

[ FIG. 18 ]
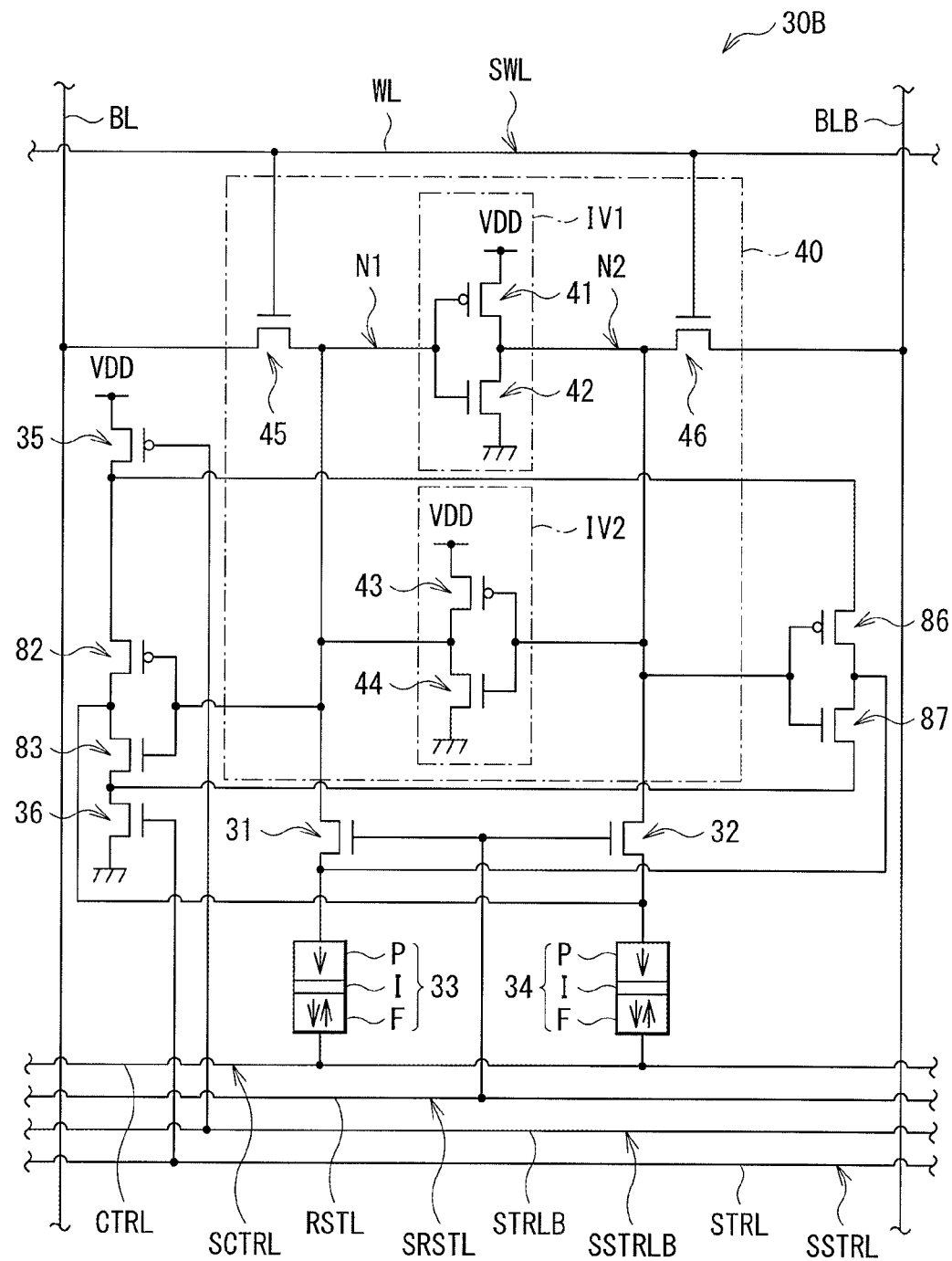

[ FIG. 19A ]
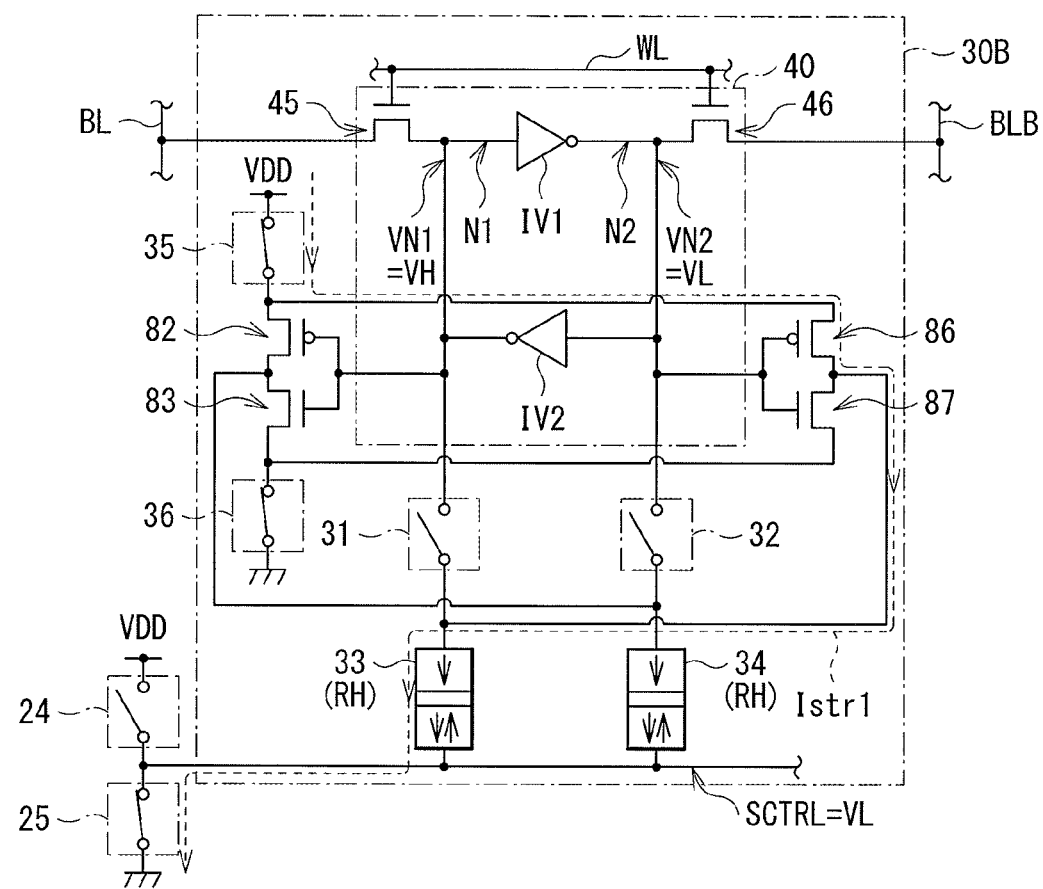

[ FIG. 19B ]
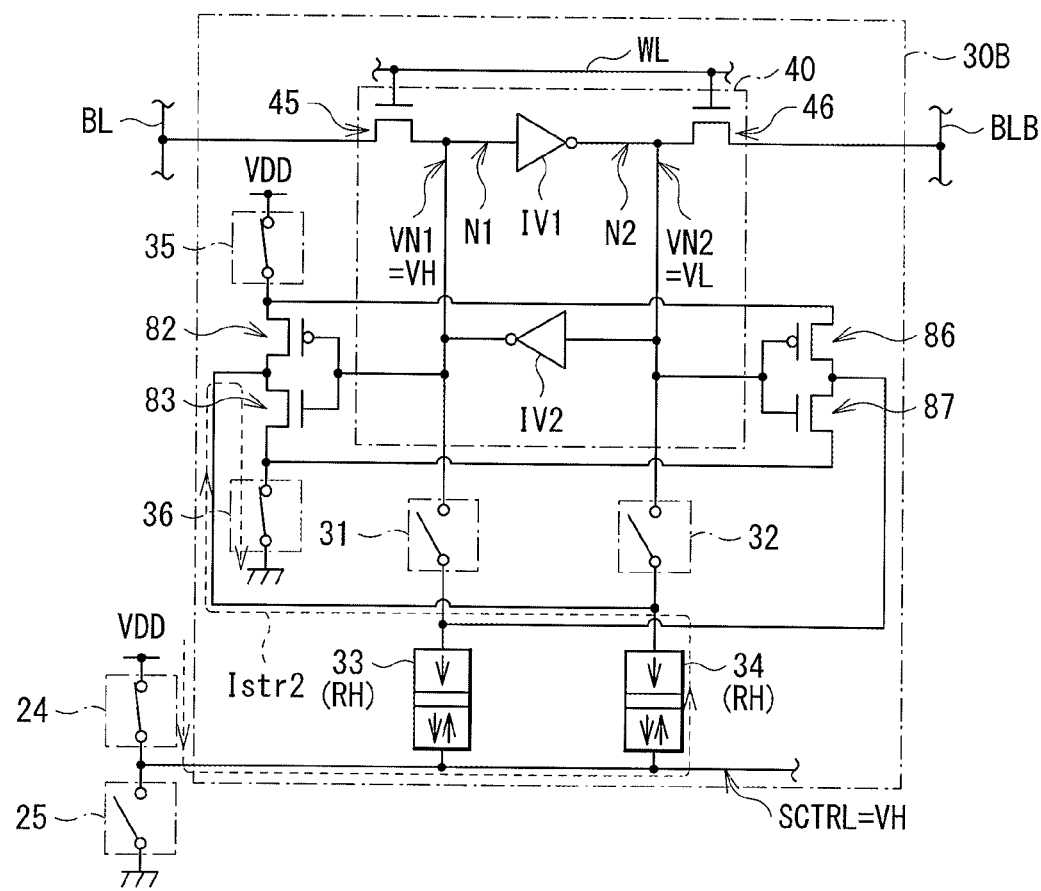

[ FIG. 20 ]
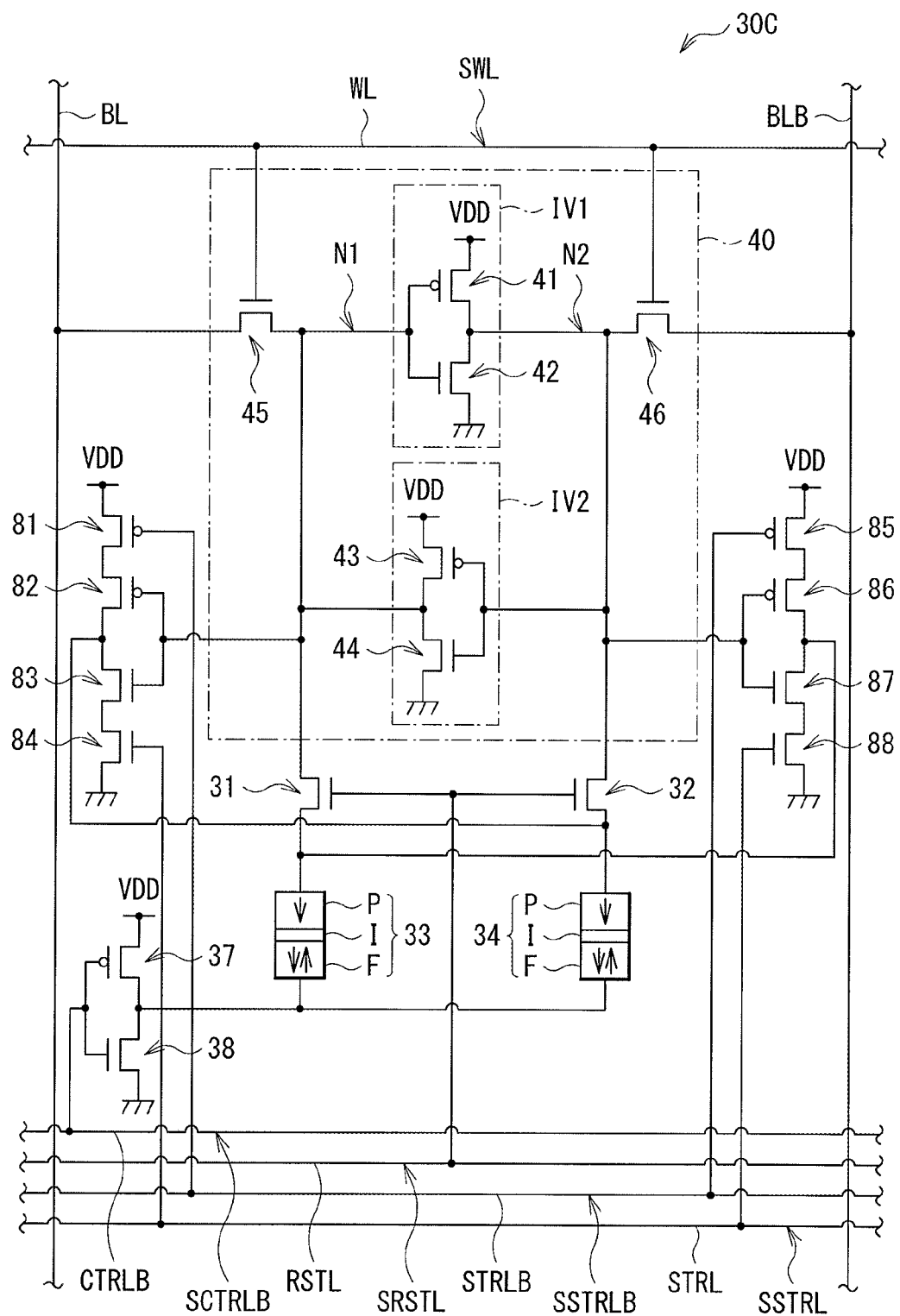

[ FIG. 21 ]
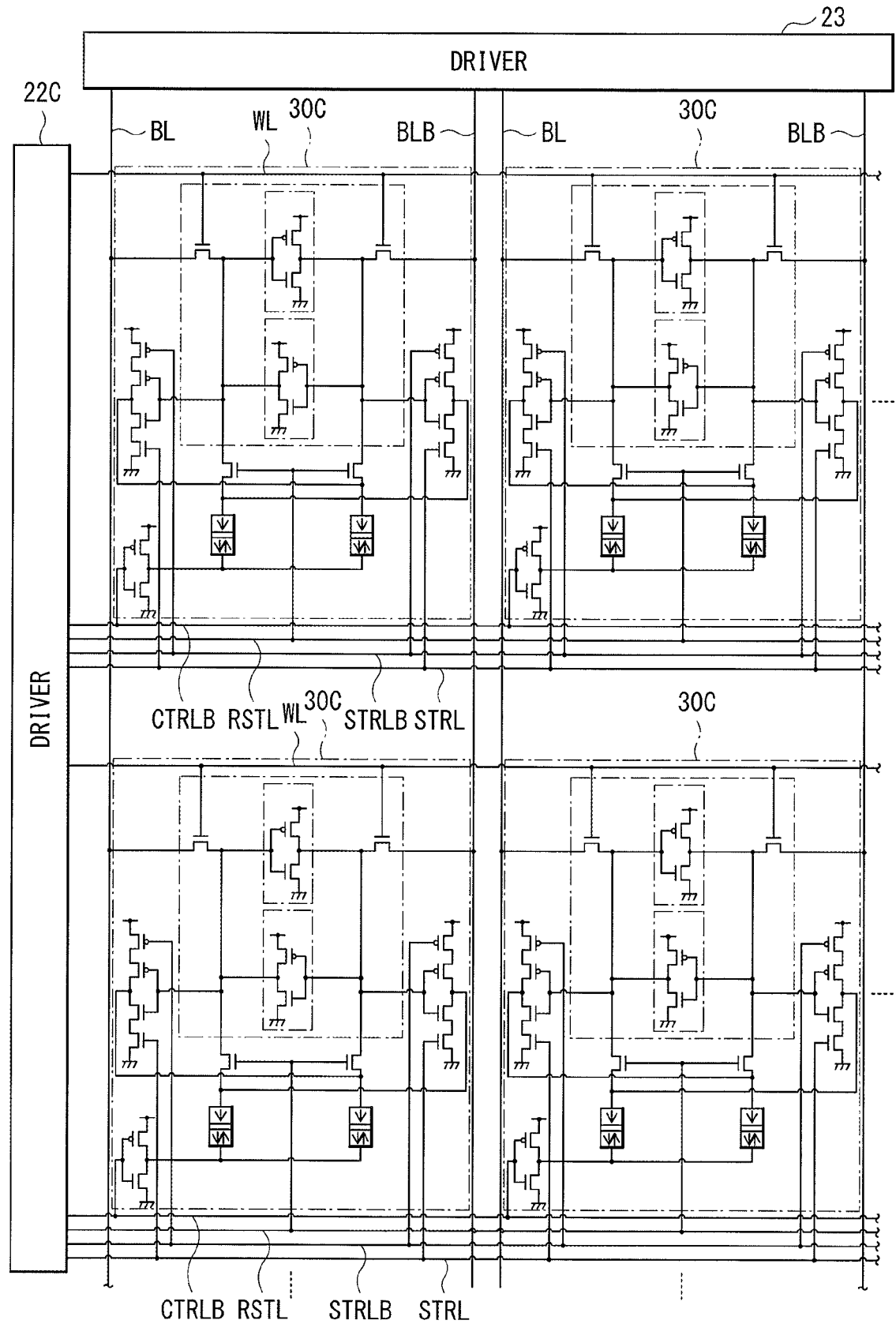

[FIG. 22]
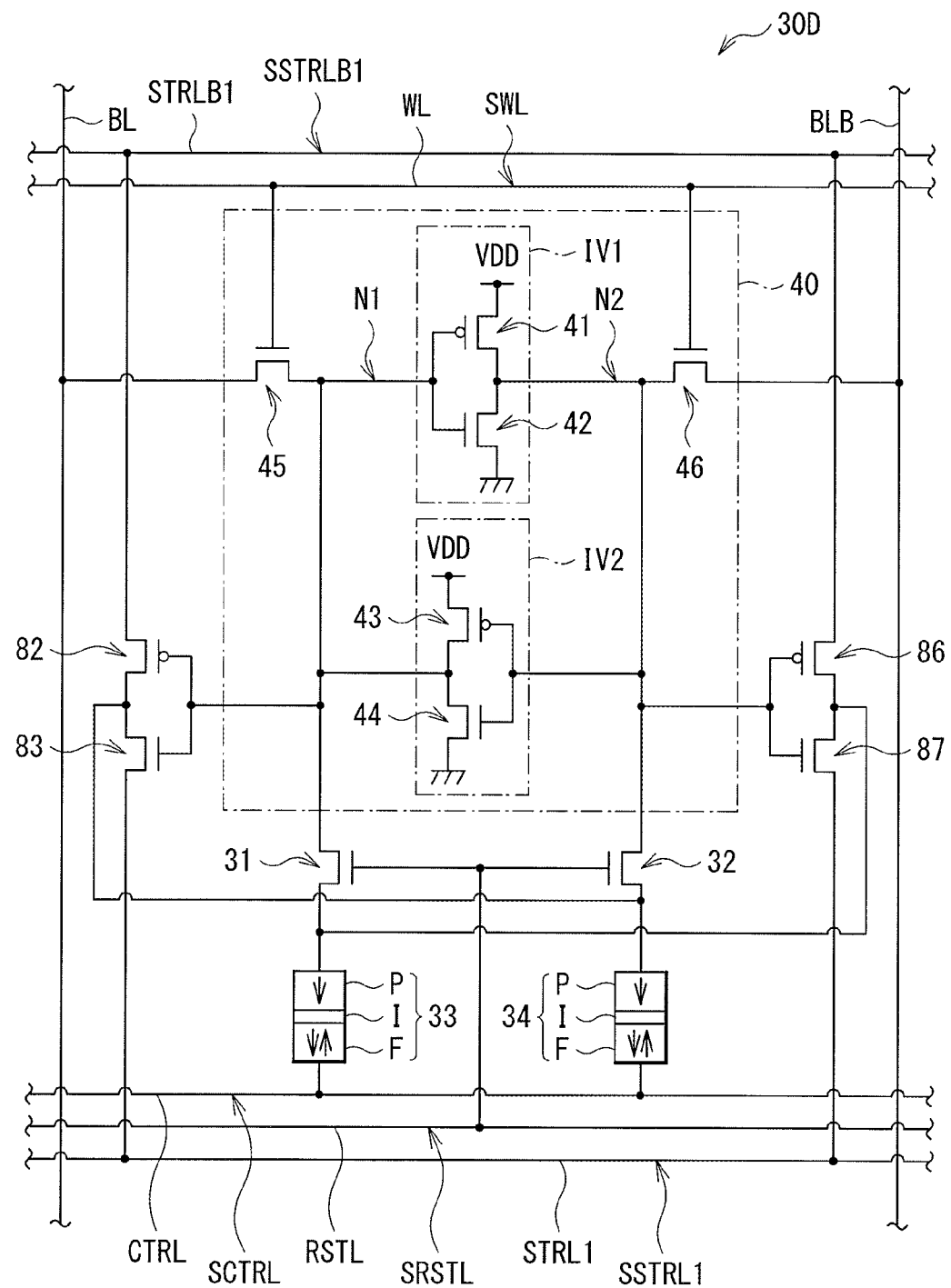

[FIG. 23]
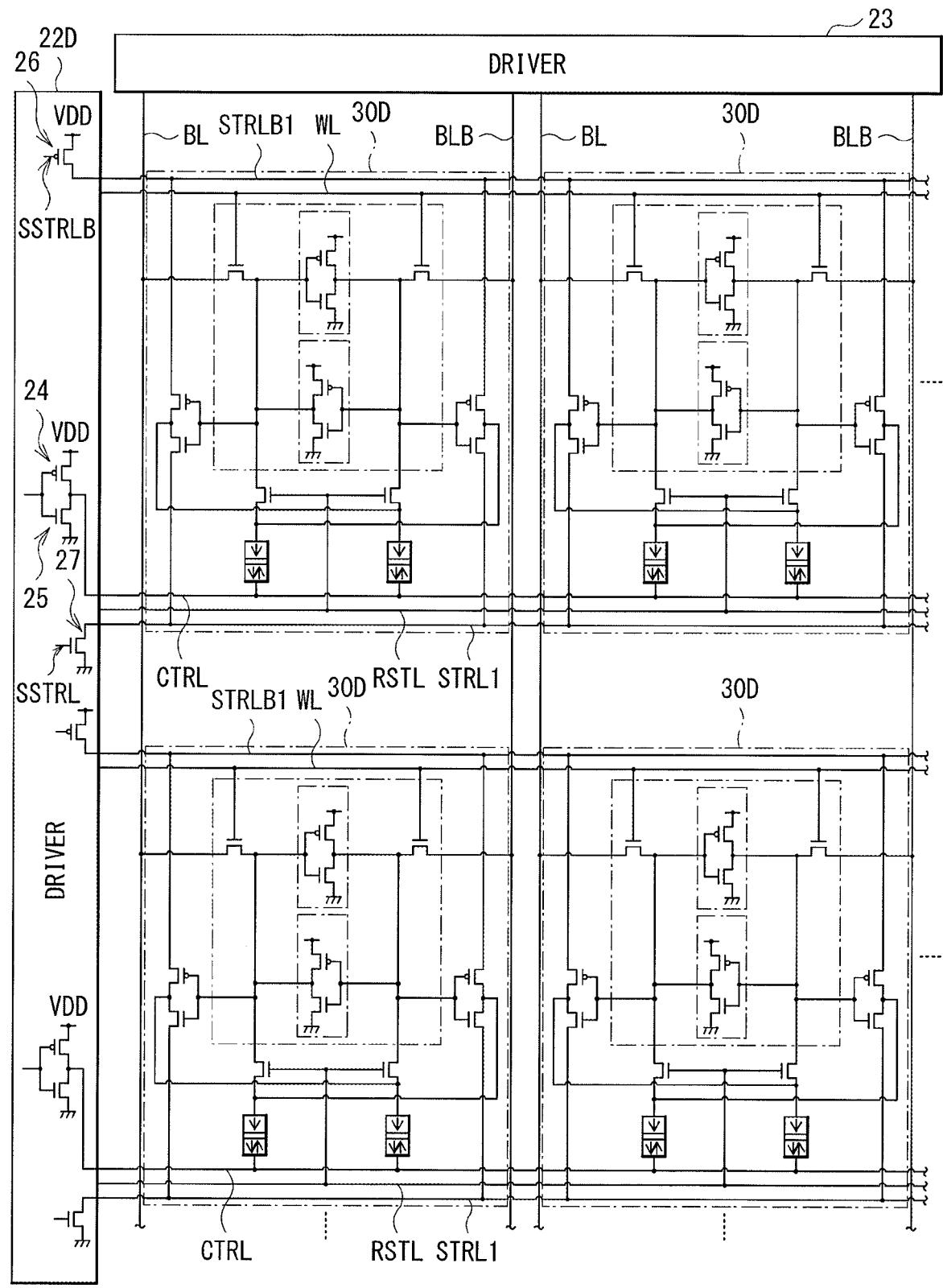

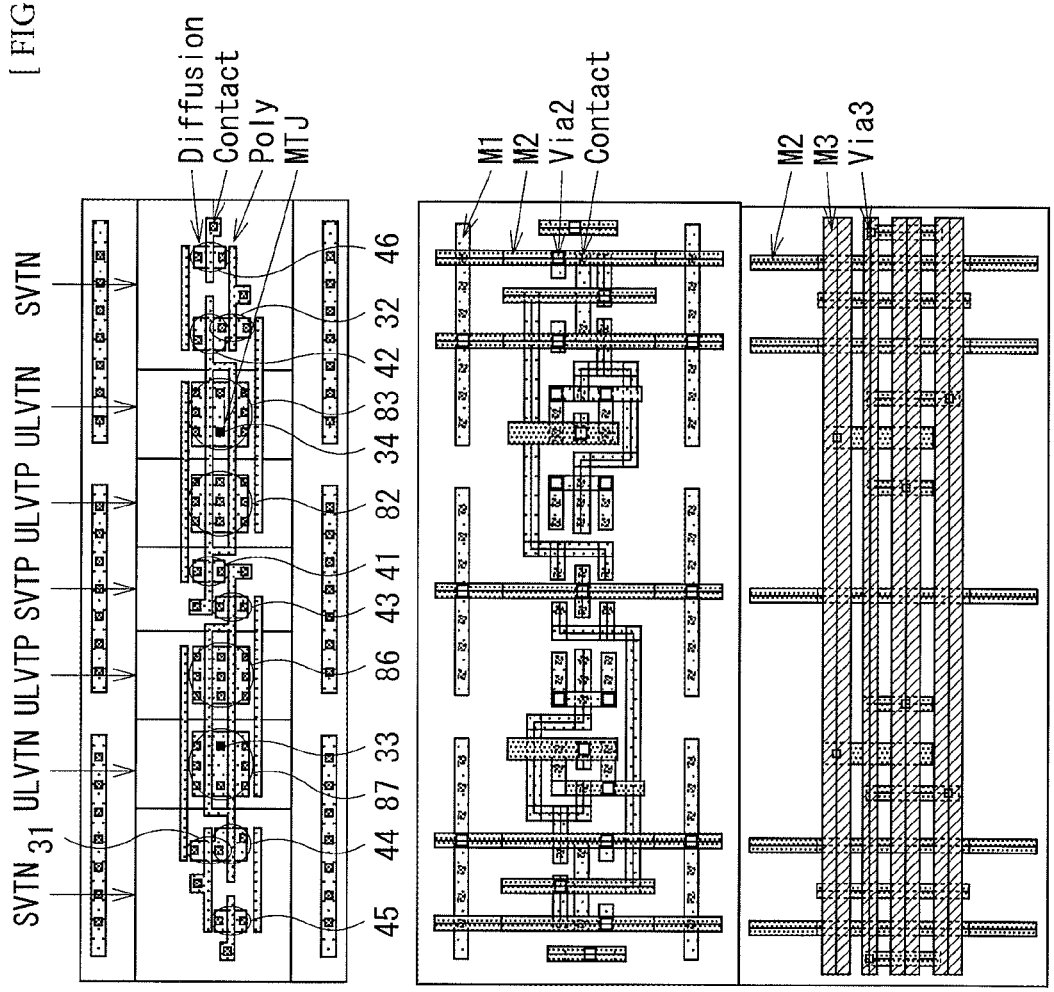
[FIG. 24]

[ FIG. 25 ]
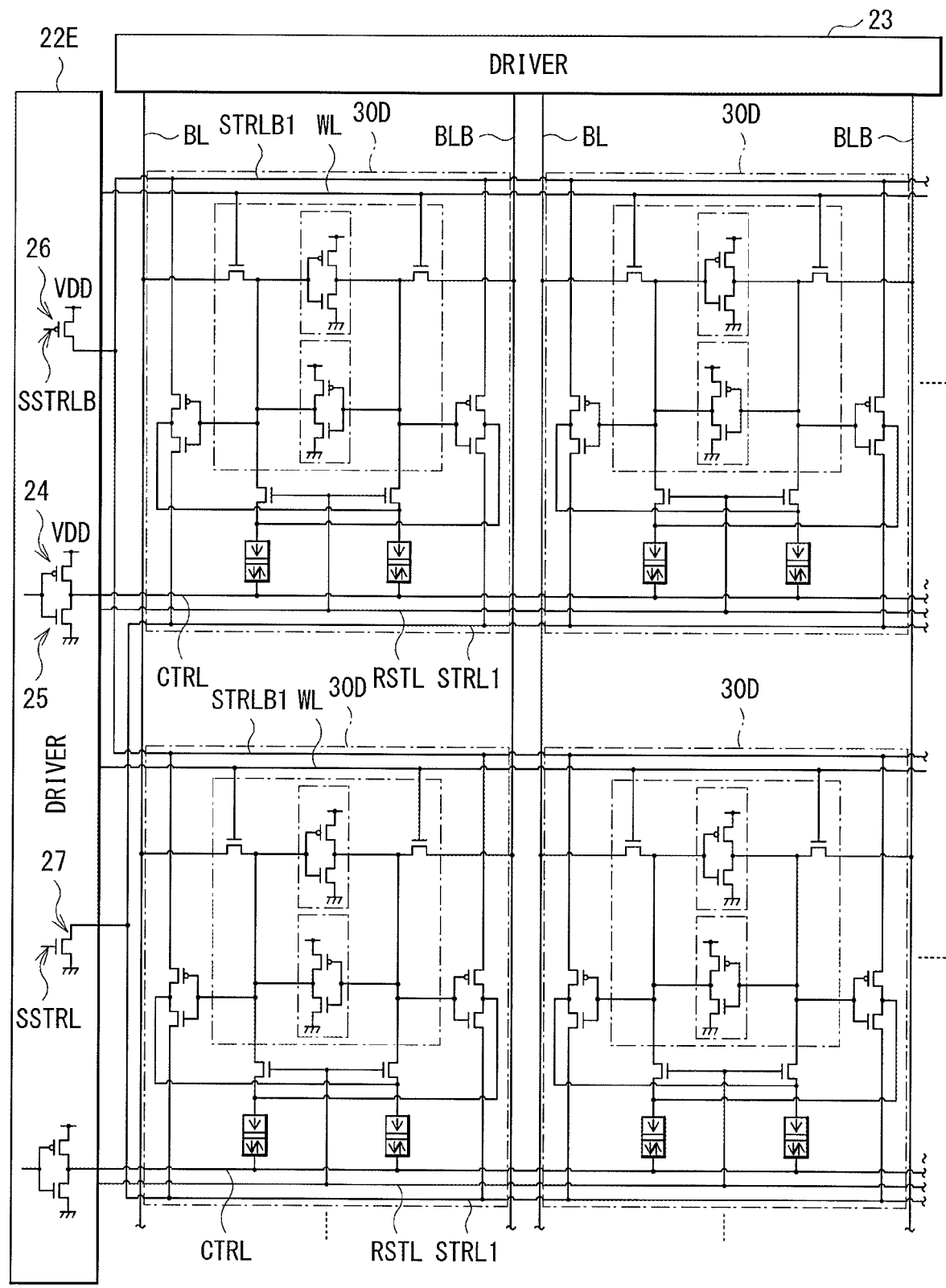

[FIG. 26]
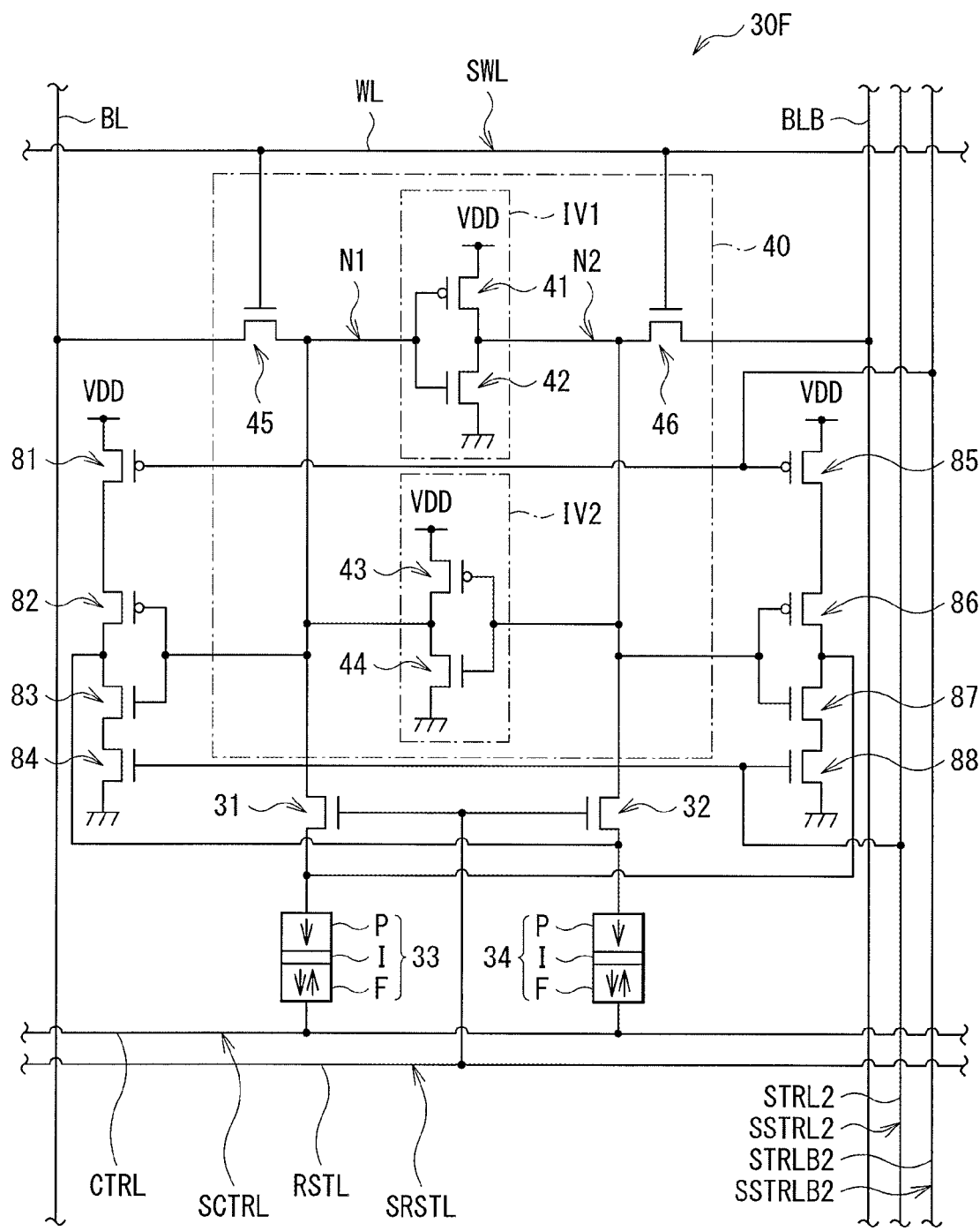

[FIG. 27]
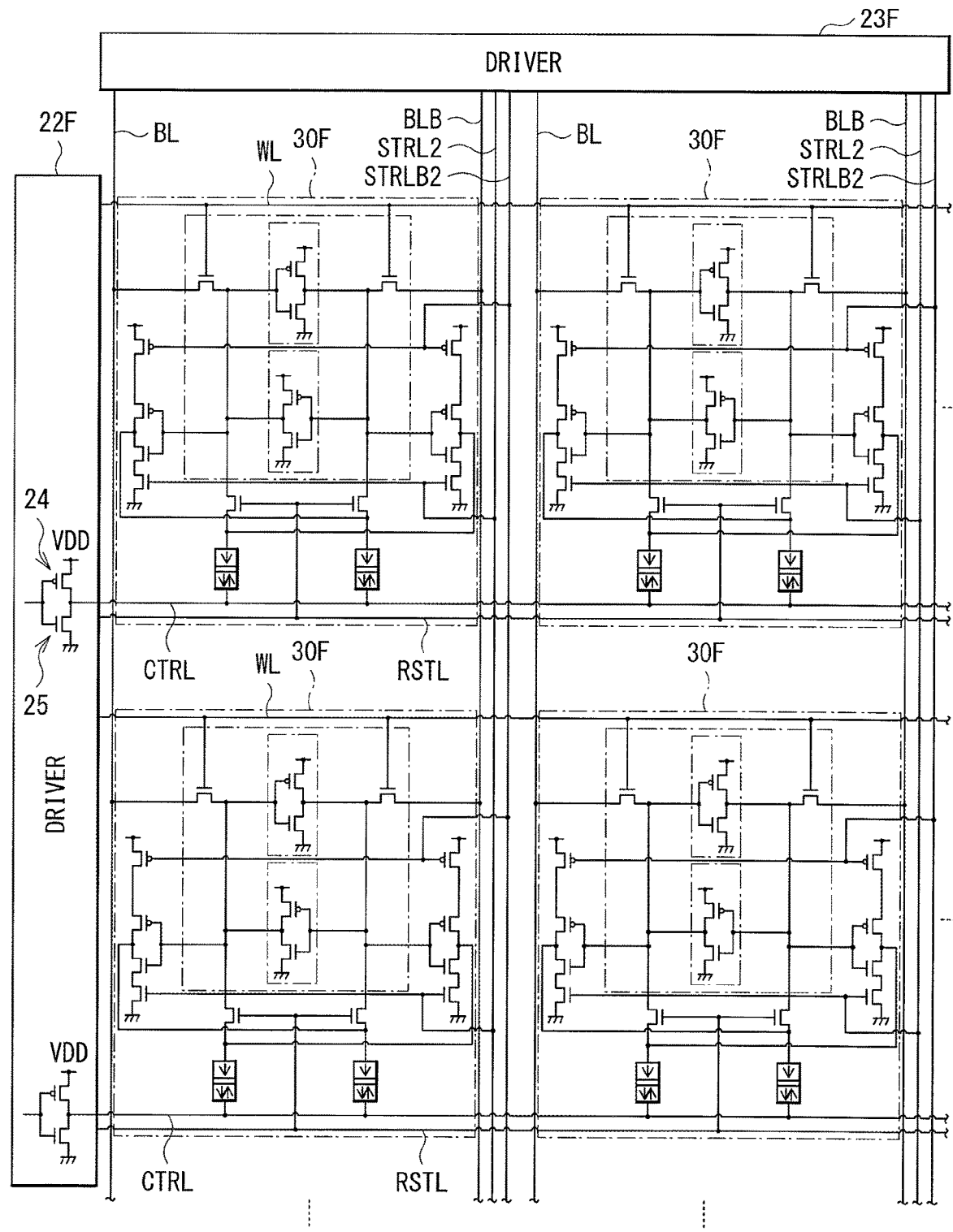

[ FIG. 28 ]
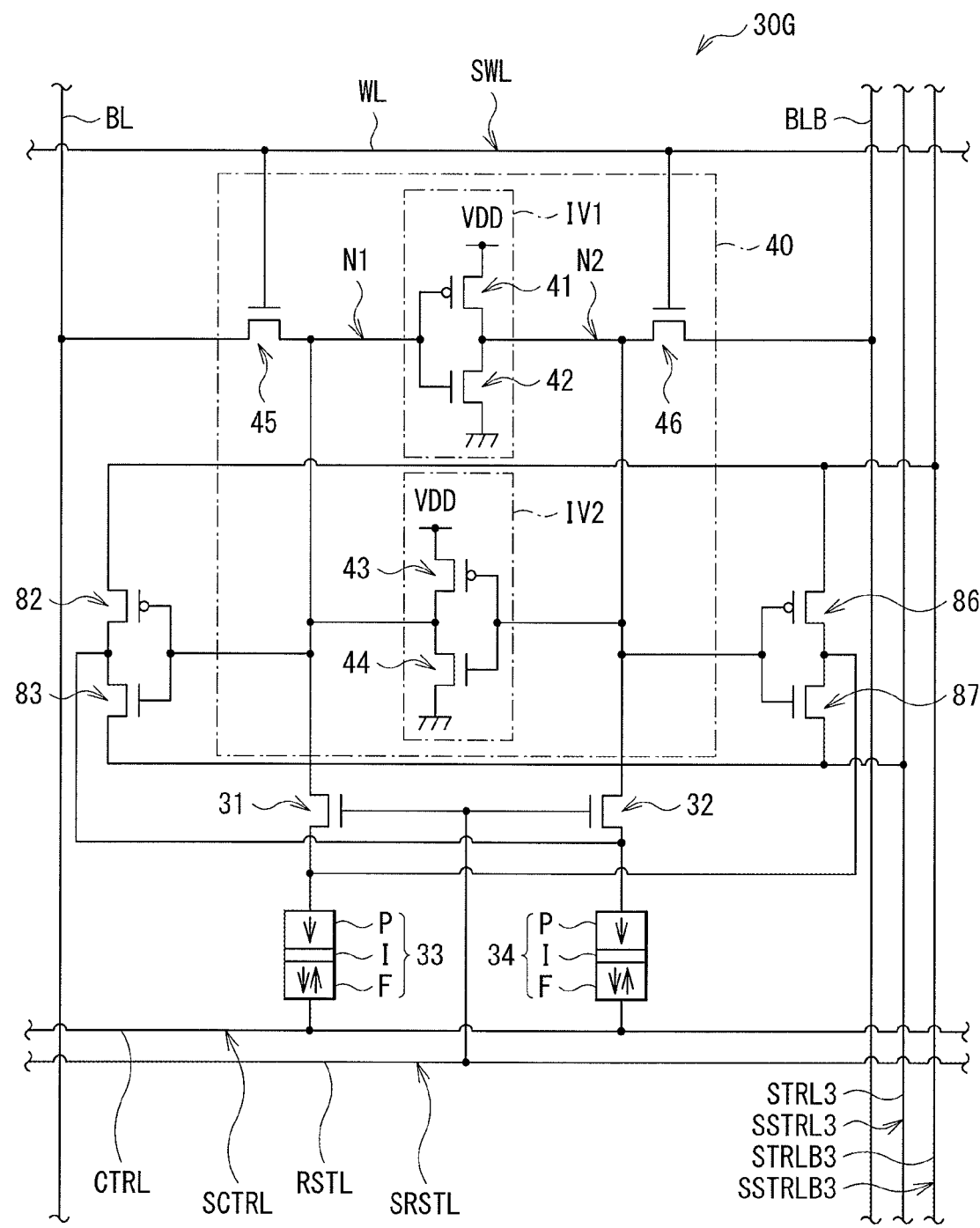

[FIG. 29]
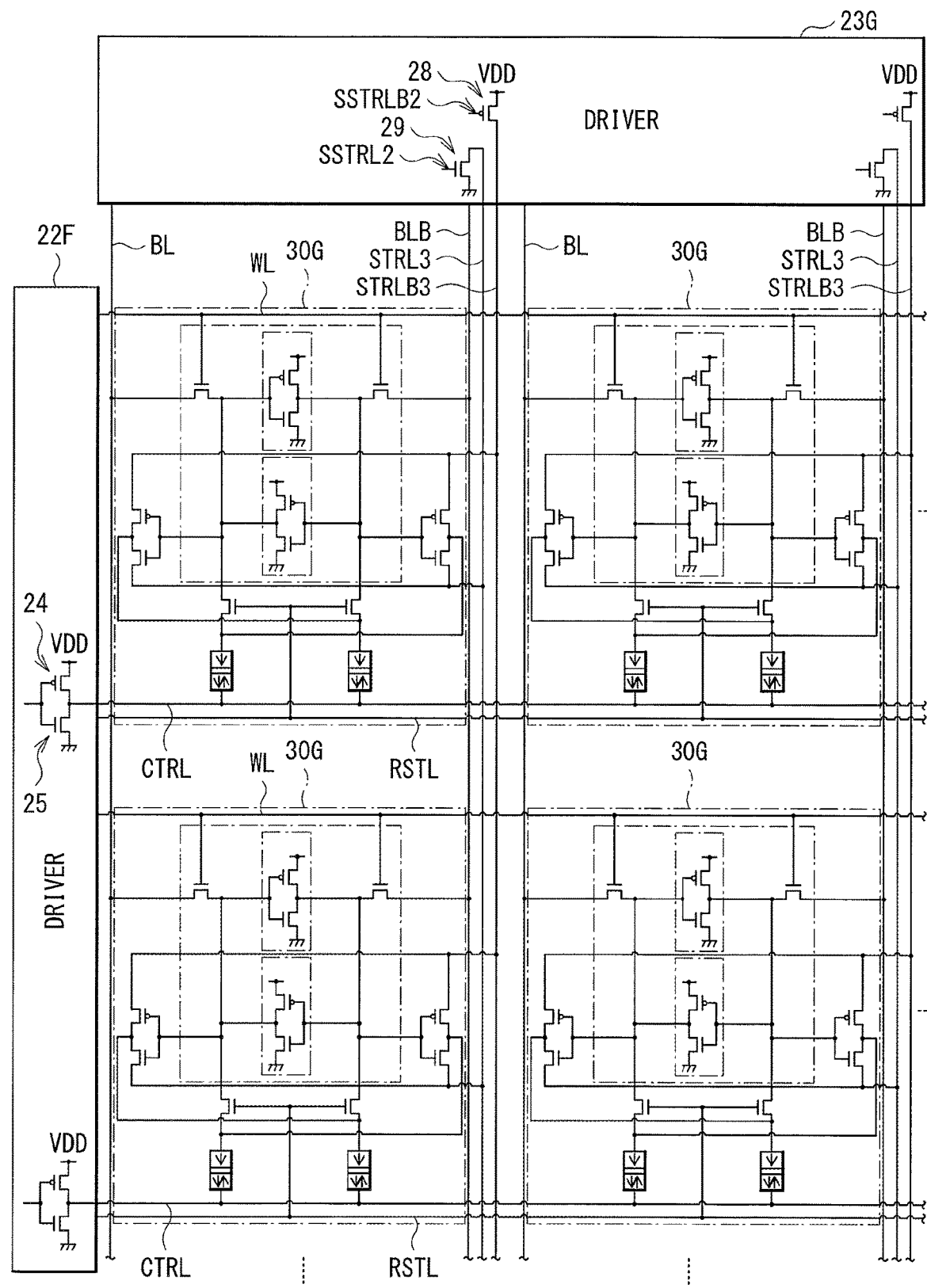

[ FIG. 30 ]
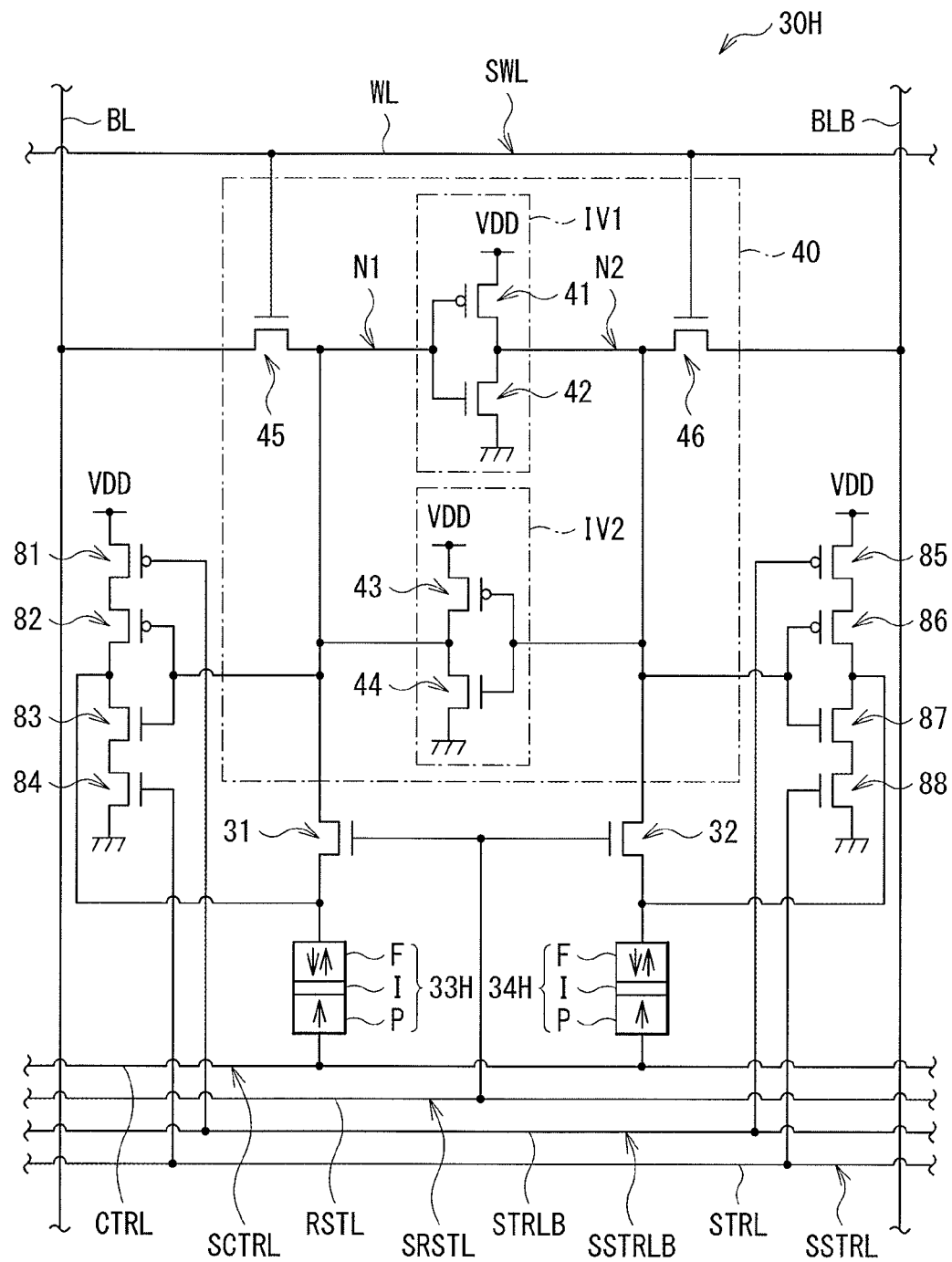

[FIG. 31A]
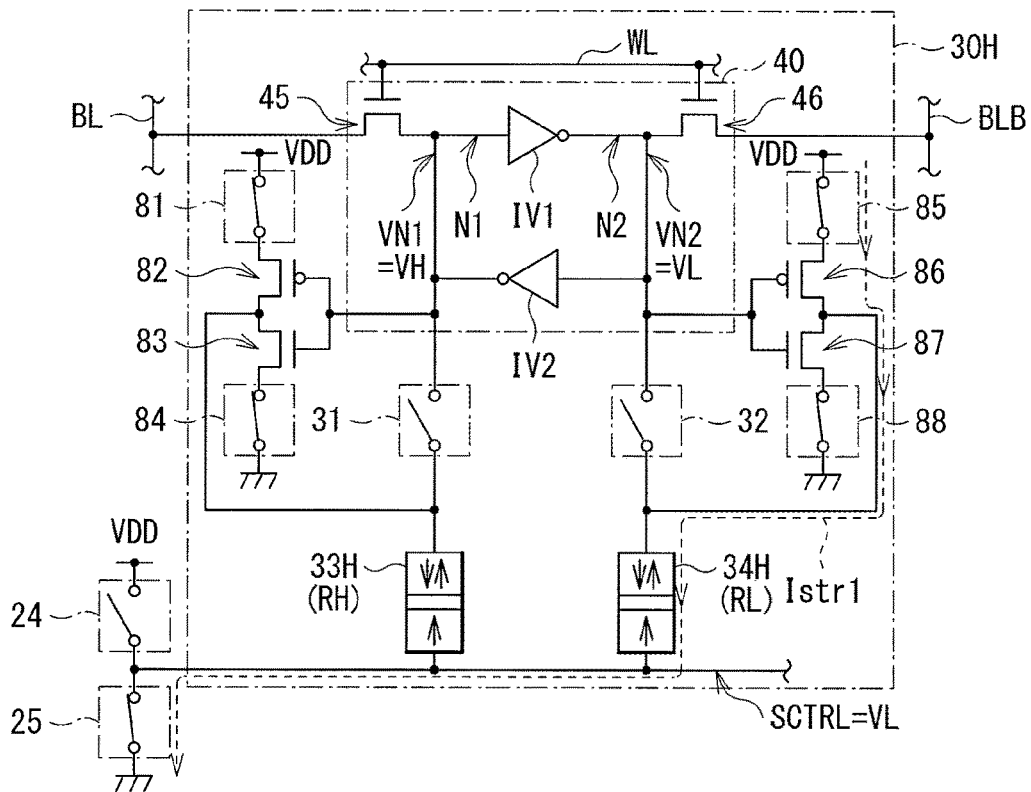
[FIG. 31B]
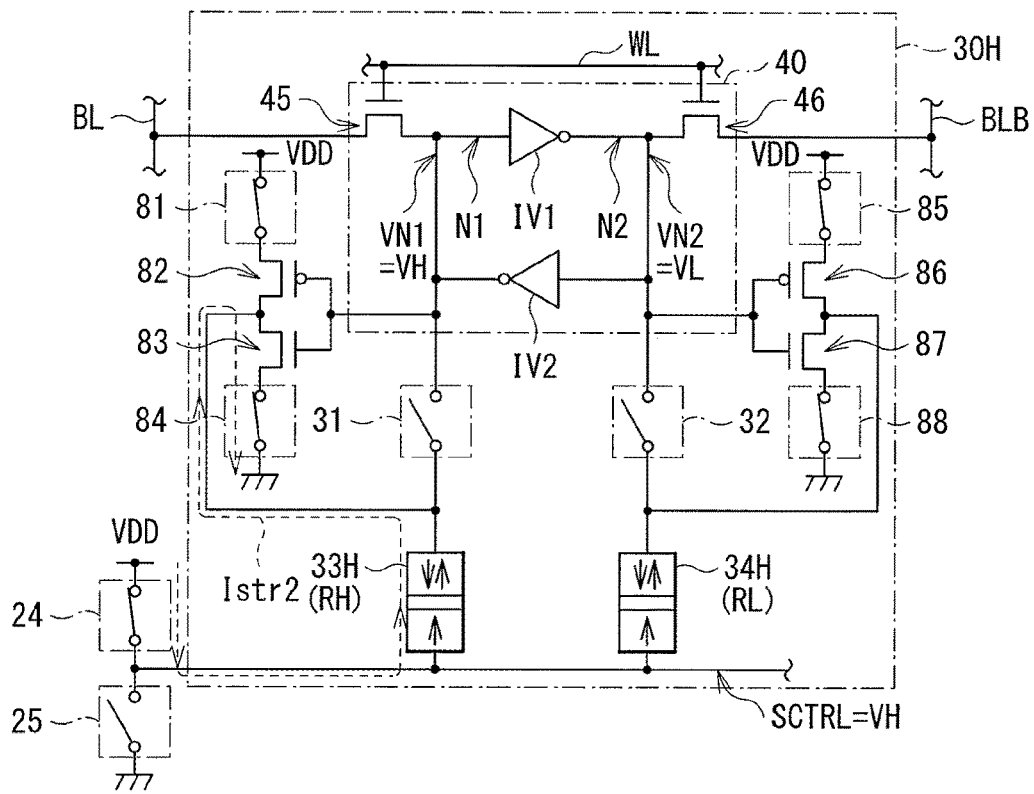

[FIG. 32]
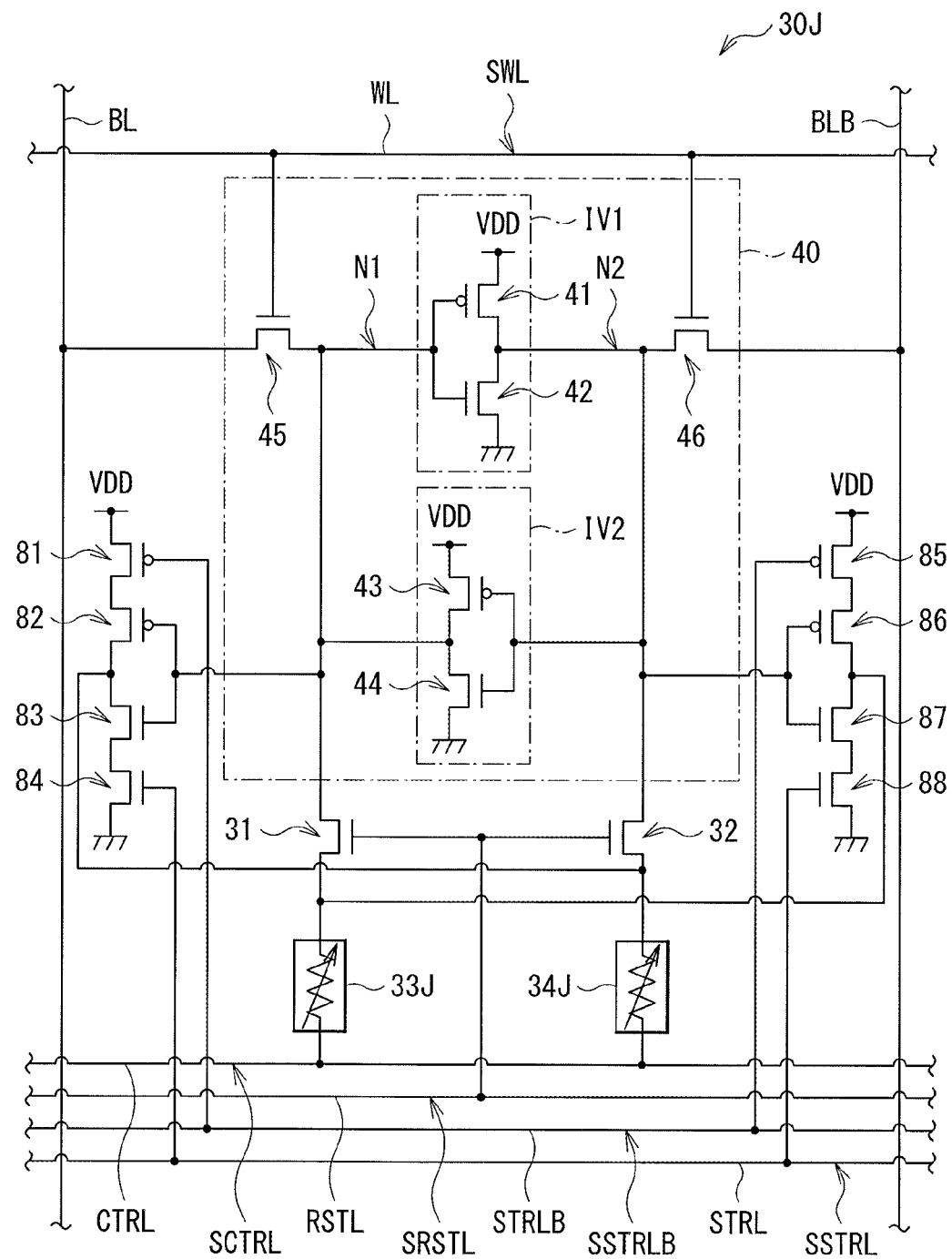

[ FIG. 33 ]
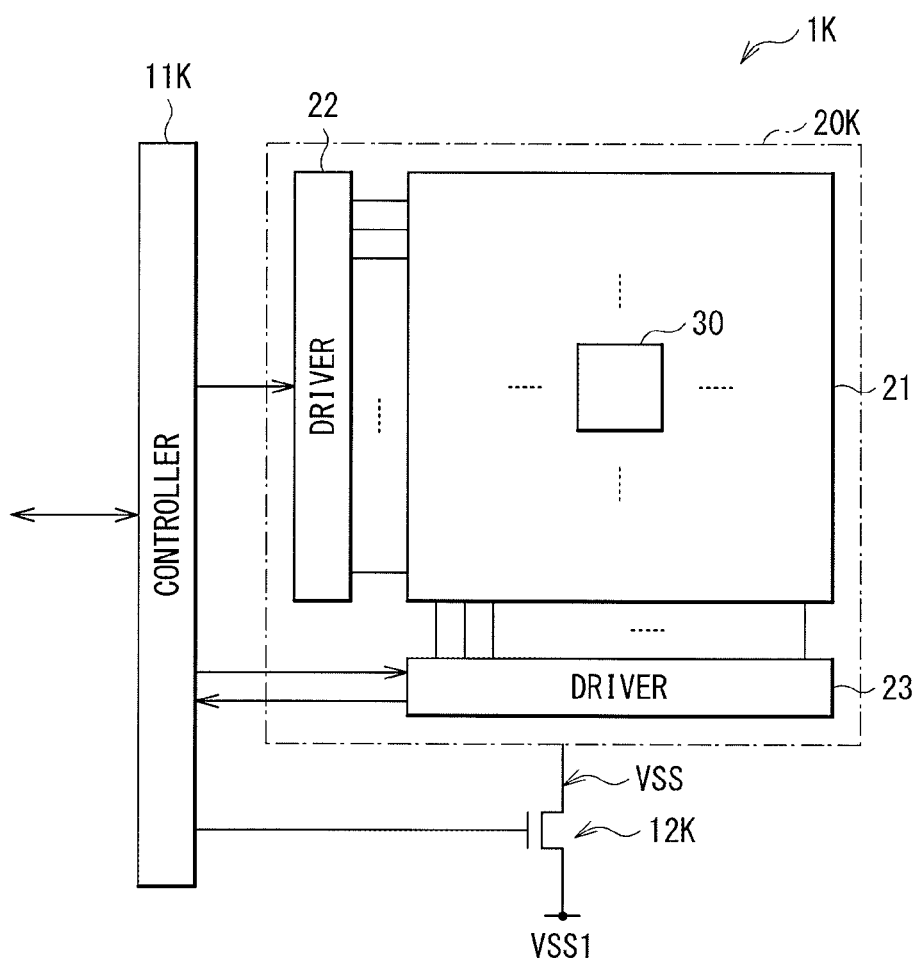

[ FIG. 34 ]
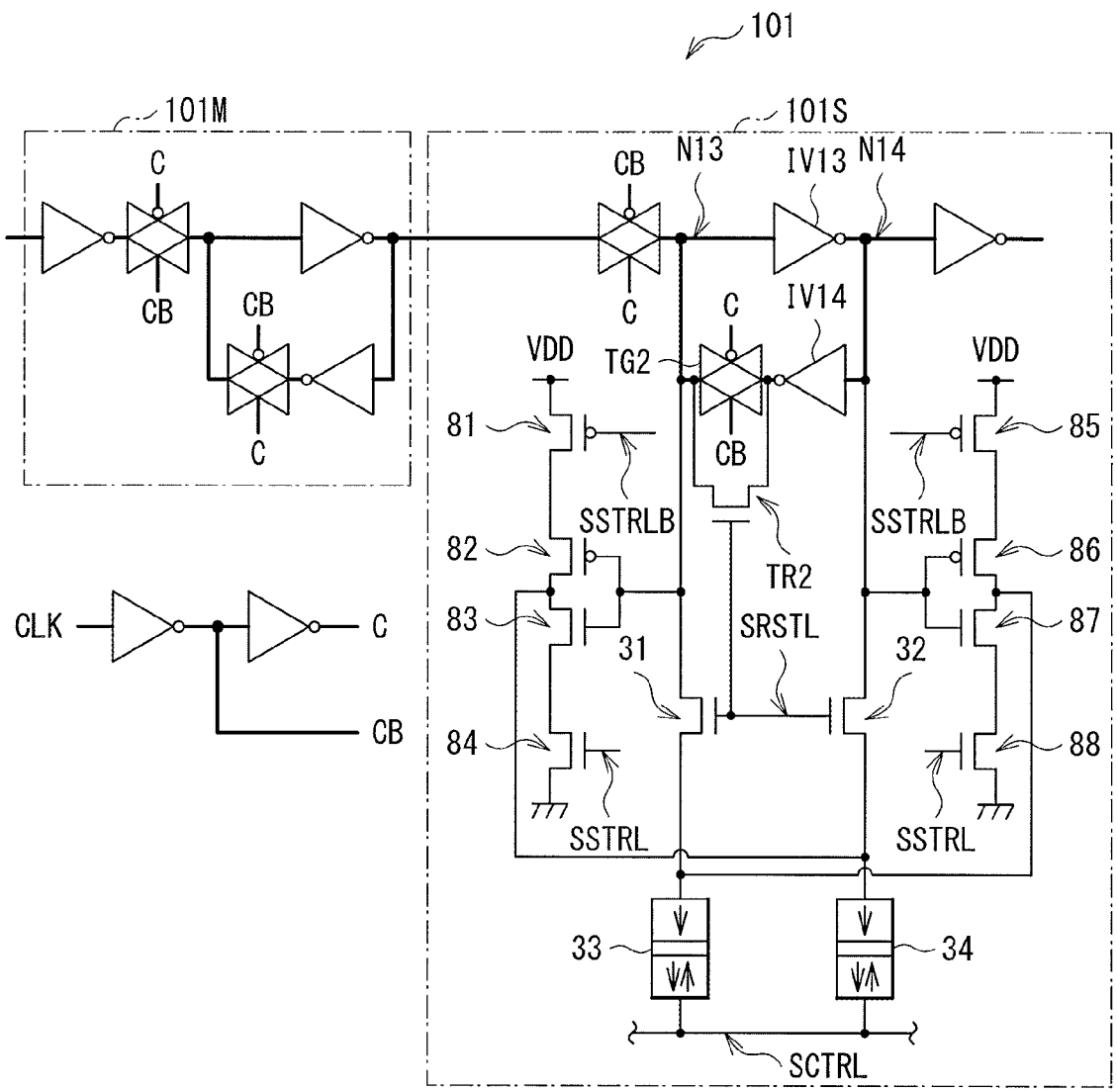

[ FIG. 35 ]
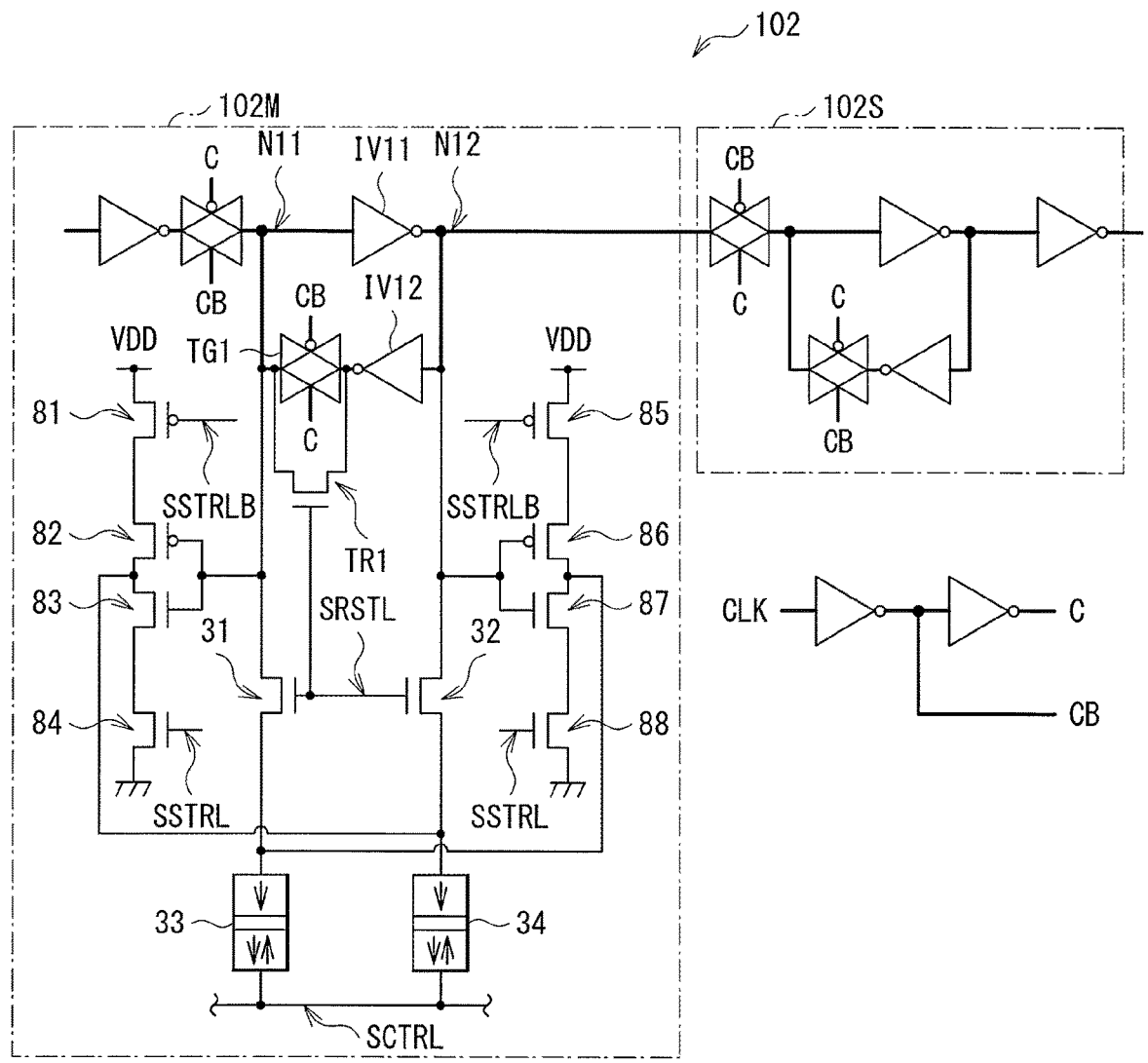

[FIG. 36]
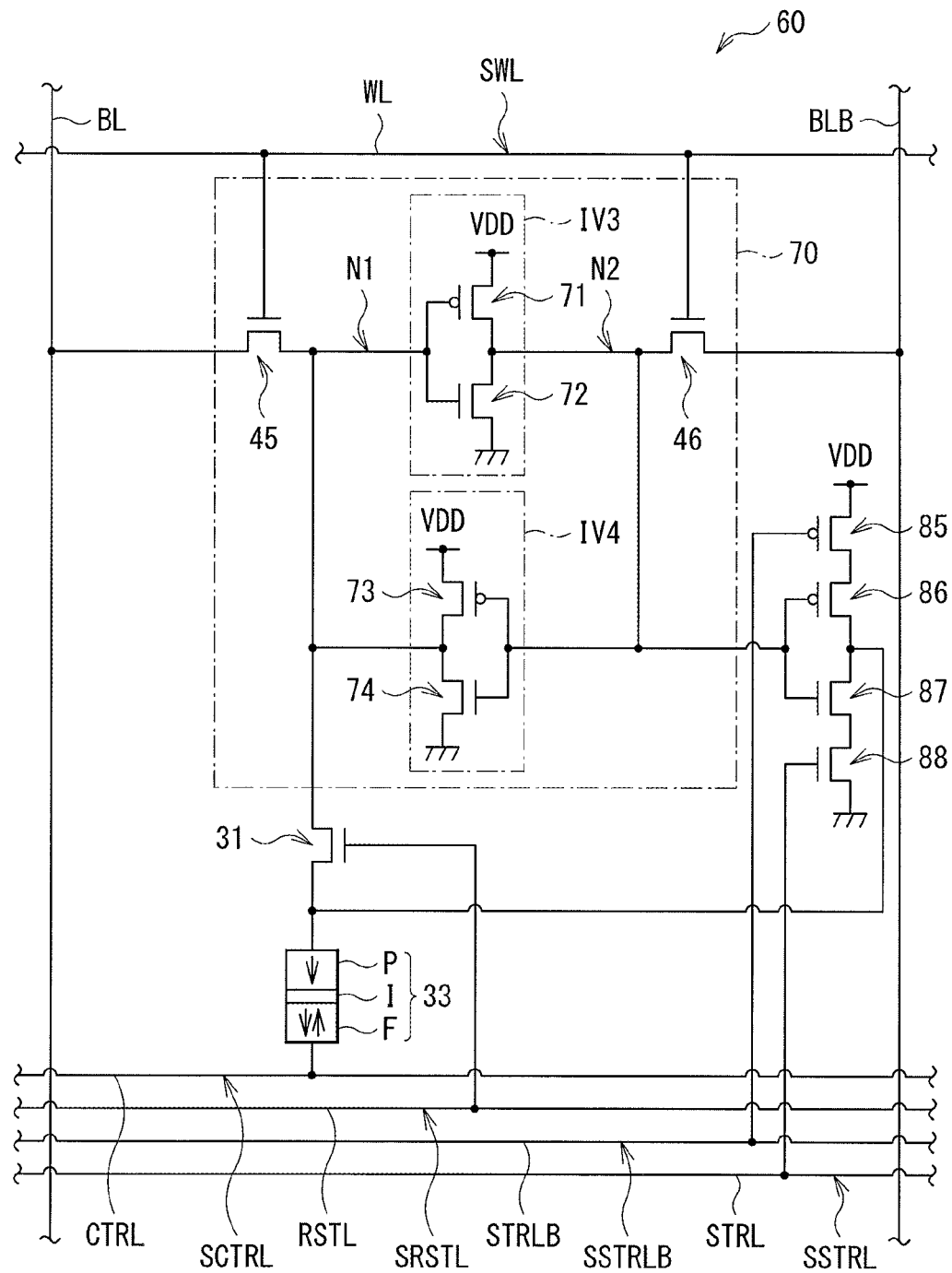

[ FIG. 37 ]
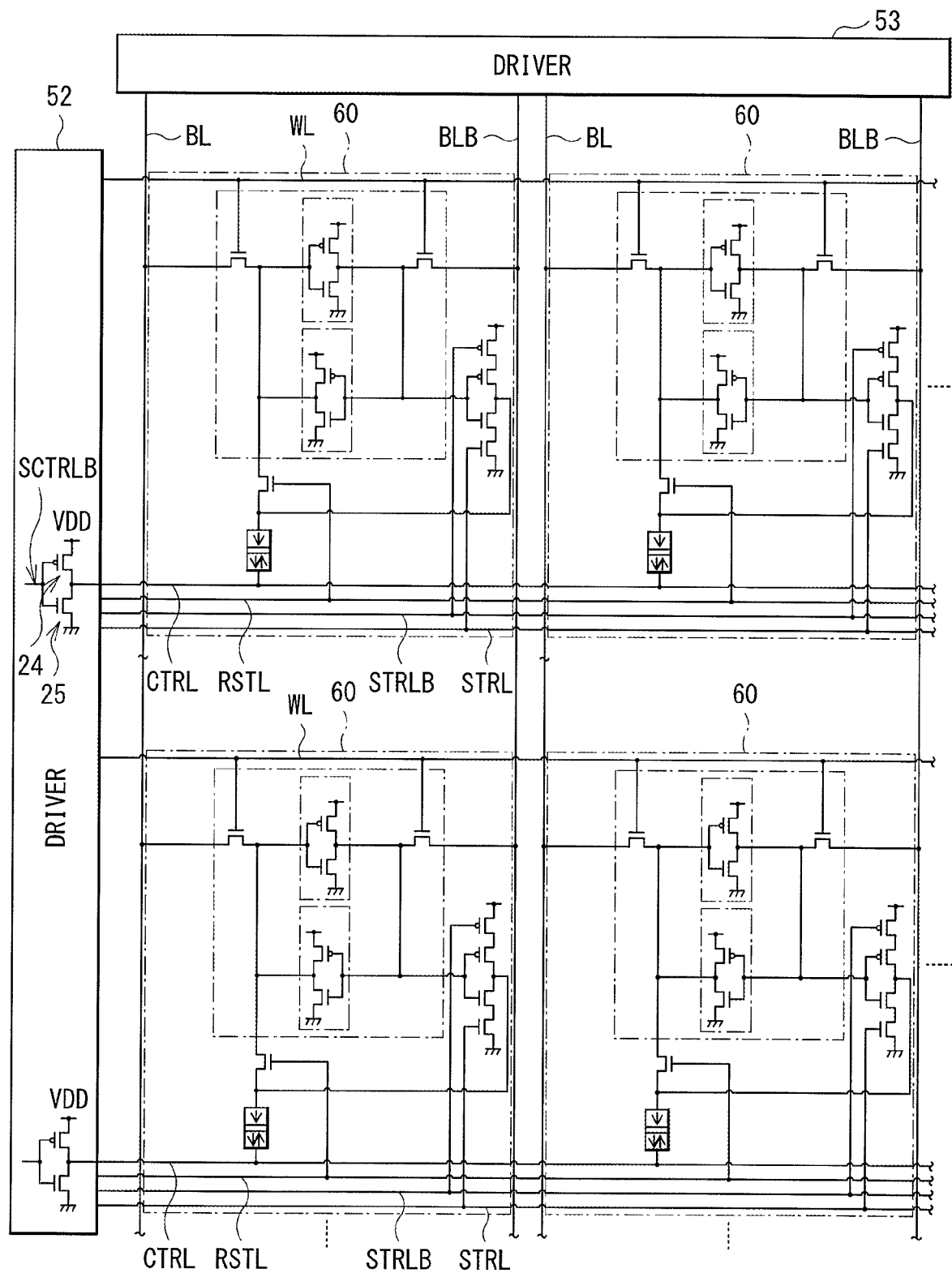

[ FIG. 38 ]
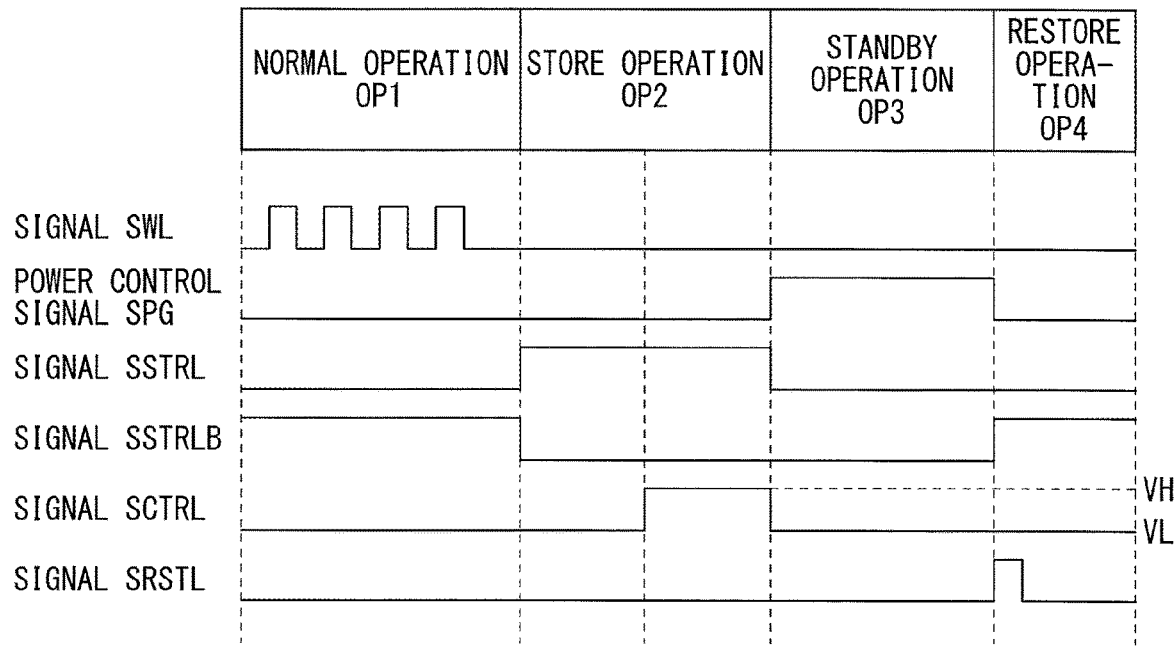
[ FIG. 39 ]
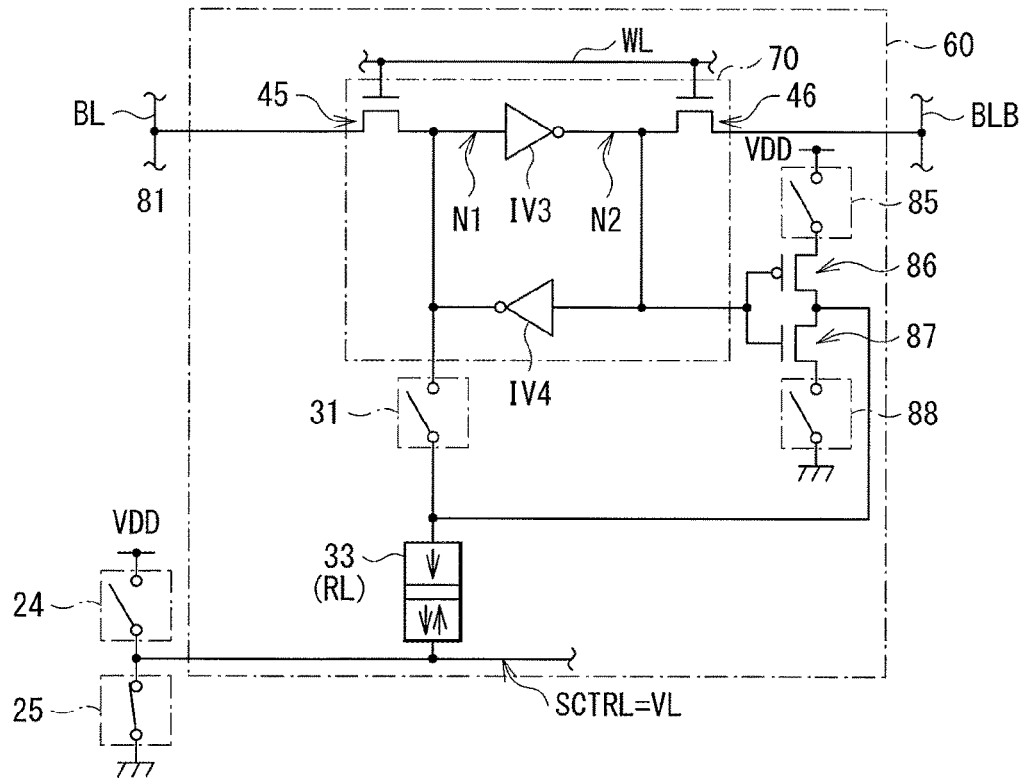

[FIG. 40A]
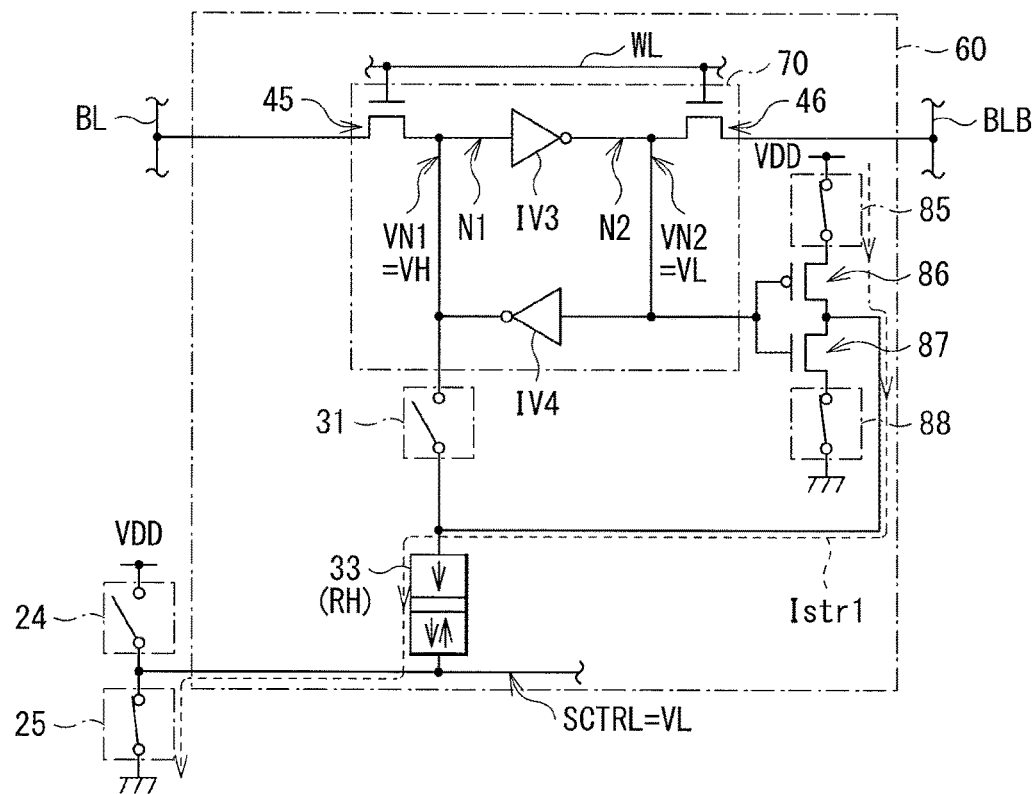
[FIG. 40B]
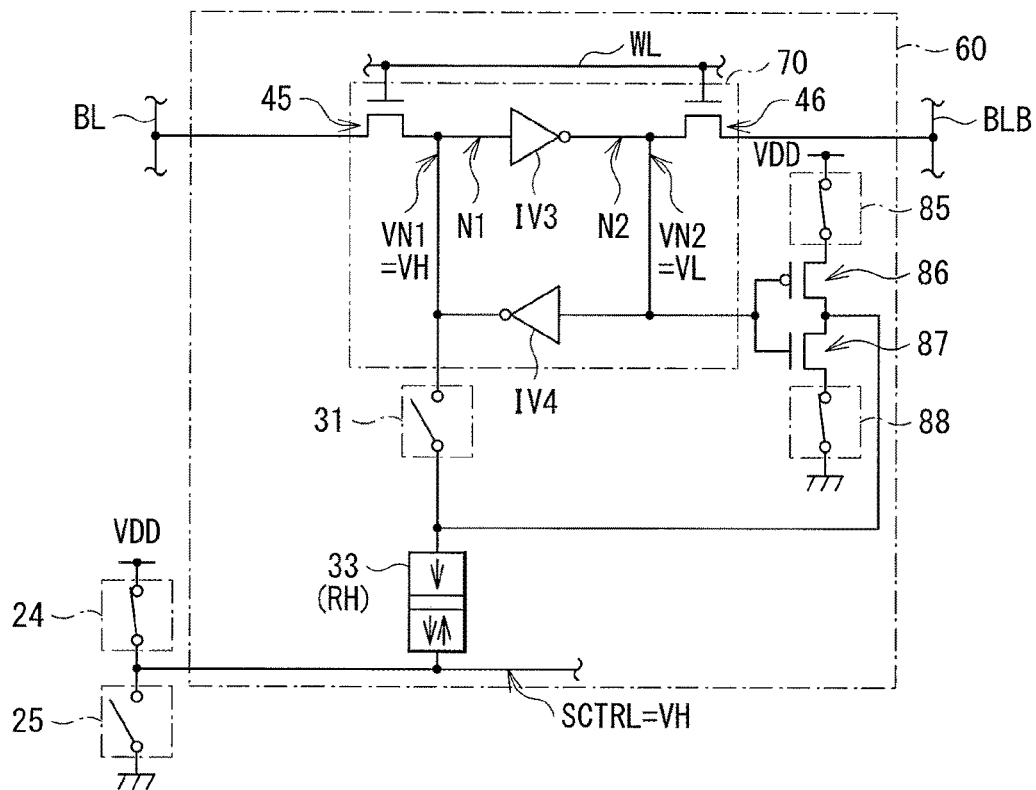

[FIG. 40C]
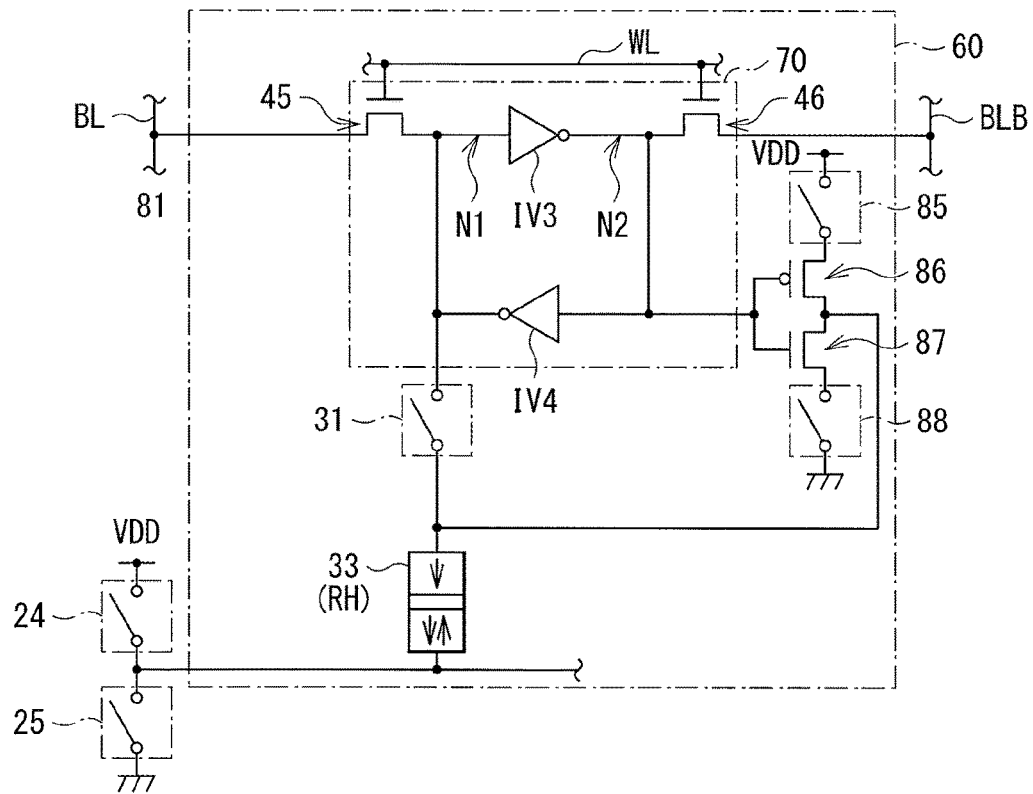
[FIG. 40D]
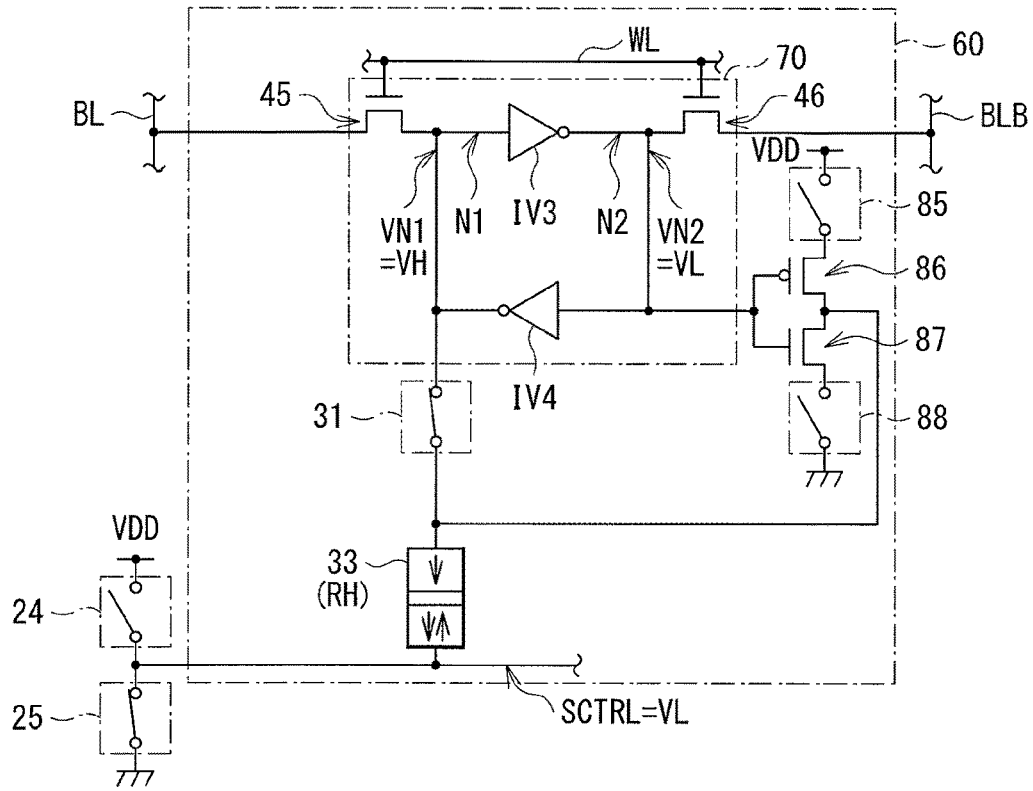

[ FIG. 41A ]
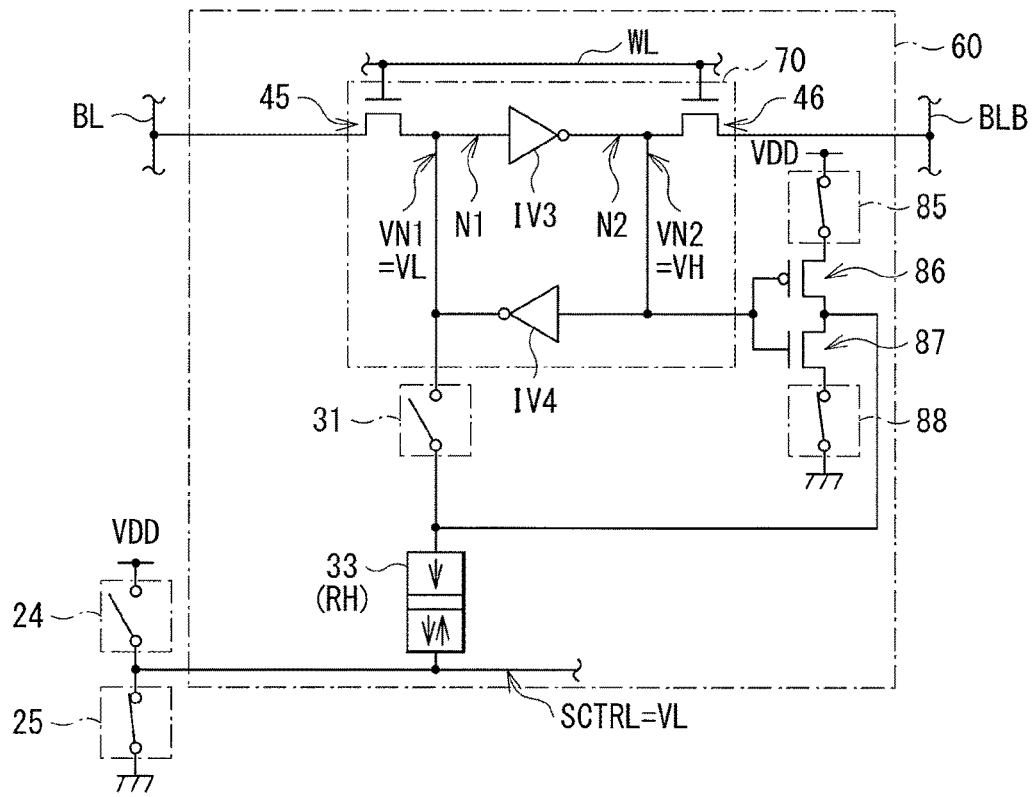
[ FIG. 41B ]
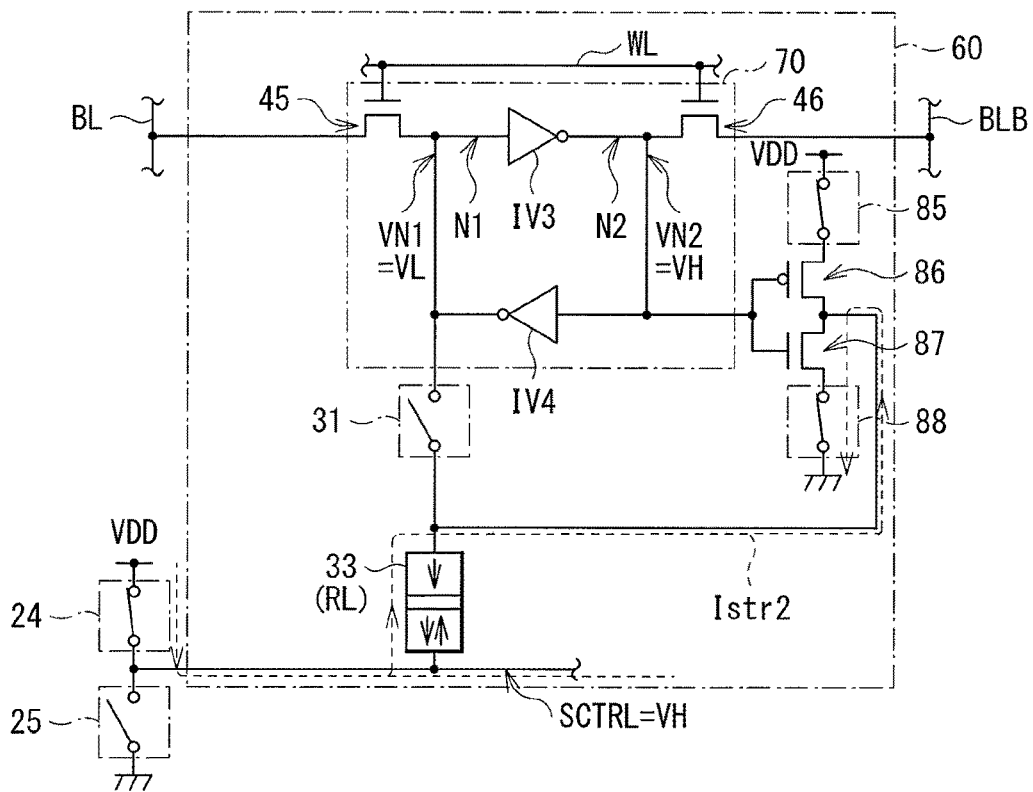

[ FIG. 41C ]
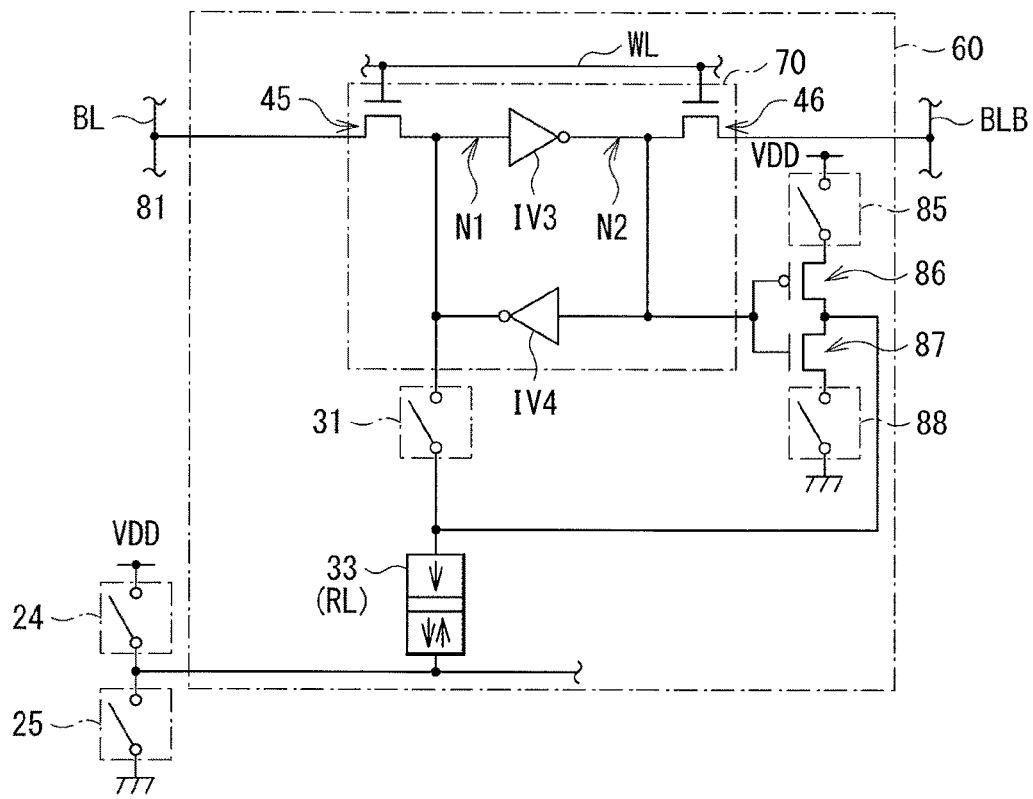
[ FIG. 41D ]
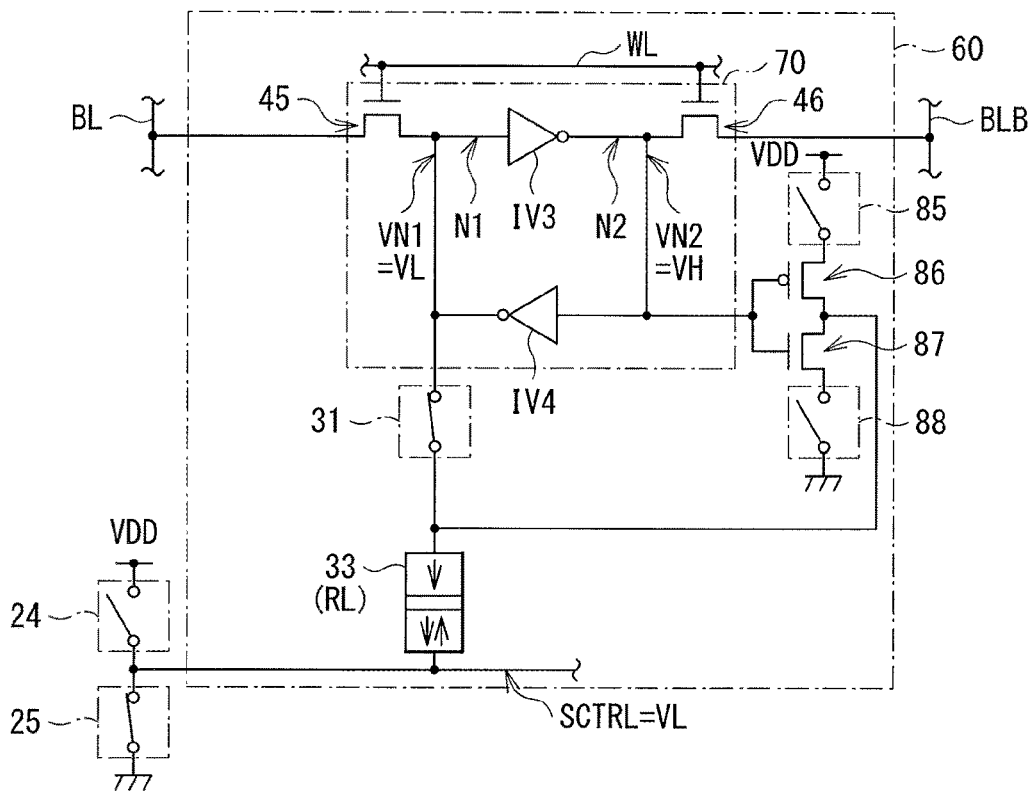

[ FIG. 42 ]
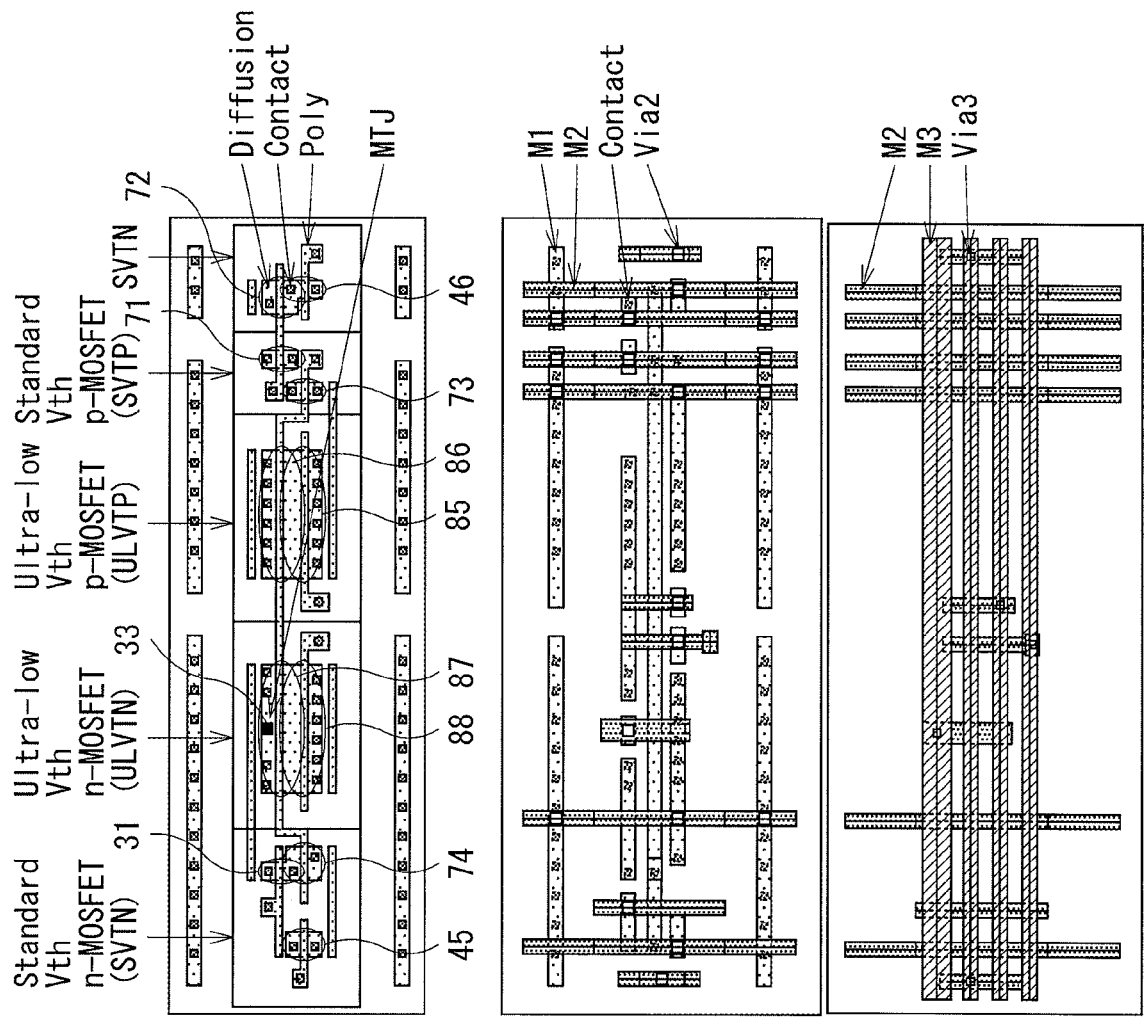

[ FIG. 43 ]
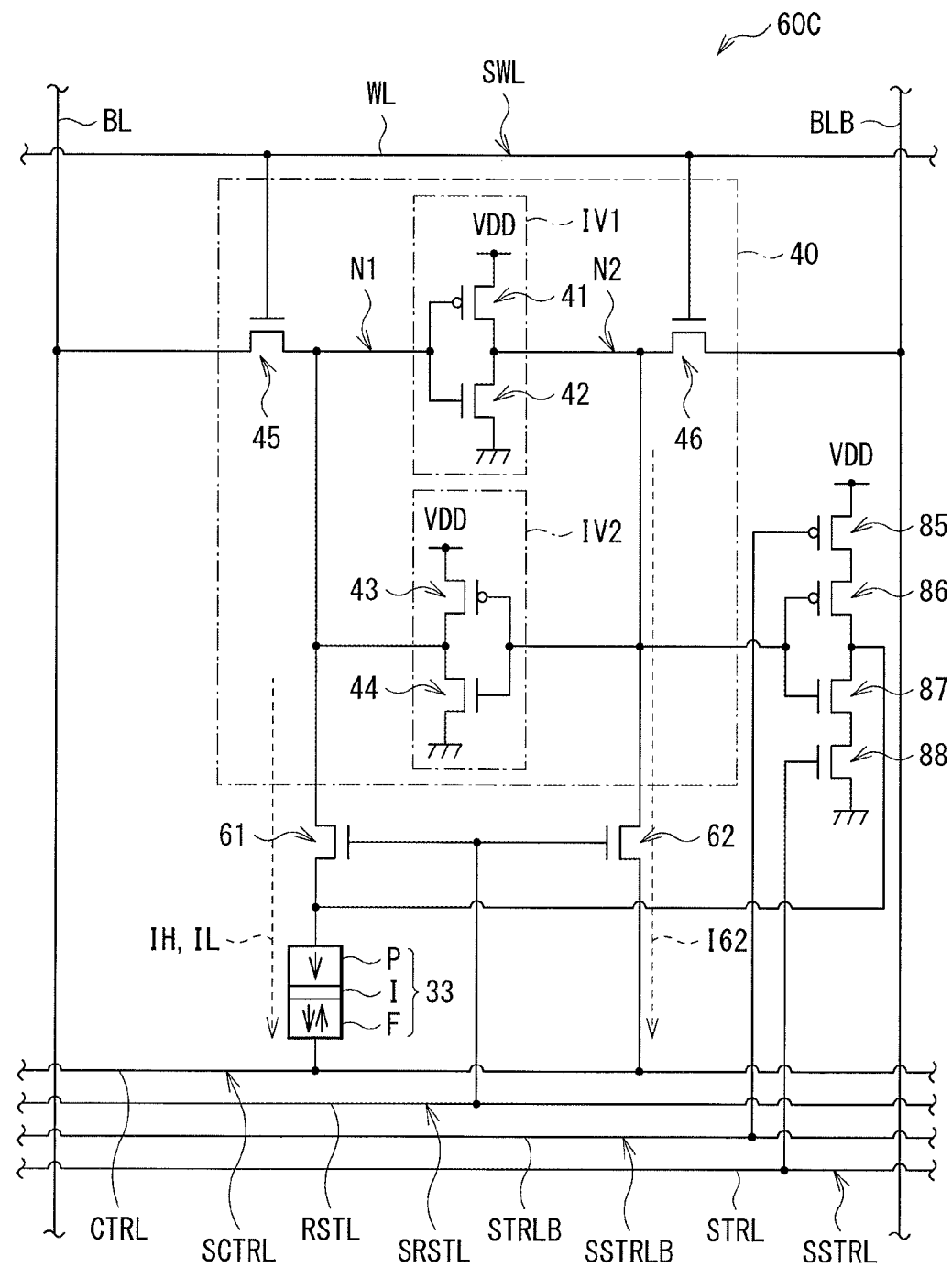

[ FIG. 44 ]
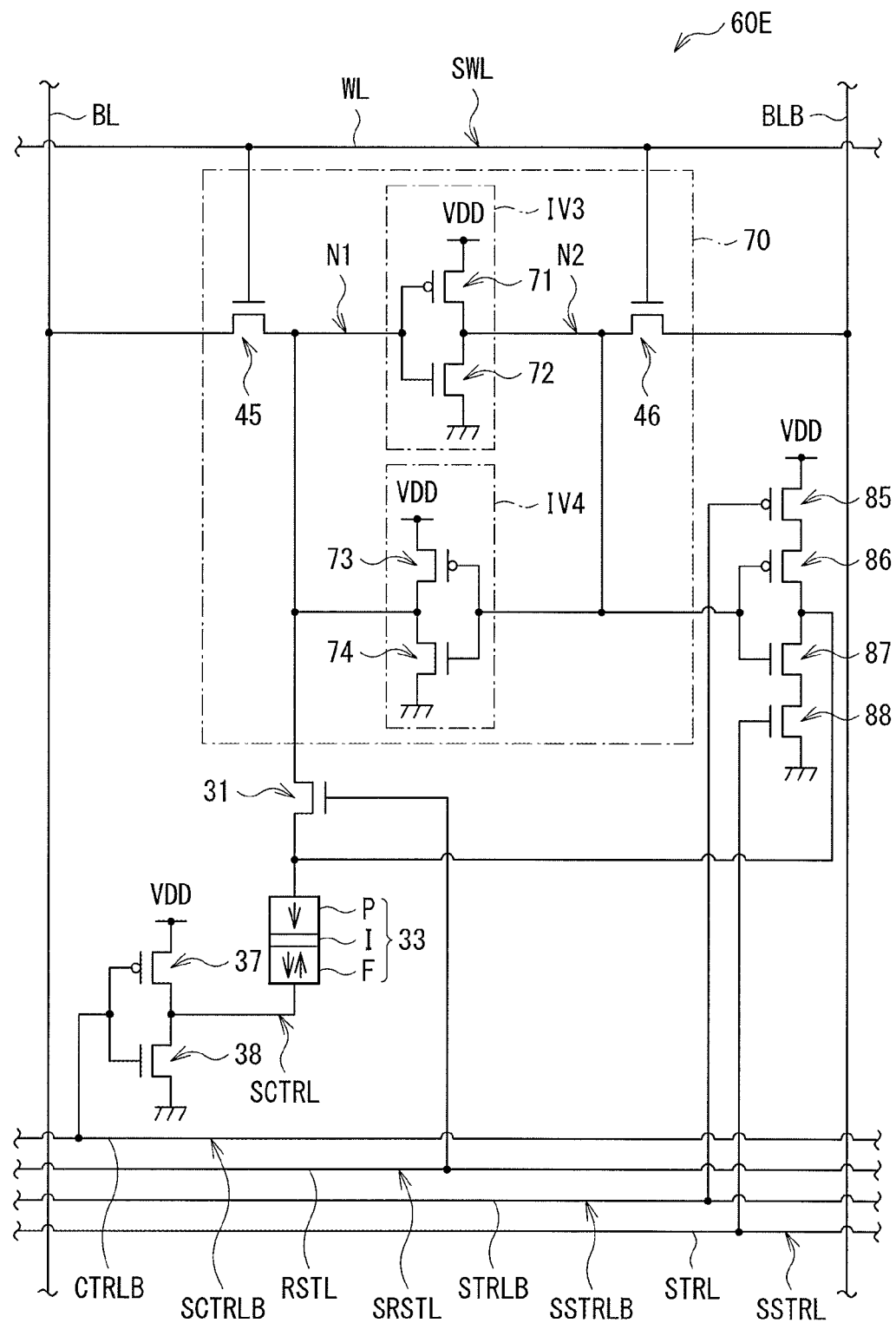

[ FIG. 45 ]
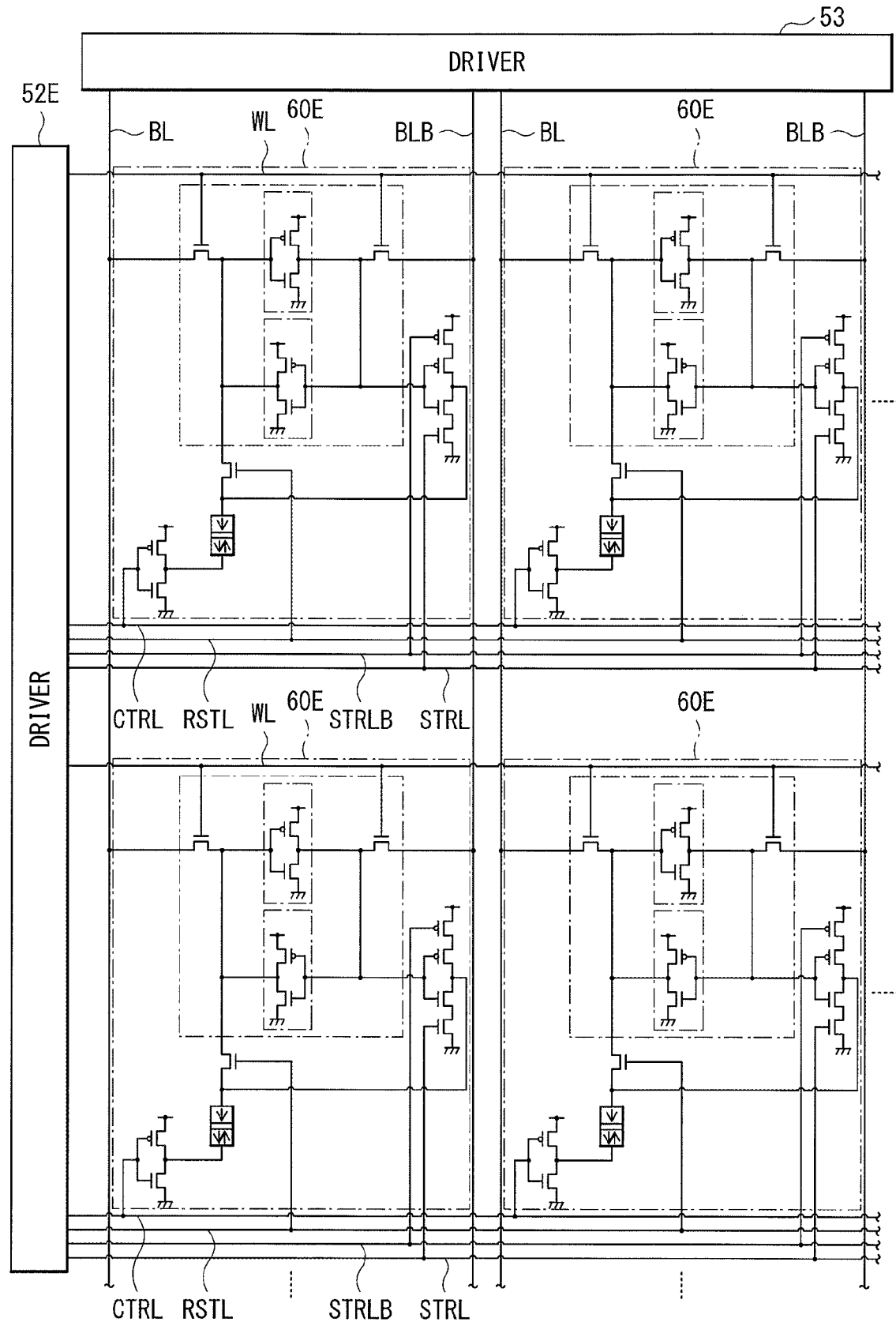

[FIG. 46]
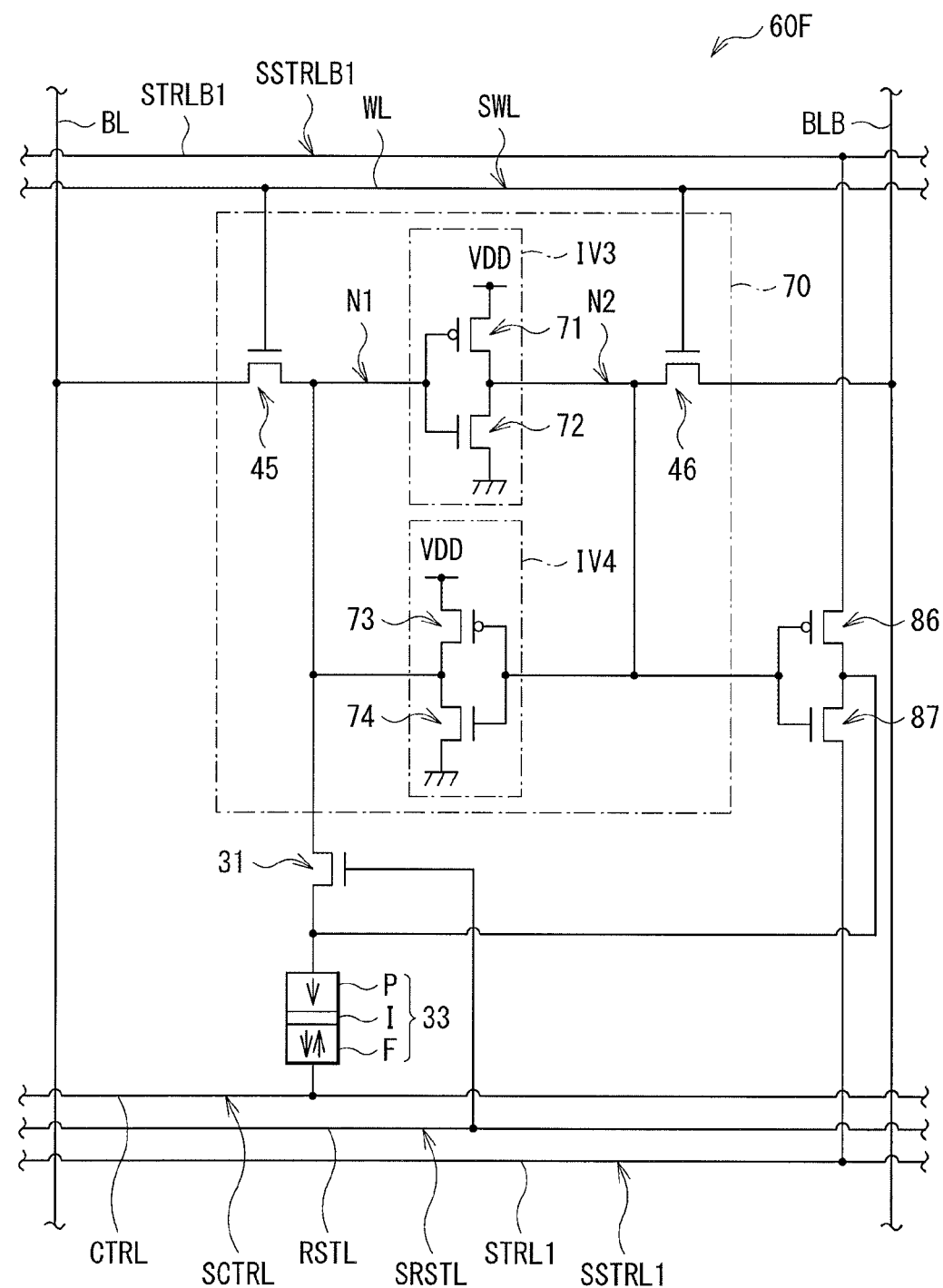

[ FIG. 47 ]
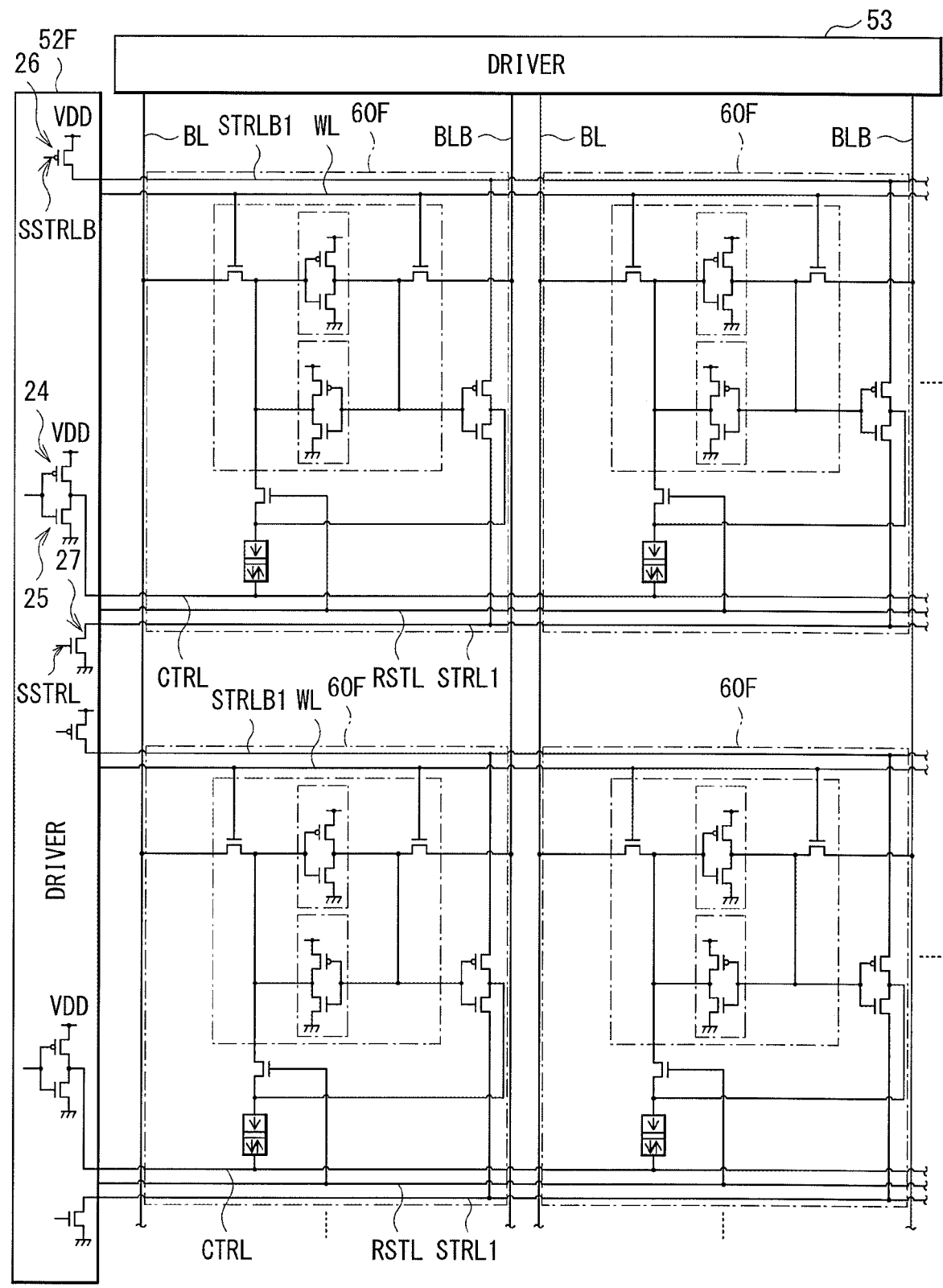

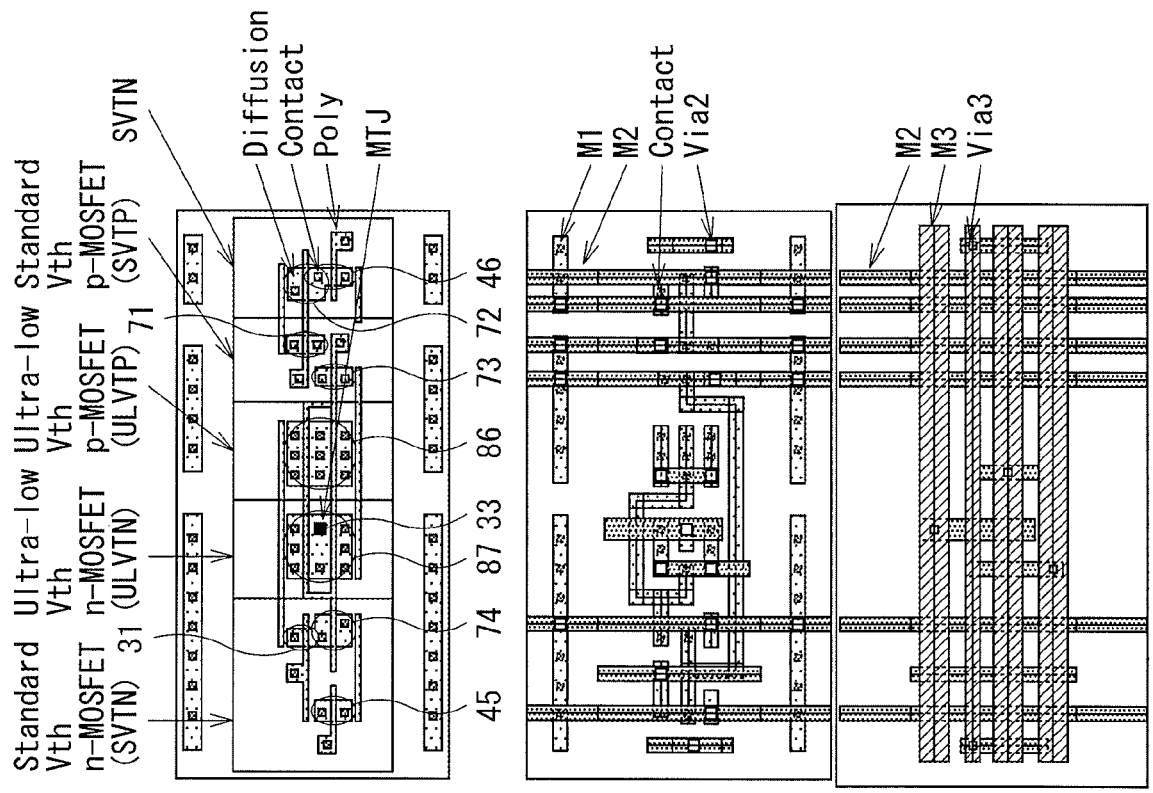
[FIG. 48]

[ FIG. 49 ]
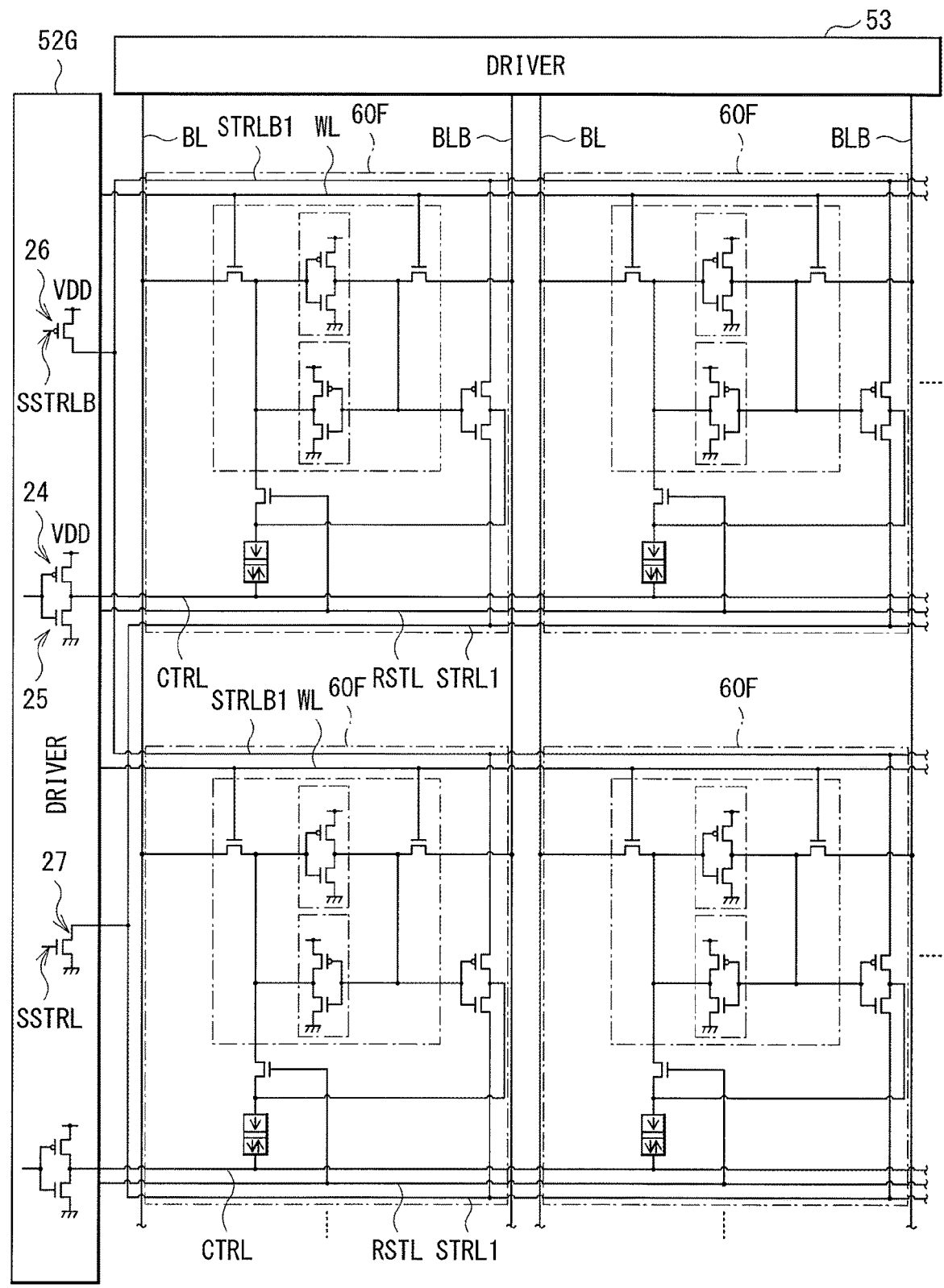

[ FIG. 50 ]
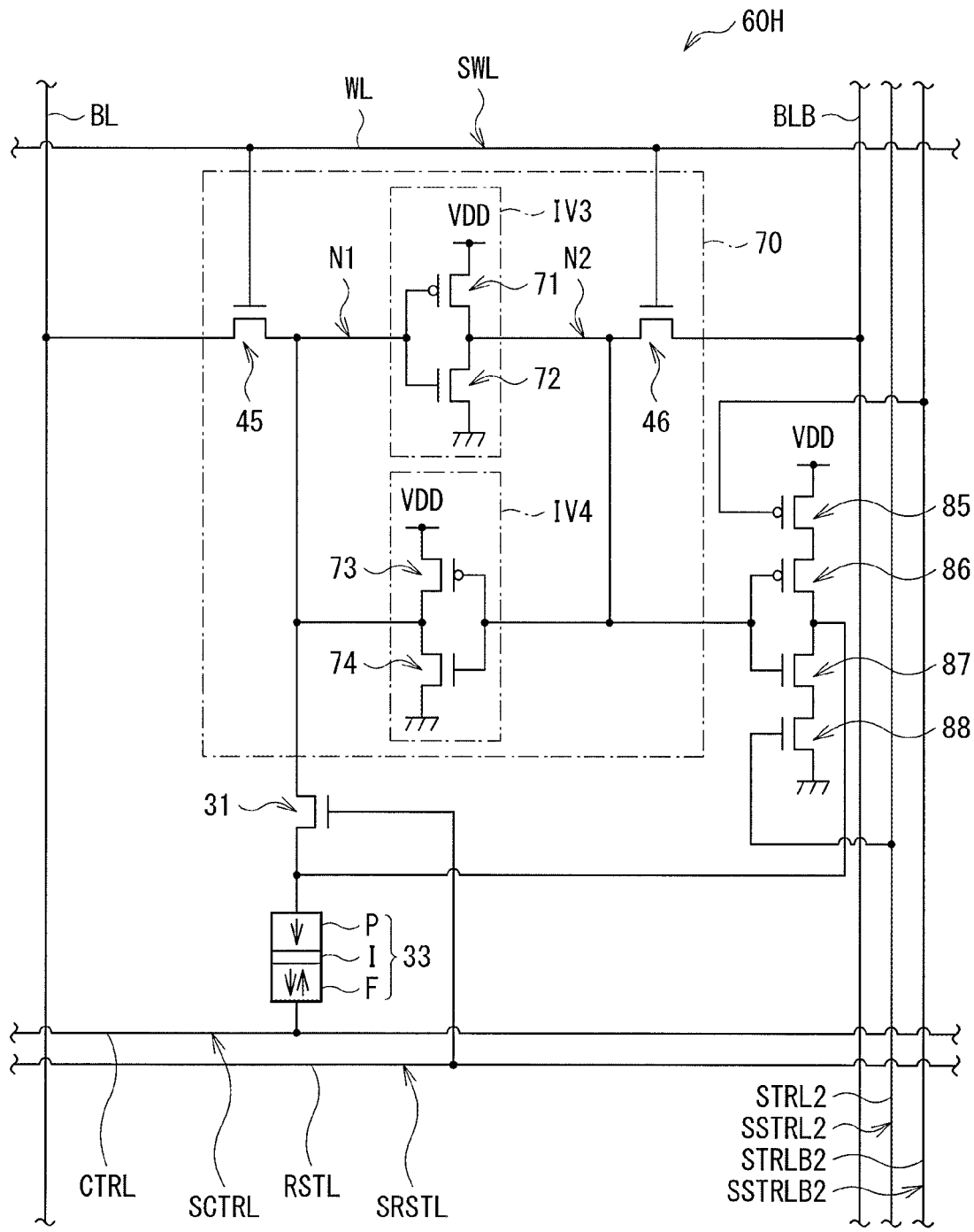

[FIG. 51]
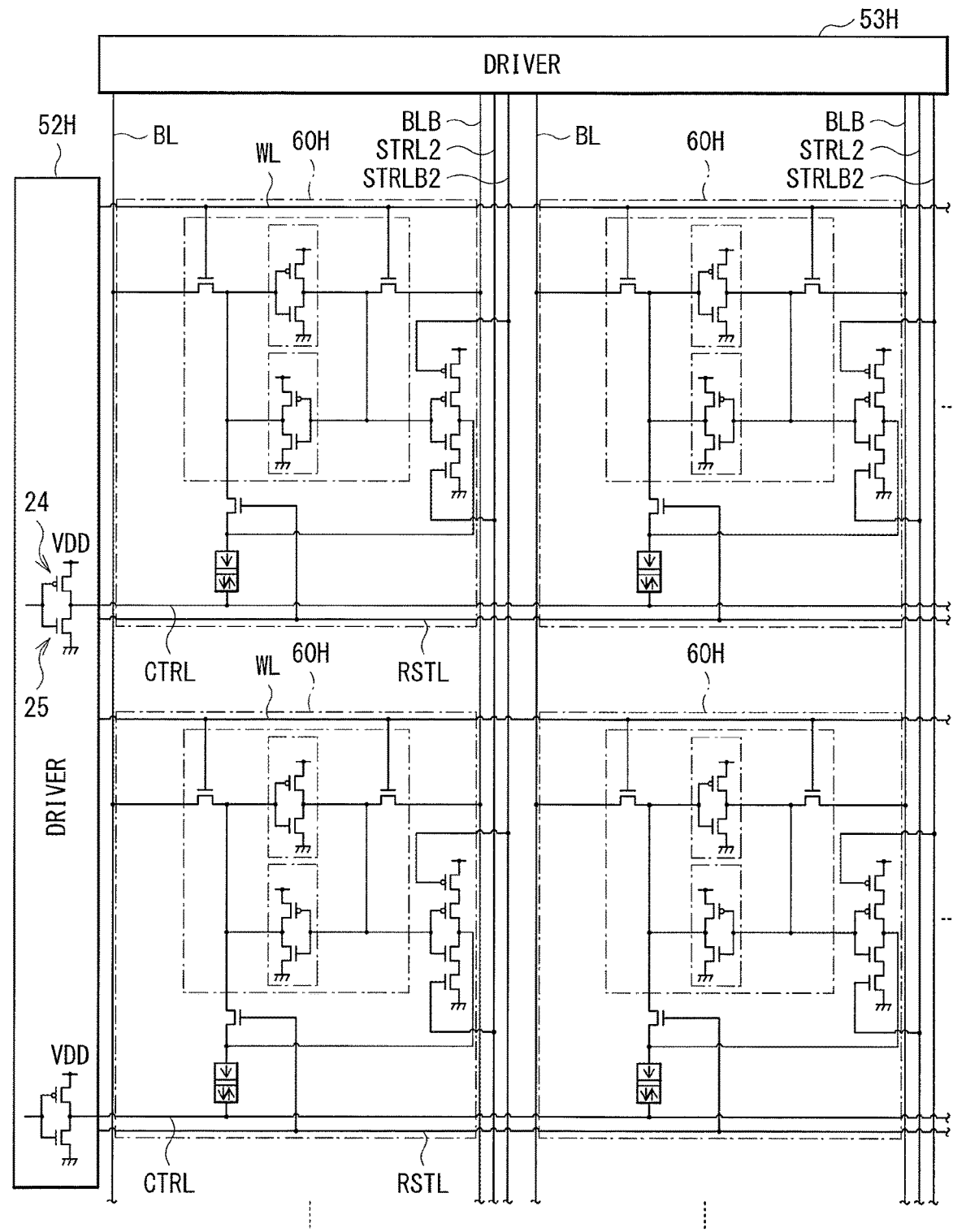

[FIG. 52]
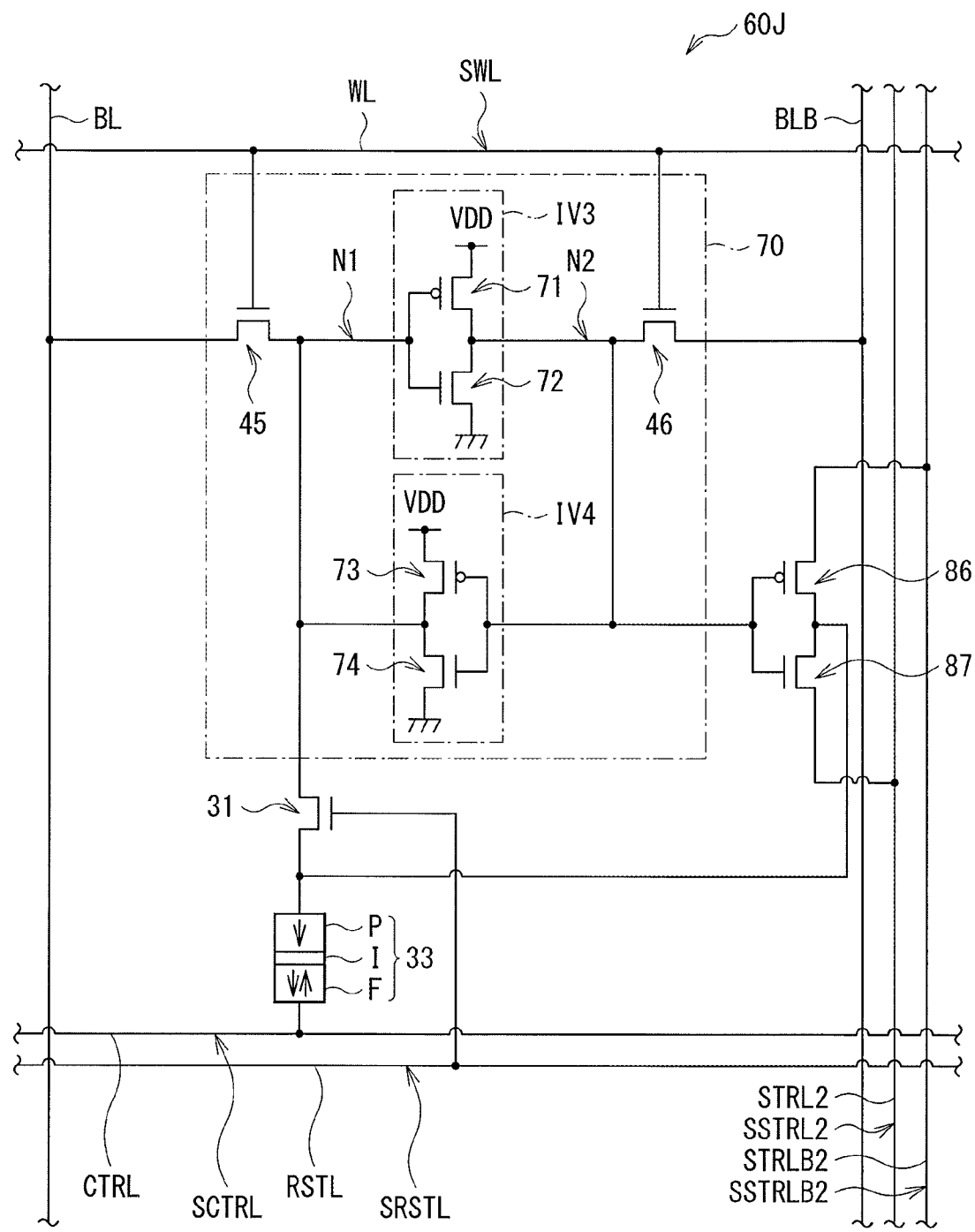

[ FIG. 53 ]
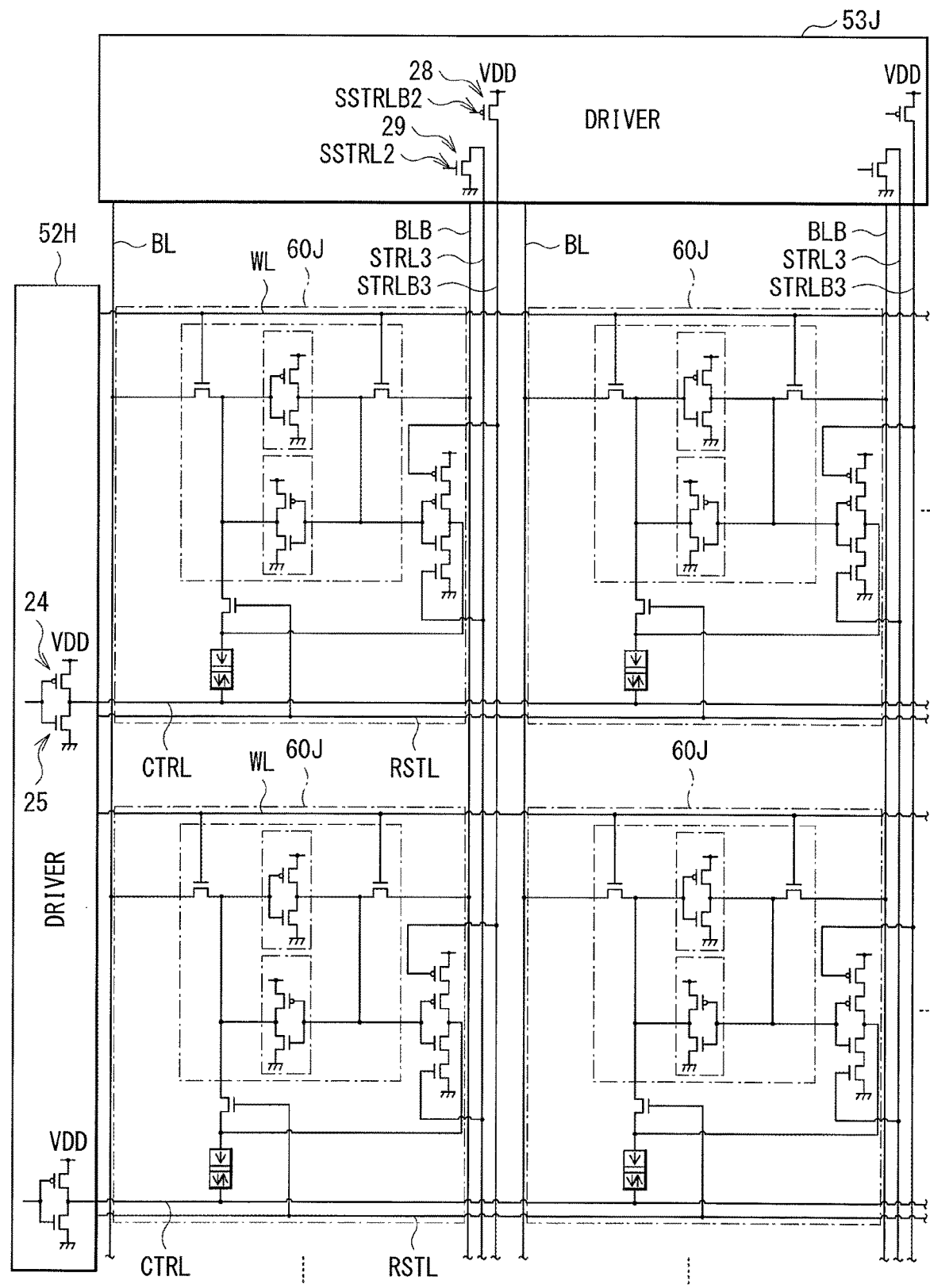

[ FIG. 54 ]
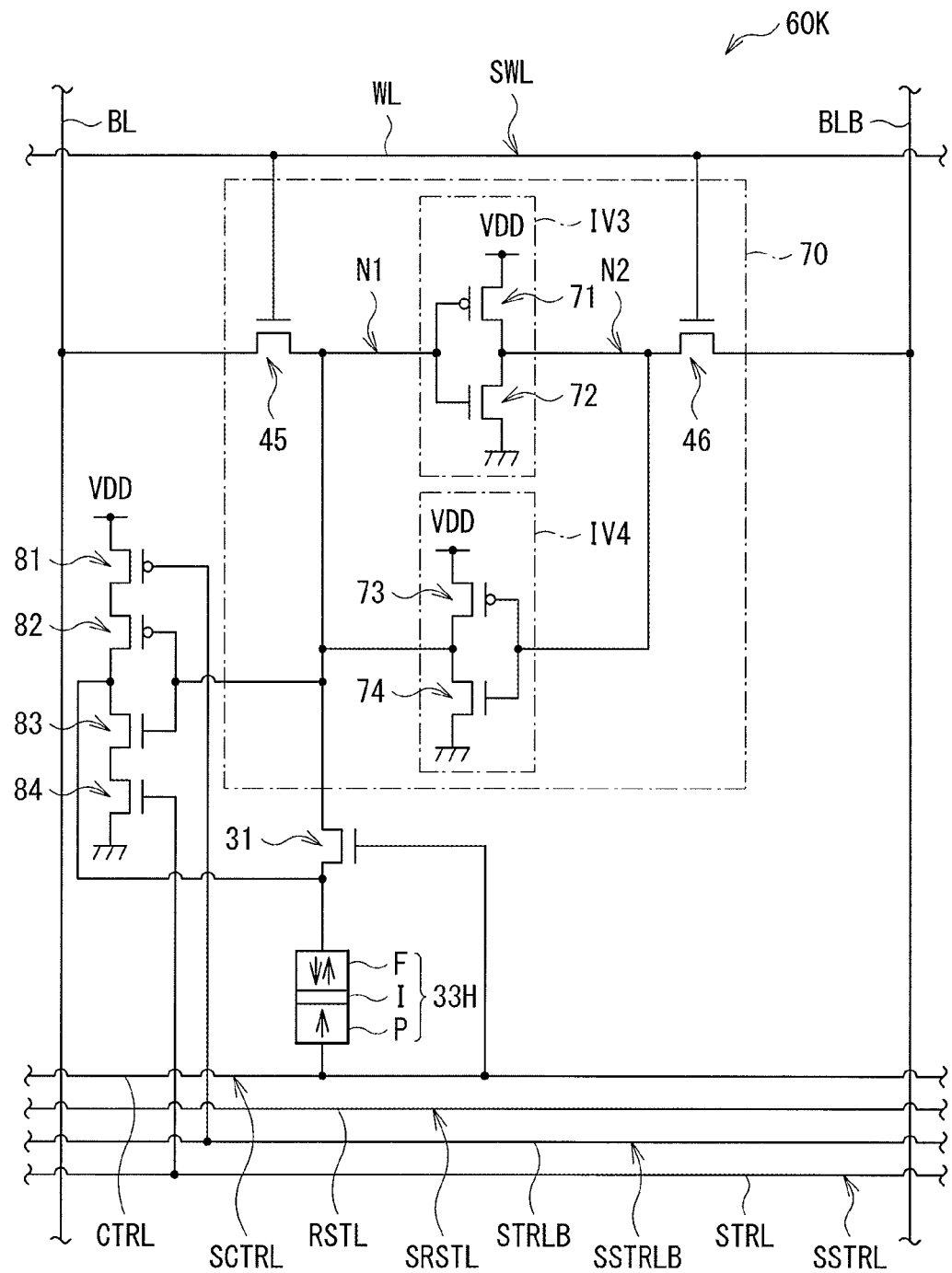

[ FIG. 55A ]
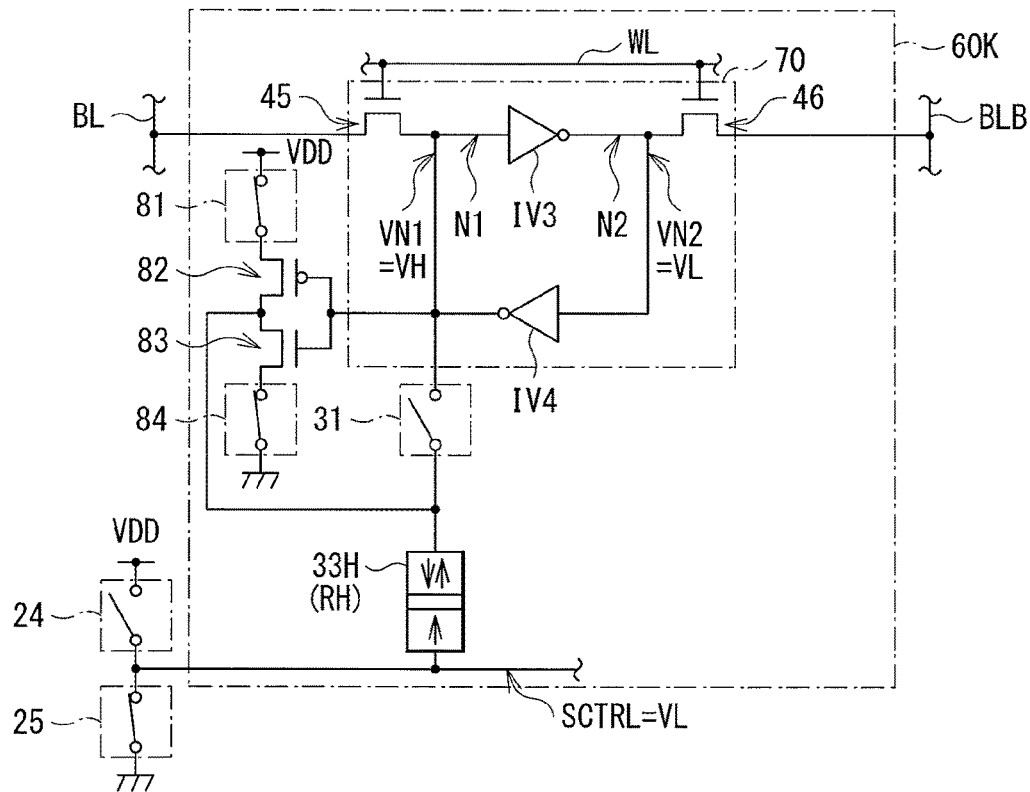
[ FIG. 55B ]
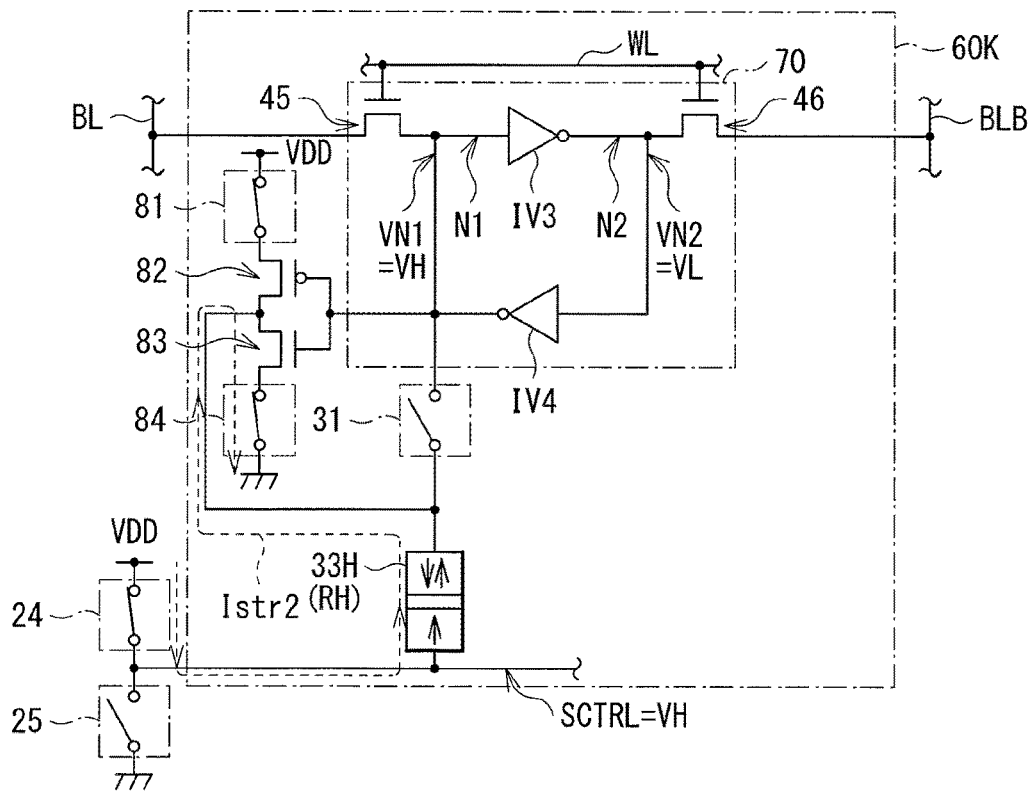

[FIG. 56A]
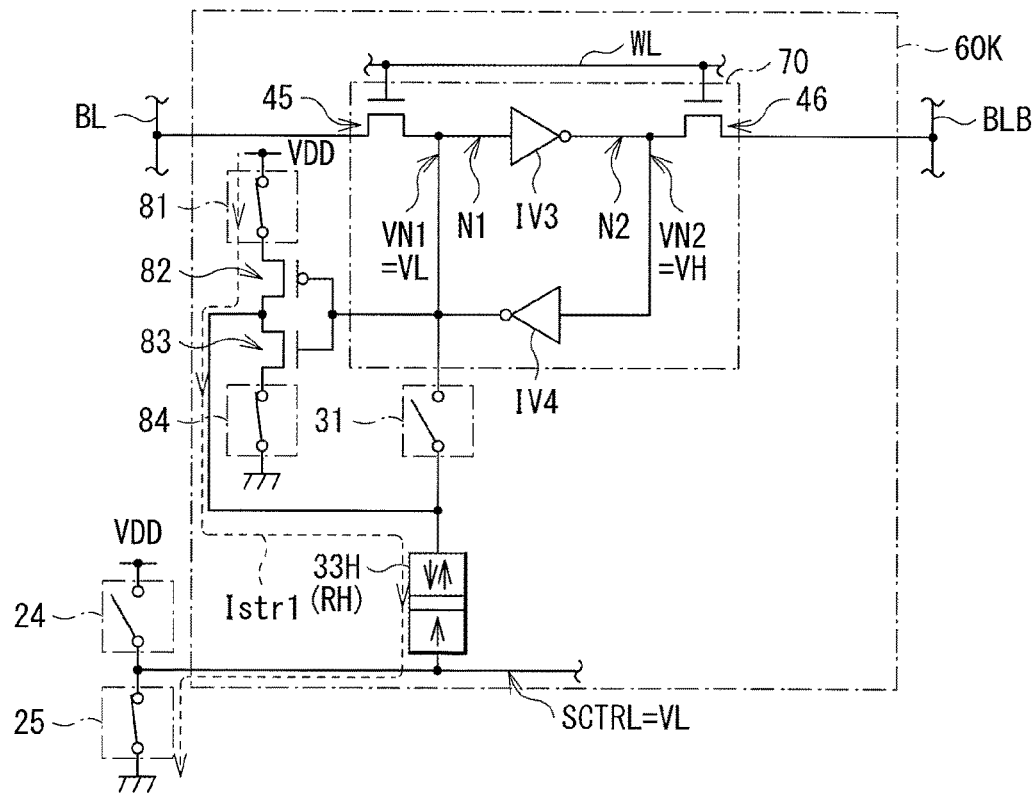
[FIG. 56B]
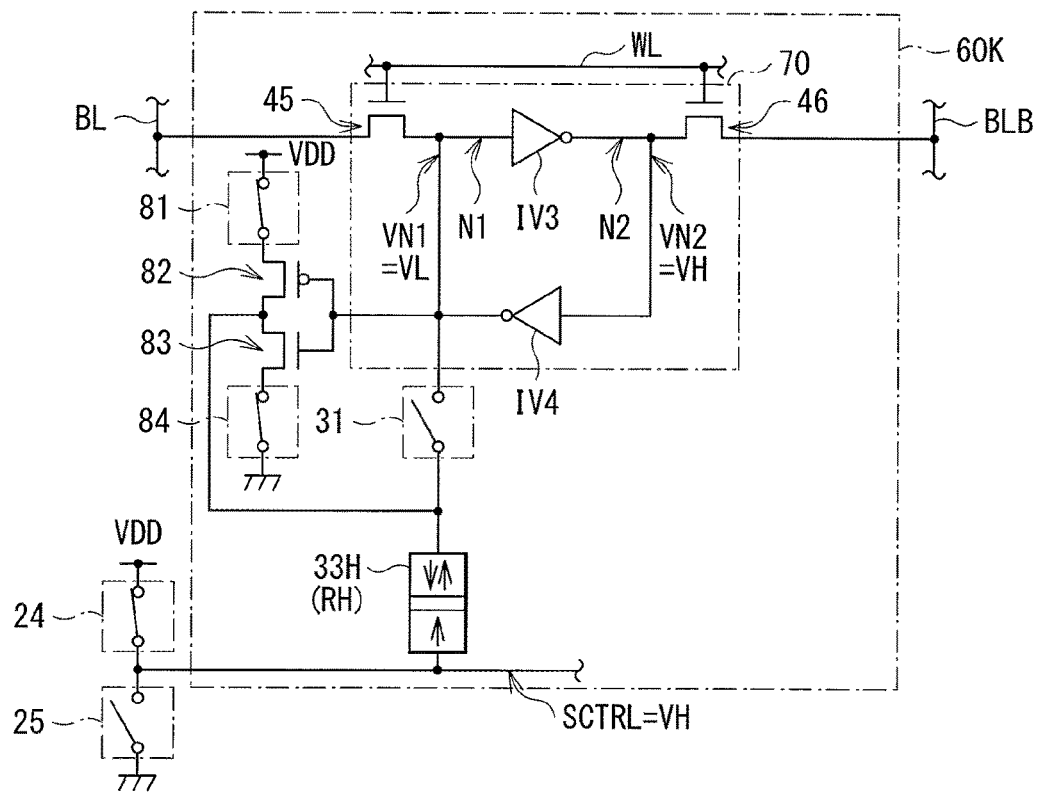

[ FIG. 57 ]
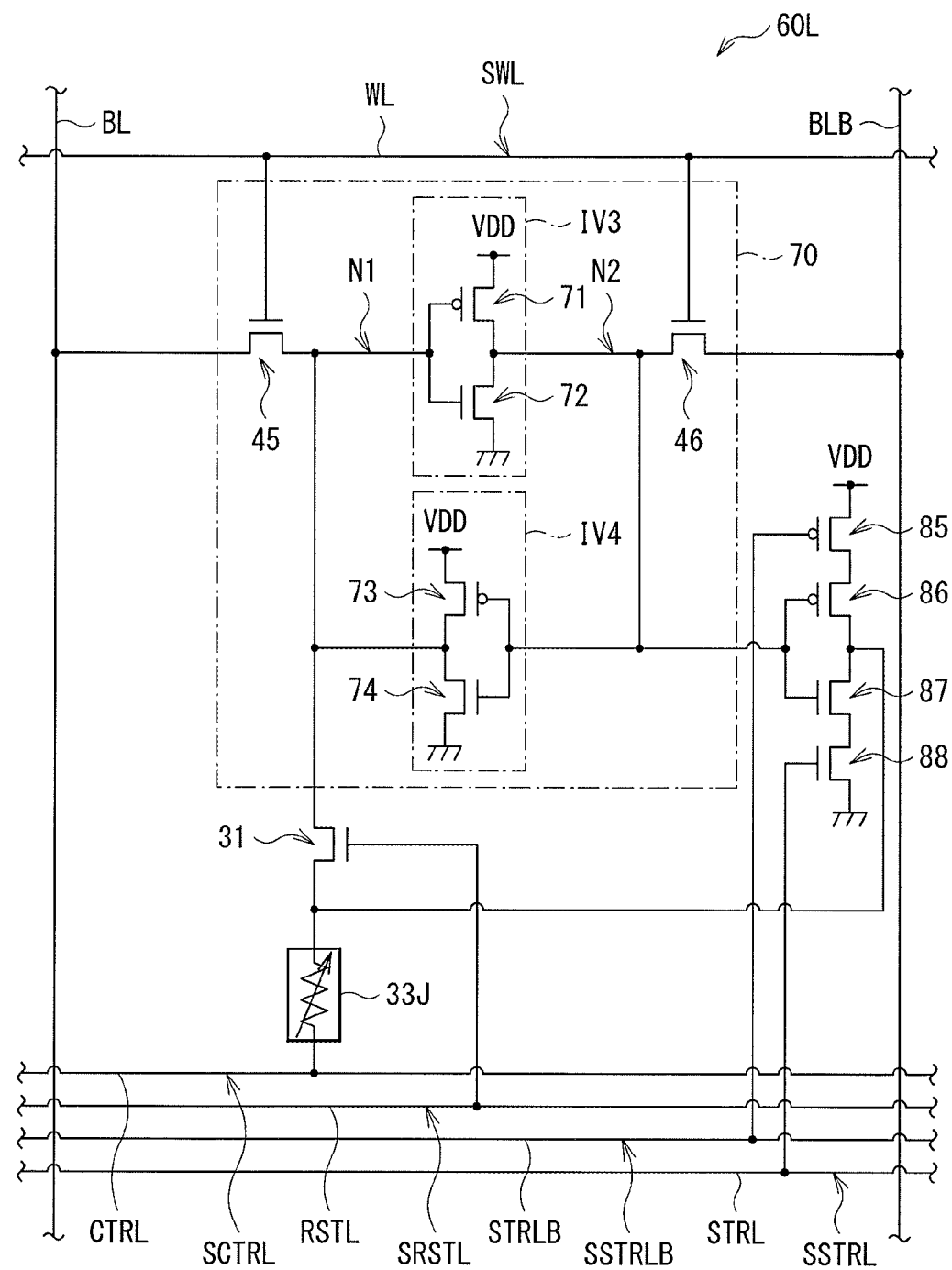

[ FIG. 58 ]
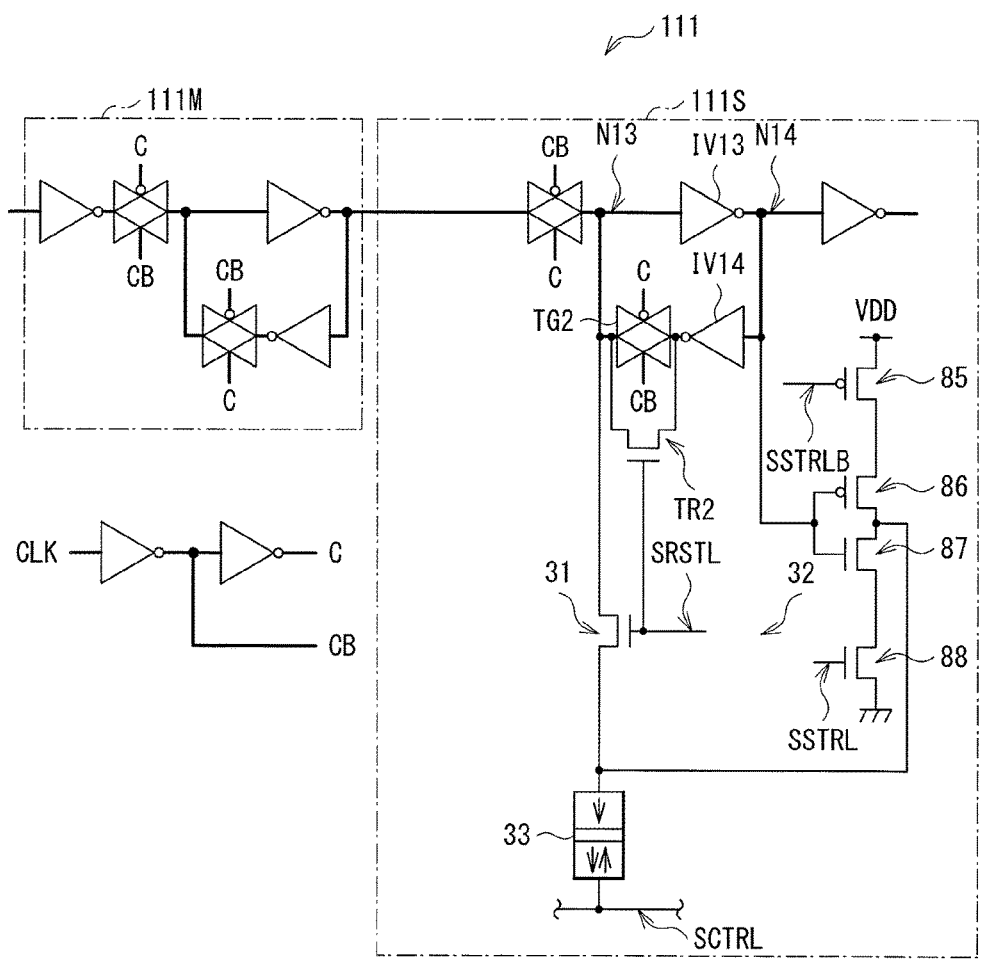

[ FIG. 59 ]
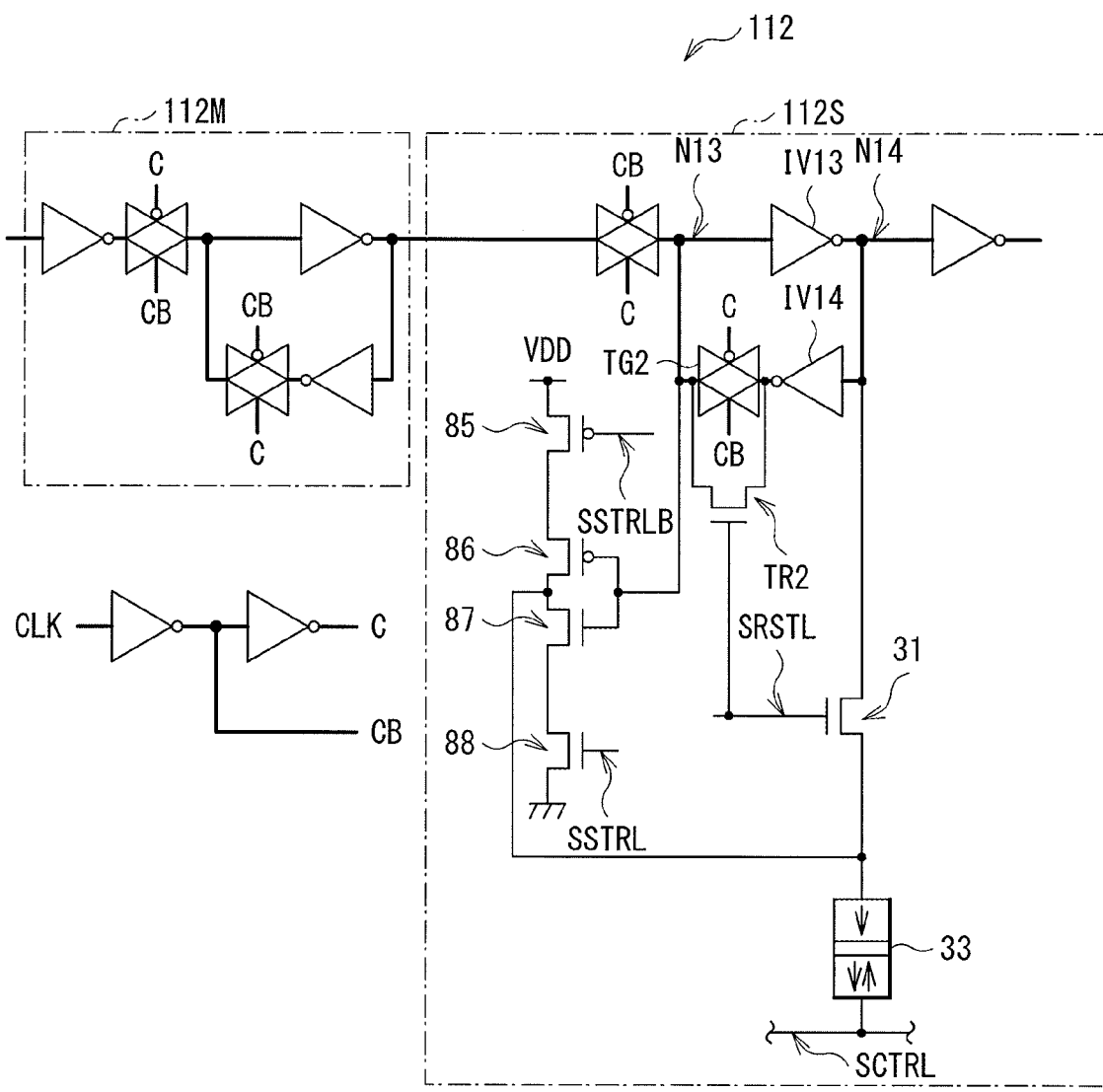

[ FIG. 60 ]
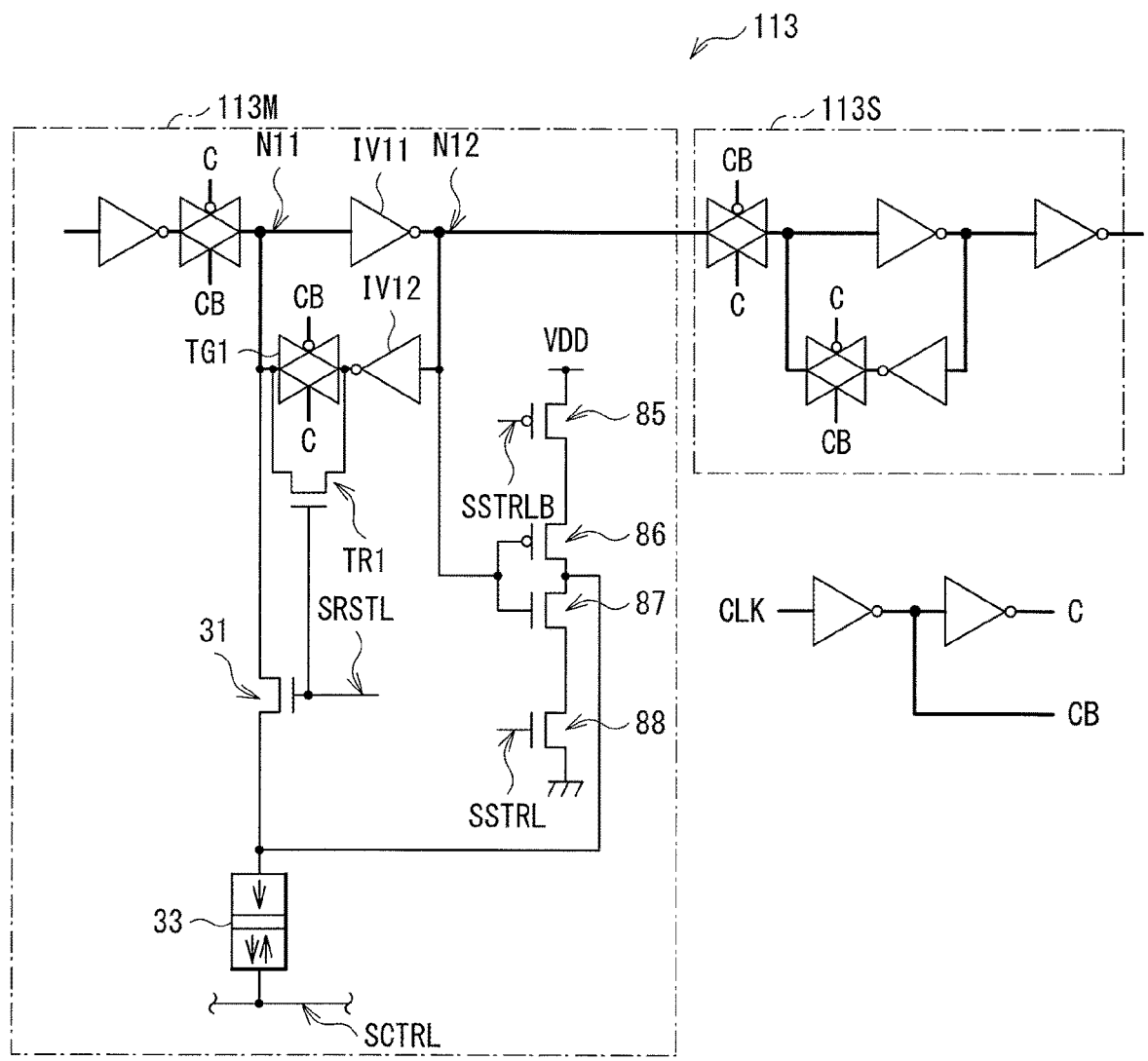

[ FIG. 61 ]
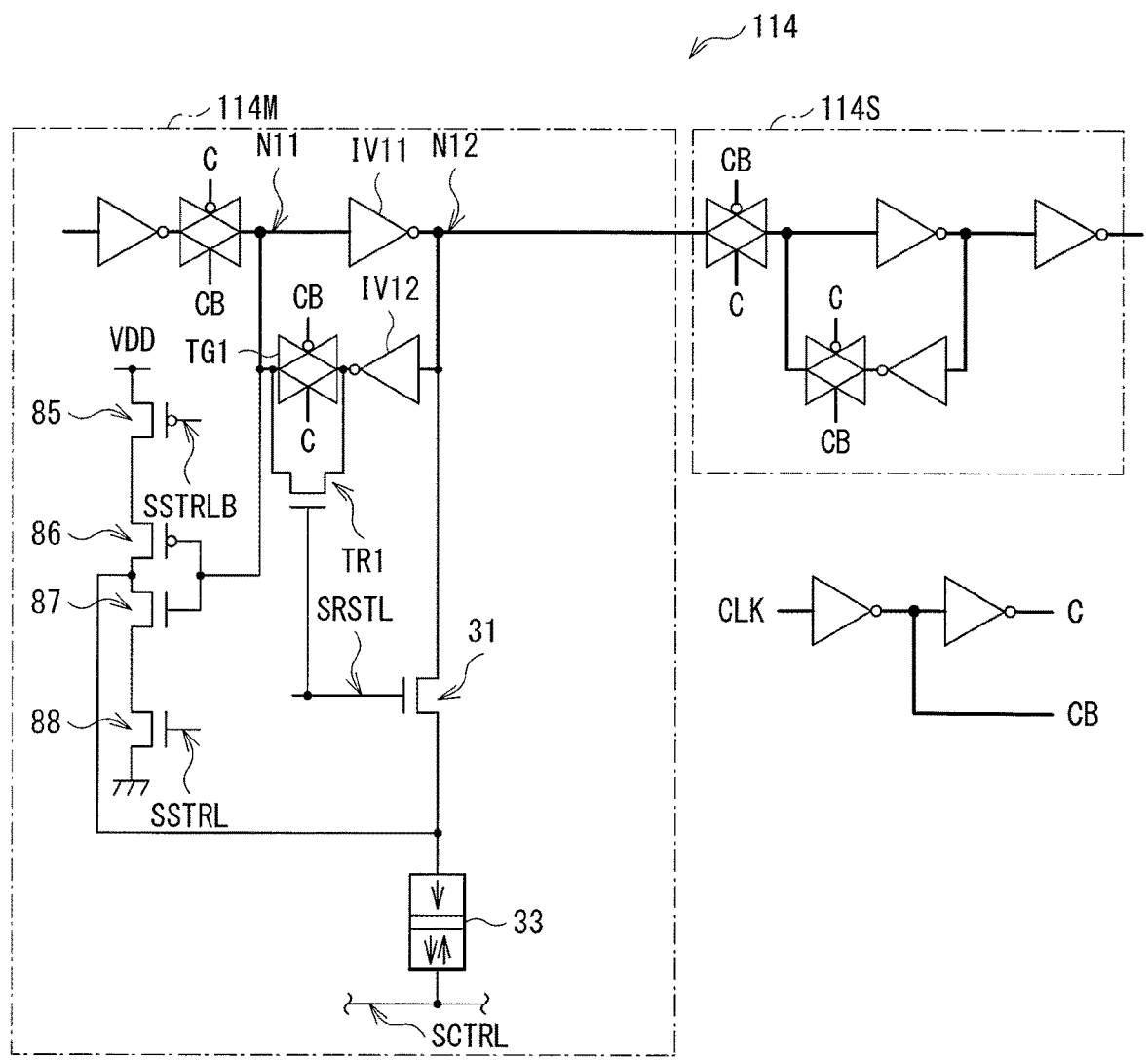

[FIG. 62]
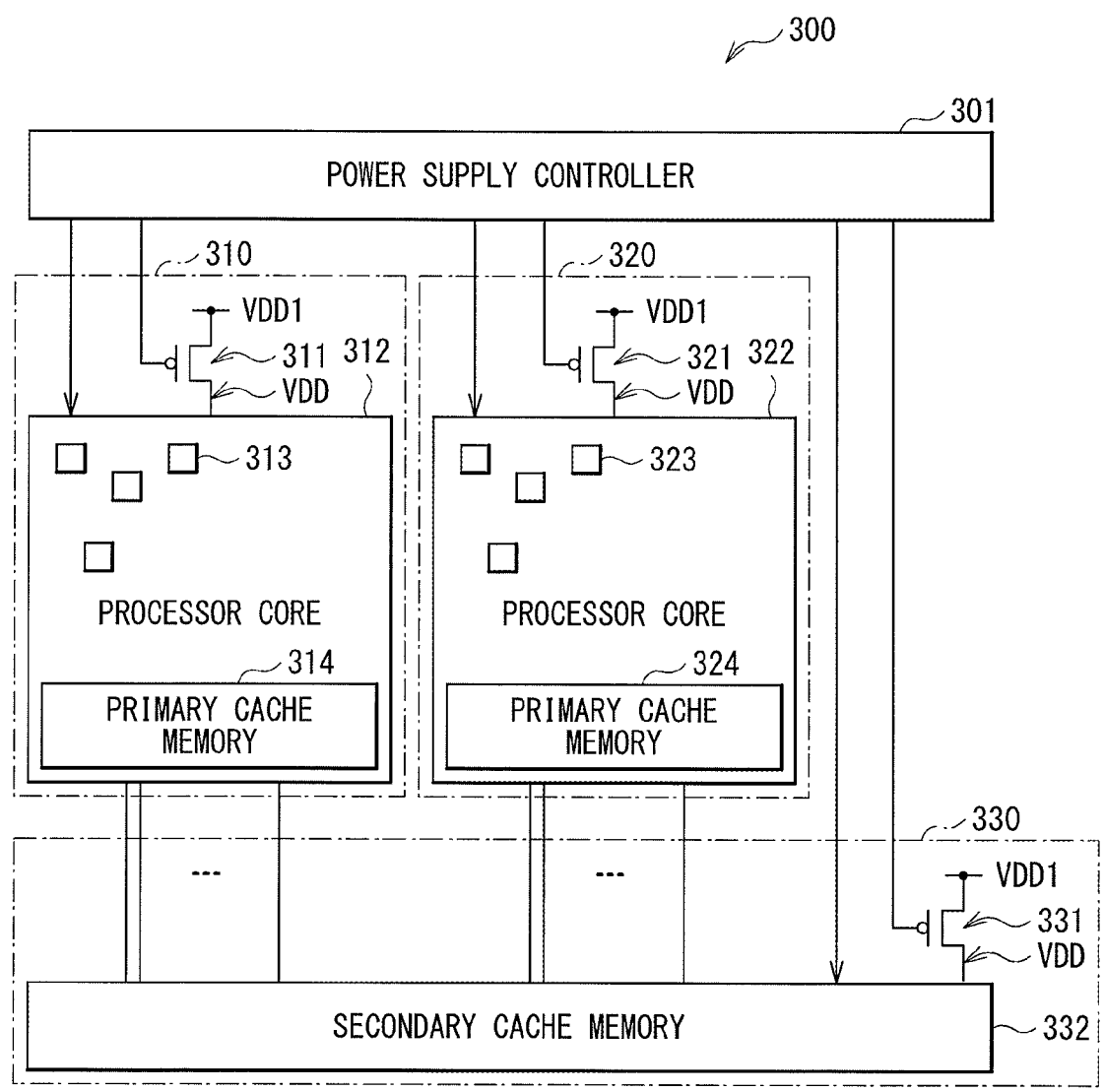

[ FIG. 63 ]
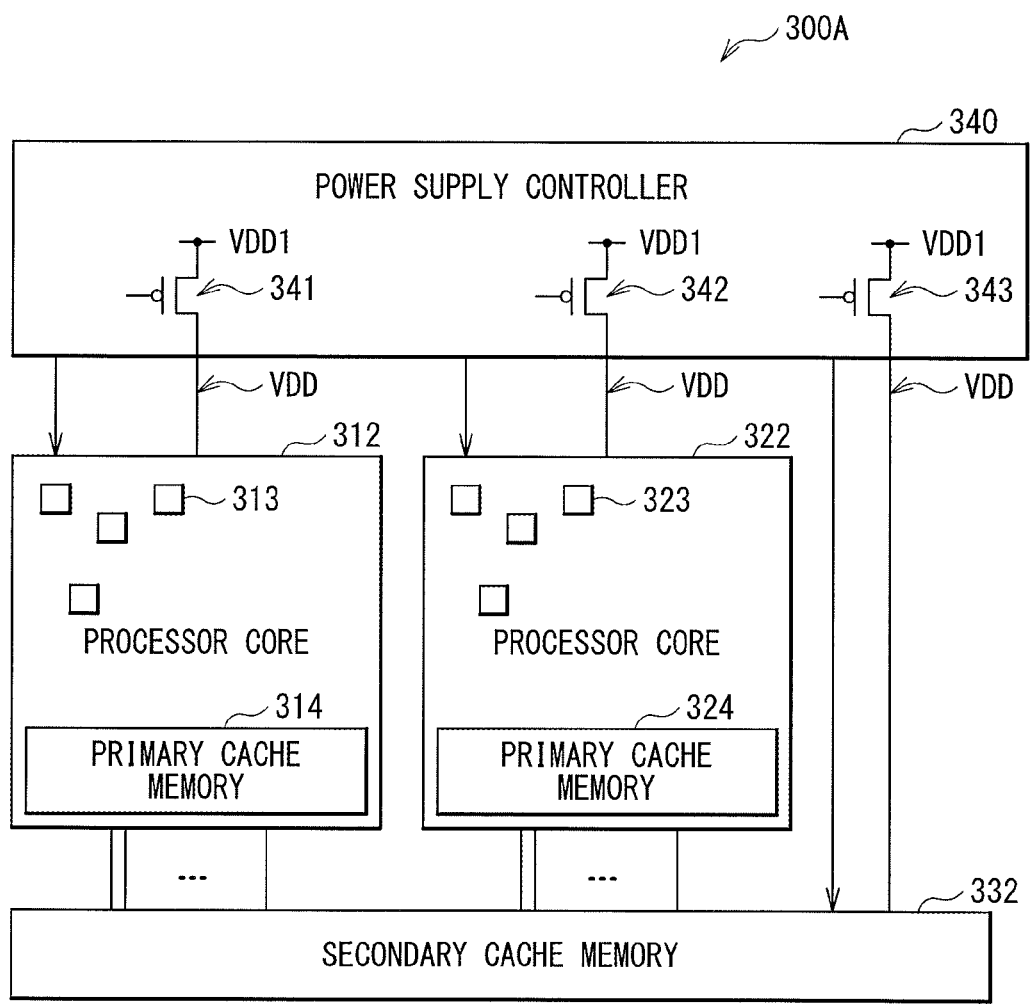

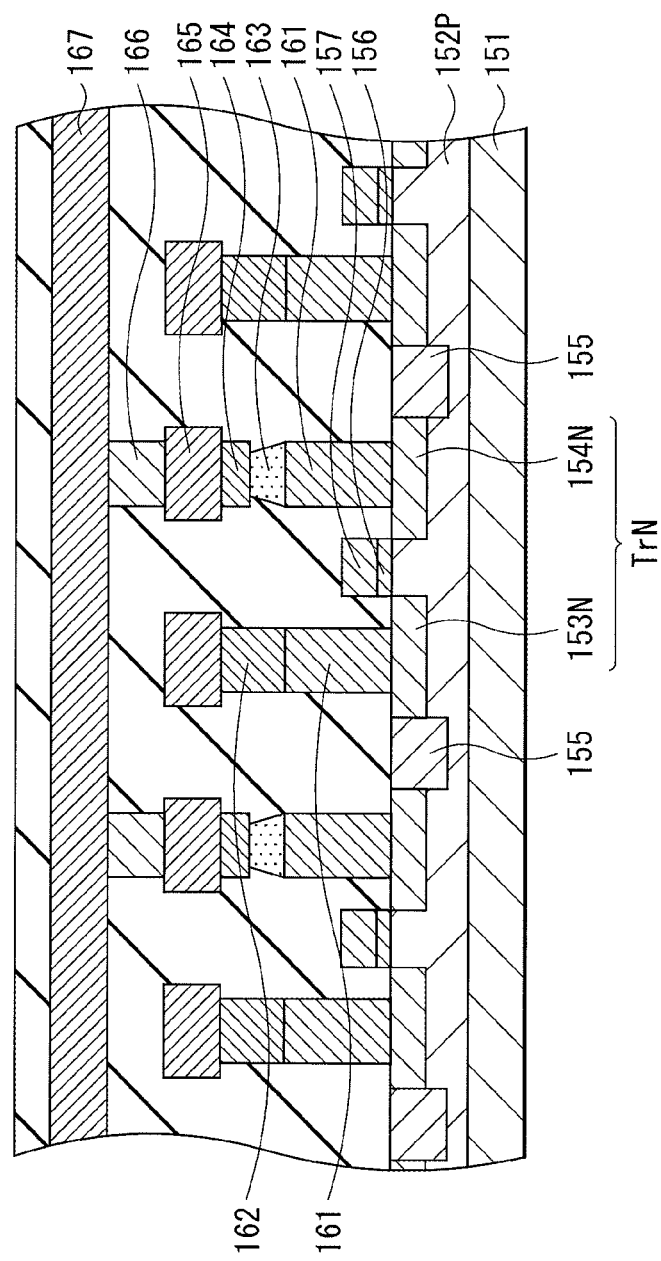
[FIG. 64]

SEMICONDUCTOR CIRCUIT AND SEMICONDUCTOR CIRCUIT SYSTEM

CROSS REFERENCE TO RELATED APPLICATIONS

This application is a national stage application under 35 U.S.C. 371 and claims the benefit of PCT Application No. PCT/JP2017/039520 having an international filing date of 1 Nov. 2017, which designated the United States, which PCT application claimed the benefit of Japanese Patent Application No. 2016-221977 filed 14 Nov. 2016, the entire disclosures of each of which are incorporated herein by reference.

TECHNICAL FIELD

The disclosure relates to a semiconductor circuit and a semiconductor circuit system.

BACKGROUND ART

From an ecological point of view, electronic apparatuses are expected to have reduced power consumption. For example, for semiconductor circuits, so-called power gating, a technique designed to reduce power consumption by selectively suspending power supply to some circuits, is often used. Thus, it is desired that immediately after the power supply is resumed, the circuits to which power supply is suspended be returned to the operational state before the power supply is suspended. One of the methods for achieving the return operation in such a short time is to incorporate a nonvolatile storage element in the circuit. For example, PTL 1 discloses a circuit that includes a combination of a static random access memory (SRAM) that is a volatile memory and a spin-transfer torque storage element.

CITATION LIST

Patent Literature

SUMMARY OF THE INVENTION

Meanwhile, such a circuit including a storage element is desired to reduce the possibility of causing disturb, and further improvement is expected.

It is desirable to provide a semiconductor circuit and a semiconductor circuit system that make it possible to reduce the possibility of causing disturb.

A first semiconductor circuit according to an embodiment of the disclosure includes a first circuit, a second circuit, a first transistor, a first storage element, a first voltage setting circuit, and a driver. The first circuit is able to generate an inverted voltage of a voltage at a first node and apply the inverted voltage to a second node. The second circuit is able to generate an inverted voltage of a voltage at the second node and apply the inverted voltage to the first node. The first transistor couples the first node to a third node by turning on. The first storage element has a first terminal coupled to the third node and a second terminal supplied with a control voltage, and is able to take a first resistance state or a second resistance state. The first voltage setting circuit is coupled to the third node and is able to set a voltage at the third node to a voltage corresponding to a voltage at a predetermined node out of the first node and the second node. The driver controls an operation of the first transistor and sets the control voltage.

A second semiconductor circuit according to an embodiment of the disclosure includes a first circuit, a second circuit, a first transistor, a sixteenth transistor, a first storage element, a third storage element, a first voltage setting circuit, a third voltage setting circuit, and a driver. The first circuit is able to generate an inverted voltage of a voltage at a first node and apply the inverted voltage to a second node. The second circuit is able to generate an inverted voltage of a voltage at the second node and apply the inverted voltage to the first node. The first transistor couples the first node to a third node by turning on. The sixteenth transistor couples the second node to a seventh node by turning on. The first storage element has a first terminal coupled to the third node and a second terminal supplied with a control voltage, and is able to take a first resistance state or a second resistance state. The third storage element has a first terminal coupled to the seventh node and a second terminal supplied with the control voltage, and is able to take the first resistance state or the second resistance state. The first voltage setting circuit is coupled to tire third node and is able to set a voltage at the third node to a voltage corresponding to a voltage at a predetermined node out of the first node and the second node. Tire third voltage setting circuit is coupled to the seventh node and sets a voltage at the seventh node to a voltage corresponding to the voltage at the predetermined node out of the first node and the second node. The driver controls an operation of each of the first transistor and the sixteenth transistor, and sets the control voltage.

A first semiconductor circuit system according to an embodiment of the disclosure includes a storage section and a controller. The storage section includes the foregoing first semiconductor circuit.

A second semiconductor circuit system according to an embodiment of the disclosure includes a storage section and a controller. The storage section includes the foregoing second semiconductor circuit.

In the first semiconductor circuit and the first semiconductor circuit system according to the embodiment of the disclosure, through the first circuit and the second circuit, voltages inverted from each other appear at the first node and the second node. Turning on the first transistor couples the first node to the third node. The third node is coupled to one end of the first storage element. The first storage element has another end supplied with the control voltage. The control voltage is set by the driver. In addition, the first voltage setting circuit is coupled to the third node. The first voltage setting circuit sets the voltage at the third node to a voltage corresponding to a voltage at one of the first node or the second node.

In the second semiconductor circuit and the second semiconductor circuit system according to the embodiment of the disclosure, through the first circuit and the second circuit, voltages inverted from each other appear at the first node and the second node. Turning on the first transistor couples the first node to the third node. The third node is coupled to one end of the first storage element. The first storage element has another end supplied with the control voltage. The control voltage is set by the driver. In addition, the first voltage setting circuit is coupled to the third node. The first voltage setting circuit sets the voltage at the third node to a voltage corresponding to the voltage at one of the first node or the second node. Turning on the sixteenth transistor couples the second node to the seventh node. The seventh node is coupled to one end of the third storage element. The first storage element has another end supplied with the control voltage. In addition, the third voltage setting circuit is coupled to the seventh node. The third voltage setting circuit sets the voltage at the seventh node to a voltage corresponding to a voltage at one of the first node or the second node.

According to the first semiconductor circuit and the first semiconductor circuit system in the embodiment of the disclosure, the voltage at the third node is set by using the first voltage setting circuit, to a voltage corresponding to the voltage at a predetermined node out of the first node and the second node. This makes it possible to reduce the possibility of causing disturb.

According to the second semiconductor circuit and the second semiconductor circuit system in the embodiment of the disclosure, the voltage at the third node is set, by using the first voltage setting circuit, to a voltage corresponding to the voltage at a predetermined node out of the first node and the second node, and the voltage at the seventh node is set, by using the third voltage setting circuit, to a voltage corresponding to the voltage at the predetermined node out of the first node and the second node. This makes it possible to reduce the possibility of causing disturb.

It is to be noted that the effects described here are not necessarily limitative, and may have any of the effects described in the disclosure.

BRIEF DESCRIPTION OF DRAWINGS

FIG. 1 is a block diagram that illustrates an example of a configuration of a semiconductor circuit according to an embodiment of the disclosure.

FIG. 2 is a circuit diagram that illustrates an example of a configuration of a memory cell according to a first embodiment.

FIG. 3 is a circuit diagram that illustrates an example of a configuration of a memory cell array including the memory cell illustrated in FIG. 2.

FIG. 4 describes an example of an operation of the memory cell illustrated in FIG. 2.

FIG. 5A is a circuit diagram that illustrates an example of an operation of the memory cell illustrated in FIG. 2.

FIG. 5B is another circuit diagram that illustrates an example of an operation of the memory cell illustrated in FIG. 2.

FIG. 5C is another circuit diagram that illustrates an example of an operation of the memory cell illustrated in FIG. 2.

FIG. 5D is another circuit diagram that illustrates an example of an operation of the memory cell illustrated in FIG. 2.

FIG. 5E is another circuit diagram that illustrates an example of an operation of the memory cell illustrated in FIG. 2.

FIG. 6 another diagram that describes an example of an operation of the memory cell illustrated in FIG. 2.

FIG. 7 is a circuit diagram that illustrates an example of a configuration of a memory cell according to a comparative example.

FIG. 8 describes an example of an operation of the memory cell illustrated in FIG. 7.

FIG. 9A is a circuit diagram that illustrates an example of an operation of the memory cell illustrated in FIG. 7.

FIG. 9B is another circuit diagram that illustrates an example of an operation of the memory cell illustrated in FIG. 7.

FIG. 10 is a layout diagram that illustrates an example of a configuration of the memory cell illustrated in FIG. 2.

FIG. 11 describes coupling of a storage element.

FIG. 12 is another diagram that describes coupling of the storage element.

FIG. 13 is another diagram that describes coupling of the storage element.

FIG. 14 is another diagram that describes coupling of the storage element.

FIG. 15 is another diagram that describes coupling of a storage element according to a comparative example.

FIG. 16 describes an example of an operation of a memory cell according to a modification example of the First embodiment.

FIG. 17A is a circuit diagram that illustrates an example of an operation of the memory cell illustrated in FIG. 16.

FIG. 17B is another circuit diagram that illustrates an example of an operation of the memory cell illustrated in FIG. 16.

FIG. 18 is a circuit diagram that illustrates an example of a configuration of a memory cell according to another modification example of the first embodiment.

FIG. 19A is a circuit diagram that illustrates an example of an operation of the memory cell illustrated in FIG. 18.

FIG. 19B is another circuit diagram that illustrates an example of an operation of the memory cell illustrated in FIG. 18.

FIG. 20 is a circuit diagram that illustrates an example of a configuration of a memory cell according to another modification example of the first embodiment.

FIG. 21 is a circuit diagram that illustrates an example of a configuration of a memory cell array including the memory cell illustrated in FIG. 20.

FIG. 22 is a circuit diagram that illustrates an example of a configuration of a memory cell according to another modification example of the first embodiment.

FIG. 23 is a circuit diagram that illustrates an example of a configuration of a memory cell array including the memory cell illustrated in FIG. 22.

FIG. 24 is a layout diagram that illustrates an example of a configuration of the memory cell illustrated in FIG. 22.

FIG. 25 is a circuit diagram that illustrates another example of a configuration of a memory cell array including the memory cell illustrated in FIG. 22.

FIG. 26 is a circuit diagram that illustrates an example of a configuration of a memory cell according to another modification example of the first embodiment.

FIG. 27 is a circuit diagram that illustrates an example of a configuration of a memory cell array including the memory cell illustrated in FIG. 26.

FIG. 28 is a circuit diagram that illustrates an example of a memory cell according to another modification example of the first embodiment.

FIG. 29 is a circuit diagram that illustrates an example of a configuration of a memory cell array including the memory cell illustrated in FIG. 28.

FIG. 30 is a circuit diagram that illustrates an example of a configuration of a memory cell according to another modification example of the first embodiment.

FIG. 31A is a circuit diagram that illustrates an example of an operation of the memory cell illustrated in FIG. 30.

FIG. 31B is another circuit diagram that illustrates an example of an operation of the memory cell illustrated in FIG. 30.

FIG. 32 is a circuit diagram that illustrates an example of a configuration a memory cell according to another modification example of the first embodiment.

FIG. 33 is a block diagram that illustrates an example of a configuration of a semiconductor circuit according to a modification example.

FIG. 34 is a circuit diagram that illustrates an example of a configuration of a flip-flop circuit to which the technique according to the first embodiment is applied.

FIG. 35 is a circuit diagram that illustrates another example of a configuration of a flip-flop circuit to which the technique according to the first embodiment is applied.

FIG. 36 is a circuit diagram that illustrates an example of a configuration of a memory cell according to a second embodiment.

FIG. 37 is a circuit diagram that illustrates an example of a configuration of a memory cell array including the memory cell illustrated in FIG. 36.

FIG. 38 describes an example of an operation of the memory cell illustrated in FIG. 36.

FIG. 39 is a circuit diagram that illustrates an example of an operation of the memory cell illustrated in FIG. 36.

FIG. 40A is another circuit diagram that illustrates an example of an operation of the memory cell illustrated in FIG. 36.

FIG. 40B is another circuit diagram that illustrates an example of an operation of the memory cell illustrated in FIG. 36.

FIG. 40C is another circuit diagram that illustrates an example of an operation of the memory cell illustrated in FIG. 36.

FIG. 40D is another circuit diagram that illustrates an example of an operation of the memory cell illustrated in FIG. 36.

FIG. 41A is another circuit diagram that illustrates an example of an operation of the memory cell illustrated in FIG. 36.

FIG. 41B is another circuit diagram that illustrates as example of an operation of the memory cell illustrated in FIG. 36.

FIG. 41C is another circuit diagram that illustrates an example of an operation of the memory cell illustrated in FIG. 36.

FIG. 41D is another circuit diagram that illustrates an example of an operation of the memory cell illustrated in FIG. 36.

FIG. 42 is a layout diagram that illustrates an example of a configuration of the memory cell illustrated in FIG. 36.

FIG. 43 is a circuit diagram that illustrates an example of a configuration of a memory cell according to a modification example of the second embodiment.

FIG. 44 is a circuit diagram that illustrates an example of a configuration of a memory cell according to another modification example of the second embodiment.

FIG. 45 is a circuit diagram that illustrates an example of a configuration of a memory cell army including the memory cell illustrated in FIG. 44.

FIG. 46 is a circuit diagram that illustrates an example of a configuration of as memory cell according to another modification example of the second embodiment.

FIG. 47 is a circuit diagram that illustrates an example of a configuration of a memory cell array including the memory cell illustrated in FIG. 46.

FIG. 48 is a layout diagram that illustrates an example of a configuration of the memory cell illustrated in FIG. 46.

FIG. 49 is a circuit diagram that illustrates another example of a configuration of a memory cell array including the memory cell illustrated in FIG. 46.

FIG. 50 is a circuit diagram that illustrates an example of a configuration of a memory cell according to another modification example of the second embodiment.

FIG. 51 is a circuit diagram that illustrates an example of a configuration of a memory cell array including the memory cell illustrated in FIG. 50.

FIG. 52 is a circuit diagram that illustrates an example of a configuration of a memory cell according to another modification example of the second embodiment.

FIG. 53 is a circuit diagram that illustrates an example of a configuration of a memory cell array including the memory cell illustrated in FIG. 52.

FIG. 54 is a circuit diagram that illustrates an example of a configuration of a memory cell according to another modification example of the second embodiment.

FIG. 55A is a circuit diagram that illustrates an example of an operation of the memory cell illustrated in FIG. 54.

FIG. 55B is another circuit diagram that illustrates an example of an operation of the memory cell illustrated in FIG. 54.

FIG. 56A is another circuit diagram that illustrates an example of an operation of the memory cell illustrated in FIG. 54.

FIG. 56B is another circuit diagram that illustrates an example of an operation of the memory cell illustrated in FIG. 54.

FIG. 57 is a circuit diagram that illustrates an example of a configuration of a memory cell according to another modification example of the second embodiment.

FIG. 58 is a circuit diagram that illustrates an example of a configuration of a flip-flop circuit to which the technique according to the second embodiment is applied.

FIG. 59 is a circuit diagram that illustrates another example of a configuration of a flip-flop circuit to which the technique according to the second embodiment is applied.

FIG. 60 is a circuit diagram that illustrates another example of a configuration of a flip-flop circuit to which the technique according to the second embodiment is applied.

FIG. 61 is a circuit diagram that illustrates another example of a configuration of a flip-flop circuit to which the technique according to the second embodiment is applied.

FIG. 62 is a block diagram that illustrates an example of a configuration of an information processor to which the technique according to the embodiment is applied.

FIG. 63 is a block diagram that illustrates another example of a configuration of an information processor to which the technique according to the embodiment is applied.

FIG. 64 describes coupling of a storage element.

MODES FOR CARRYING OUT THE INVENTION

In the following, some embodiments of the disclosure are described in detail with reference to the drawings. It is to be noted that the descriptions are given in the following order:
1. First Embodiment (Configurations using two storage elements)
2. Second Embodiment (Configurations using one storage element)
3. Application Example

1. First Embodiment

[Configuration Example]

FIG. 1 illustrates an example of a configuration of a semiconductor circuit (semiconductor circuit 1) according to a first embodiment. The semiconductor circuit 1 is a circuit that stores information. The semiconductor circuit 1 includes a controller 11, a power supply transistor 12, and a memory circuit 20.

The controller 11 controls the operation of the memory circuit 20. Specifically, the controller 11 writes information to the memory circuit 20 on the basis of a write command and write data that are supplied from outside, and reads out information from the memory circuit 20 on the basis of a read command supplied from outside. In addition, the controller 11 also has a function to control power supply to the memory circuit 20 by supplying a power control signal SPG to the power supply transistor 12 and turning on and off the power supply transistor 12.

In this example, the power supply transistor 12 is a p-type metal oxide semiconductor (MOS) transistor, having a gate supplied with the power control signal SPG, a source supplied with a power voltage VDD1, and a drain coupled to the memory circuit 20.

With this configuration, in the case of using the memory circuit 20, the semiconductor circuit 1 turns on the power supply transistor 12 and supplies the power voltage VDD1 to the memory circuit 20 as a power voltage VDD. In addition, in the case of not using the memory circuit 20, the semiconductor circuit 1 turns off the power supply transistor 12. The semiconductor circuit 1 makes it possible to reduce power consumption by so-called power gating described above.

The memory circuit 20 stores data. The memory circuit 20 includes a memory cell array 21 and drivers 22 and 23.

The memory cell array 21 includes memory cells 30 arranged in a matrix.

FIG. 2 illustrates an example of a configuration of each memory cell 30. FIG. 3 illustrates an example of a configuration of the memory cell array 21. In addition to the memory cell array 21, FIG. 3 also illustrates the drivers 22 and 23. The memory cell array 21 includes a plurality of word lines WL, a plurality of bit lines BL, a plurality of bit lines BLB, a plurality of control lines CTRL, a plurality of store control lines STRL, a plurality of store control lines STRLB, and a plurality of restore control lines RSTL. The word lines WL extend horizontally in FIGS. 2 and 3. Each word line WL has one end coupled to the driver 22, and the driver 22 applies a signal SWL to the word line WL. The bit lines BL extend vertically in FIGS. 2 and 3. Each bit line BL has one end coupled to the driver 23. The bit lines BLB extend vertically in FIGS. 2 and 3. Each bit line BLB has one end coupled to the driver 23. The control lines CTRL extend horizontally in FIGS. 2 and 3. Each control line CTRL has one end coupled to the driver 22, and the driver 22 applies a signal SCTRL to the control line CTRL. The store control lines STRL extend horizontally in FIGS. 2 and 3. Each store control line STRL has one end coupled to the driver 22, and the driver 22 applies a signal SSTRL to the store control line STRL. The store control lines STRLB extend horizontally in FIGS. 2 and 3. Each store control line STRLB has one end coupled to the driver 22, and the driver 22 applies a signal SSTRLB to the store control line STRLB. The restore control lines RSTL extend horizontally in FIGS. 2 and 3. Each restore control line RSTL has one end coupled to the driver 22, and the driver 22 applies a signal SRSTL to the restore control line RSTL.

The memory cell 30 includes a static random access memory (SRAM) circuit 40, transistors 31, 32, and 81 to 88, and storage elements 33 and 34.

The SRAM circuit 40 stores one bit of information by positive feedback. The SRAM 40 includes transistors 41 to 46. The transistors 41 and 43 are p-type MOS transistors, and the transistors 42, 44, 45, and 46 are n-type MOS transistors.

The transistor 41 has a gate coupled to a node N1, a source supplied with the power voltage VDD, and a drain coupled to a node N2. The transistor 42 has a gate coupled to the node N1, a source grounded, and a drain coupled to the node N2. The transistors 41 and 42 are included m an inverter IV1. The inverter IV1 inverts a voltage VN1 at the node N1 and outputs a result of the inversion to the node N2. The transistor 43 has a gate coupled to the node N2, a source supplied with the power voltage VDD, and a drain coupled to the node N1. The transistor 44 has a gate coupled to the node N2, a source grounded, and a drain coupled to the node N1. The transistors 43 and 44 are included in an inverter IV2. The inverter IV2 inverts a voltage VN2 at the node N2 and outputs a result of the inversion to the node N1. The transistor 45 has a gate coupled to the word line WL, a source coupled to the bit line BL, and a drain coupled to the node N1. The transistor 46 has a gate coupled to the word line WL, a source coupled to the bit line BLB, and a drain coupled to the node N2.

With this configuration, an input terminal of the inverter IV1 and an output terminal of the inverter IV2 are coupled to each other via the node N1, and an input terminal of the inverter IV2 and an output terminal of the inverter IV1 are coupled to each other via the node N2. This causes the SRAM circuit 40 to store one bit of information by positive feedback. Then, the transistors 45 and 46 turn on, thereby causing information to be written to the SRAM circuit 40 or causing information to be read out from tire SRAM circuit 40 via the bit lines BL and BLB.

The transistors 31 and 32 are n-type MOS transistors. The transistor 31 has a gate coupled to the restore control line RSTL, a drain coupled to the node N1, and a source coupled to the drain of each of the transistors 86 and 87 and to one end of the storage element 33. The transistor 32 has a gate coupled to the restore control line RSTL, a drain coupled to the node N2, and a source coupled to the drain of each of the transistors 82 and 83 and to one end of the storage element 34. It is to be noted that in this example, n-type MOS transistors are used as the transistors 31 and 32, but this is not limitative. Alternatively, for example, p-type MOS transistors may be used. In this case, for example, it is desirable to change a polarity of the signal SRSTL or the like.

The transistors 81 and 82 are p-type MOS transistors, and the transistors 83 and 84 are n-type MOS transistors. The transistor 81 has a gate coupled to the store control line STRLB, a source supplied with the power voltage VDD, and a drain coupled to the source of the transistor 82. The transistor 82 has a gate coupled to the node N1, a source coupled to the dram of the transistor 81, and a drain coupled to the drain of the transistor 83, to the source of the transistor 32, and to one end of the storage element 34. The transistor 83 has a gate coupled to the node N1, a dram coupled to the drain of the transistor 82, to the source of the transistor 32, and to one end of the storage element 34, mid a source coupled to the drain of the transistor 84. The transistor 84 has a gate coupled to the store control line STRL, a drain coupled to the source of the transistor 83, and a source grounded.

The transistors 85 and 86 are p-type MOS transistors, and the transistors 87 and 88 are n-type MOS transistors. The transistor 85 has a gate coupled to the store control line STRLB, a source supplied with the power voltage VDD, and a drain coupled to live source of the transistor 86. The transistor 86 has a gate coupled to the node N2, a source coupled to the drain of the transistor 85, and a drain coupled to the drain of the transistor 87, to the source of the transistor 31, and to one end of the storage element 33. The transistor 87 has a gate coupled to the node N2, a drain coupled to the drain of the transistor 86, to the source of the transistor 31, and to one end of the storage element 33, and a source coupled to the drain of the transistor 88. The transistor 88 has a gate coupled to the store control line STRL, a drain coupled to the source of the transistor 87, and a source grounded.

Each of the storage elements 33 and 34 is a nonvolatile storage element, and in this example is a spin-transfer torque (STT; Spin Transfer Torque) magnetic tunnel junction (MTJ; Magnetic Tunnel Junction) element that stores information by changing a magnetization direction of a free layer F (described later) by spin injection. The storage element 33 has one end coupled to the source of the transistor 31 and the drain of each of the transistors 86 and 87, while having another end coupled to the control line CTRL. The storage element 34 has one end coupled to the source of the transistor 32 and the drain of each of the transistors 82 and 83, while having another end coupled to the control line CTRL.

Next, the storage element 33 is described in detail. It is to be noted that the same applies to the storage element 34. The storage element 33 includes a pinned layer P, a tunnel barrier layer I, and the free layer F. In this example, the pinned layer P is coupled to the source of the transistor 31 and the drain of each of the transistors 86 and 87, and the free layer F is coupled to the control line CTRL. In this example, the storage element 33 has a so-called bottom-pin structure in which the pinned layer P, the tunnel barrier layer I, and the free layer F are stacked in this order from a lower-layer side of the semiconductor circuit I.

The pinned layer P includes a ferromagnetic substance having a magnetization direction fixed to, for example, a direction vertical to the film surface. The free layer F includes a ferromagnetic substance having a magnetization direction changing, for example, in a direction vertical to the film surface in accordance with a spin polarized current that flows in. The tunnel barrier layer I functions to cleave a magnetic bond between the pinned layer P and the free layer F, while permitting a tunneling current to flow.

With this configuration, in the storage element 33, for example when causing a current to flow from the free layer F to the pinned layer P, polarized electrons having a moment (spin) in the same direction as the magnetization of the pinned layer P are injected from the pinned layer P into the free layer F, thus causing the magnetization direction of the free layer F to be the same direction (parallel state) as the magnetization direction of the pinned layer P. In such a parallel state, the storage element 33 has a lower resistance value between both ends (low resistance state RL).

In addition, for example, when causing a current to flow from the pinned layer P to the free layer F, electrons are injected from the free layer F into the pinned layer P. At the time, of the injected electrons, polarized electrons having a moment in the same direction as the magnetization of the pinned layer P are transmitted through the pinned layer P, while polarized electrons having a moment in a direction opposite to the magnetization of the pinned layer P are reflected by the pinned layer P to be injected into the free layer F. This causes the magnetization direction of the free layer F to be opposite (antiparallel state) to the magnetization direction of the pinned layer P. In such an antiparallel state, the storage element 33 has a higher resistance value between both ends (high resistance state RH).

Thus, in the storage elements 33 and 34, as a result of the magnetization direction of the free layer F changing in accordance with the direction in which the current flows, the resistance state changes between the high resistance state RH and the low resistance state RL. Selling the resistance state as described above allows the storage elements 33 and 34 to store information.

Thus, the memory cell 30 includes, in addition to the SRAM circuit 40, the transistors 31, 32, and 81 to 88 and the storage elements 33 and 34. In the case of performing a standby operation by turning off the power supply transistor 12, for example, this makes it possible for the storage elements 33 and 34 that are nonvolatile memory to store, by performing a store operation immediately before the standby operation, the information stored in the SRAM circuit 40 that is volatile memory. Then, it is possible for the semiconductor circuit I to cause the SRAM circuit 40 to store, by performing a restore operation immediately after the standby operation, the information stored in the storage elements 33 and 34. This allows the semiconductor circuit I to return, in a short time after the power supply is resumed, the state of each memory cell 30 to the state before the power supply is suspended.

The driver 22, on the basis of a control signal supplied from the controller 11, applies the signal SWL to the word line WL, applies the signal SCTRL to the control line CTRL, applies the signal SSTRL to the store control line STRL, applies the signal SSTRLB to the store control line STRLB, and applies the signal SRSTL to the restore control line RSTL.

As illustrated in FIG. 3, the driver 22 includes transistors 24 and 25. The transistor 24 is a p-type MOS transistor, having a gate supplied with a signal SCTRLB, a source supplied with the power voltage VDD, and a drain coupled to the control line CTRL. The transistor 25 is an n-type MOS transistor, baying a gate supplied with the signal SCTRLB, a drain coupled to the control line CTRL, and a source grounded. The transistors 24 and 25 are included in an inverter, and the driver 22 drives the control line CTRL, using this inverter.

The driver 23, via the bit lines BL and BLB, writes information to the memory cell array 21 or reads out information from the memory cell array 21. Specifically, on the basis of the control signal and the data that are supplied from the controller 11, the driver 23 writes information to the memory cell array 21 via the bit lines BL and BLB. In addition, on the basis of the control signal supplied from the controller 11, the driver 23 reads out information from the memory cell array 21 via the bit lines RL and BLB, and supplies the read information to the controller 11.

Here, the inverter IV1 corresponds to a specific example of a "first circuit" in the disclosure. The inverter IV2 corresponds to a specific example of a "second circuit" in the disclosure. The transistor 31 corresponds to a specific example of a "first transistor" in the disclosure. The storage element 33 corresponds to a specific example of a "first storage element" in the disclosure. The transistor 32 corresponds to a specific example of a "sixteenth transistor" in the disclosure. The storage element 34 corresponds to a specific example of a "third storage element" in the disclosure.

The transistors 86 and 87 correspond to a specific example of a "first voltage setting circuit" in the disclosure. The transistor 86 corresponds to a specific example of a "second transistor" in the disclosure. The transistor 87 corresponds to a specific example of a "third transistor" in the disclosure. The transistor 85 corresponds to a specific example of a "fourth transistor" in the disclosure. The transistor 88 corresponds to a specific example of a "fifth transistor" in the disclosure.

The transistors 82 and 83 correspond to a specific example of a "third voltage setting circuit" in the disclosure. The transistor 82 corresponds to a specific example of a "seventeenth transistor" in the disclosure. The transistor 83 corresponds to a specific example of an "eighteenth transistor" in the disclosure. The transistor 81 corresponds to a specific example of a "nineteenth transistor" in the disclosure. The transistor 84 corresponds to a specific example of a "twentieth transistor" in the disclosure.

[Workings and Effects]

The workings and effects of the semiconductor circuit 1 according to the present embodiment are subsequently described.

(Overview of Overall Operation)

First, with reference to FIGS. 1 to 3, an overview of the overall operation of the semiconductor circuit 1 is described. The controller 11 controls the operation of the memory circuit 20. Specifically, the controller 11 writes information to the memory circuit 20 on the basis of a write command and write data that are supplied from outside, and reads out information from the memory circuit 20 on the basis of a read command supplied from outside. In addition, the controller 11 controls power supply to the memory circuit 20 by supplying the power control signal SPG to the power supply transistor 12 and turning on and off the power supply transistor 12. The power supply transistor 12 performs on-off operation on the basis of the control signal supplied from the controller 11. Then, as a result of the power supply transistor 12 turning on, the power voltage VDD1 is supplied to the memory circuit 20 as the power voltage VDD. On the basis of the control signal supplied from the controller 11, the driver 22 in the memory circuit 20 applies the signal SWL to the word line WL, applies the signal SCTRL to the control line CTRL, applies the signal SSTRL to the store control line STRL, applies the signal SSTRLB to the store control line STRLB, and applies the signal SRSTL to the restore control line RSTL. On the basis of the control signal and the data that are supplied from the controller 11, the driver 23 writes information to the memory cell array 21 via the bit lines BL and BLB. In addition, the driver 23, on the basis of the control signal supplied from the controller 11, reads out information from the memory cell array 21 via the bit lines BL and BLB, and supplies the read information to the controller 11.

(Detailed Operation)

In a normal, operation OP1, the semiconductor circuit 1 causes the SRAM circuit 40 that is volatile memory to store information. For example, in the case of performing a standby operation OP3 by turning off the power supply transistor 12, the semiconductor circuit 1 performs a store operation OP2 immediately before the standby operation OP3, thereby causing the storage elements 33 and 34 that are nonvolatile memory to store the information stored in the SRAM circuit 40 that, is volatile memory. Then, the semiconductor circuit 1 performs a restore operation OP4 immediately after the standby operation OP3, to cause the SRAM circuit 40 to store the information stored in the storage elements 33 and 34 in the following, this operation is described in detail.

FIG. 4 illustrates an example of an operation of a specific memory cell 30 in the semiconductor circuit 1. FIGS. 5A to 5E each illustrate a state of operation of the memory cell 30. FIG. 5A illustrates a state in the normal operation OP1, FIGS. 5B and 5C, each illustrate a state in the store operation OP2, FIG. 5D illustrates a state in the standby operation OP3, and FIG. 5E illustrates a state in the restore operation OP4. FIGS. 5A to 5E also illustrate the transistors 24 and 25 in the driver 22 in addition, FIGS. 5A to 5E illustrate the inverters IV1 and IV2 using symbols, and illustrate each of the transistors 24, 25, 31, 32, 81, 84, 85, and 88 using a switch corresponding to the state of operation of each transistor.

(Normal Operation OP1)

The semiconductor circuit 1, by performing the normal operation OP1, writes information to the SRAM circuit 40 that is volatile memory, or reads out information from the SRAM circuit 40.

In the normal operation OP1, as illustrated in FIG. 4, the controller 11 sets the voltage of the power control signal SPG to low level. This turns on the power supply transistor 12 (FIG. 1), and the power voltage VDD is supplied to the memory circuit 20. Then, as illustrated in FIG. 4, the driver 22 sets the voltage of the signal SRSTL to low level. This turns off each of the transistors 31 and 32 as illustrated in FIG. 5A. In other words, the SRAM circuit 40 is electrically separated from the storage elements 33 and 34. In addition, as illustrated in FIG. 4, the driver 22 sets the voltage of the signal SSTRL to low level, and sets the voltage of the signal SSTRLB to high level. This turns off each of the transistors 81, 84, 85, and 88 as illustrated in FIG. 5A. In addition, as illustrated in FIG. 4, the driver 22 sets the voltage of the signal SCTRL to a low-level voltage VL (ground level). Specifically, as illustrated in FIG. 5A, the driver 22 sets the voltage of the signal SCTRLB (FIG. 3) to high level, thereby turning off the transistor 24 and turning on the transistor 25. As a result, the voltage of the signal SCTRL becomes the low-level voltage VL.

In this normal operation OP1, information is written to the SRAM circuit 40 in the memory cell 30, or information is read out from the SRAM circuit 40. Specifically, in the case of writing information to the SRAM circuit 40, first, the driver 23 applies to the bit lines BL and BLB, a signal corresponding to the information to be written and having voltage levels inverted from each other. Then, the driver 22 sets the voltage of the signal SWL to high level, thereby turning on the transistors 45 and 46 in the SRAM circuit 40. This causes the information corresponding to the voltage at each of the bit lines BL and BLB to be written to the SRAM circuit 40. In addition, in live case of reading out information from the SRAM circuit 40, for example, the driver 23 precharges each of the bit lines BL and BLB to a high-level voltage, and subsequently the driver 22 sets the voltage of the signal SWL to high level, thereby turning on the transistors 45 and 46. This causes the voltage at one of the bit lines BL or BLB to change in accordance with the information stored in the SRAM circuit 40. Then, the driver 23, by detecting a voltage difference between the bit lines BL and BLB, reads out the information stored in the SRAM circuit 40.

At this time, as illustrated in FIG. 5A, the transistors 31, 32, 81, 84, 85, and 88 are off. Thus, no current flows in the storage elements 33 and 34, and the resistance states of the storage elements 33 and 34 are maintained. In this example, the resistance state of the storage element 33 is maintained at the low resistance state RL, while the resistance state of the storage element 34 is maintained at the high resistance state RH.

(Store Operation OP2)

Next, the store operation OP2 is described. The semiconductor circuit 1, by performing the store operation OP2 before performing the standby operation OP3, causes the storage elements 33 and 34 to store the information that is stored in the SRAM circuit 40.

In the store operation OP2, as illustrated in FIG. 4, the driver 22 sets the voltage of the signal SSTRL to high level, and sets the voltage of the signal SSTRLB to low level. This turns on each of the transistors 81, 84, 85, and 88 as illustrated in FIGS. 5B and 5C. In addition, as illustrated in FIG. 4, the driver 22 sets the voltage of the signal SWL to low level. This turns of the transistors 45 and 46.

In this store operation OP2, using two steps, each memory cell 30 causes the storage elements 33 and 34 to store the information that is stored in the SRAM circuit 40. First, in a first step, as illustrated in FIG. 4, the driver 22 sets the voltage of the signal SCTRL to the low-level voltage VL (ground level), and in a second step sets the voltage of the signal SCTRL to the high-level voltage VH (power voltage level). In this manner, the resistance state of the storage elements 33 and 34 is set in accordance with the information stored in the SRAM circuit 40.

Specifically, in the first step, the driver 22 sets the voltage of the signal SCTRLB (FIG. 3) to high level, thereby turning off the transistor 24 and turning on the transistor 25 as illustrated in FIG. 5B. As a result, the voltage of the signal SCTRL becomes the low-level voltage VL. This causes a store current Istr1 to flow in one of the storage element 33 or 34.

In this example, the voltage VN1 at the node N1 is the high-level voltage VH, and the voltage VN2 at the node N2 is the low-level voltage VL, which turns on the transistors 83 and 86 and turns off the transistors 82 and 87. Thus, in the memory cell 30, as illustrated in FIG. 5B, the store current Istr1 flows in order from the transistor 85 to the transistor 86, to the storage element 33, and to the transistor 25. At this time, in the storage element 33, the store current Istr1 flows from the pinned layer P to the free layer F, thus causing the magnetization direction of the free layer F to be opposite (antiparallel state) to the magnetization direction of the pinned layer P. As a result, the resistance state of the storage element 33 becomes the high resistance state RH.

Next, in the second step, the driver 22 sets the voltage of the signal SCTRLB (FIG. 3) to low level, thereby turning on the transistor 24 and turning off the transistor 25 as illustrated in FIG. 5C. As a result, the voltage of the signal SCTRL becomes the high-level voltage VH. This causes a store current Istr2 to flow in one of the storage element 33 or 34 that is not the storage element in which the current flows in the first step.

In this example, the transistors 83 and 86 are on, and the transistors 82 and 87 are off. As illustrated in FIG. 5C, this causes the store current Istr2 to flow in order from the transistor 24 to the storage element 34, to the transistor 83, and to the transistor 84. At this time, in the storage element 34, the store current Istr2 flows from the free layer F to the pinned layer P, thus causing the magnetization direction of the free layer F to be the same direction (parallel state) as the magnetization direction of the pinned layer P. As a result, the resistance state of the storage element 34 becomes the low resistance state RL.

It is to be noted that in this example, the voltage of the signal SCTRLB is set to high level in the first step, and the voltage of the signal SCTRLB is set to low level in the second step, but this is not limitative. Alternatively, for example, the voltage of the signal SCTRLB may be set to low level in the first step, and the voltage of the signal SCTRLB may be set to high level in the second step In this manner, the store current flows in the storage element 33 in one of the first or the second step, and the store current flows in the storage element 34 in the other of the first and the second steps. As a result, in the memory cell 30, the resistance state of each of the storage elements 33 and 34 is set in accordance with the information stored in the SRAM circuit 40.

It is to be noted that in this example, as illustrated in FIG. 2, the control line CTRL, the store control lines STRL and STRLB, and the restore control line RSTL extend in a row direction (horizontal direction in FIG. 2), and therefore the store operation OP2 is performed in units of rows. For example, it is possible to set, by using the signals SSTRL and SSTRLB, a row that performs the store operation OP2 and a row that docs not perform the store operation OP2. Specifically, for the row that performs the store operation OP2, as illustrated in FIG. 4, the driver 22 sets the voltage of the signal SSTRL to high level, and sets the voltage of the signal SSTRLB to low level. In addition, for the row that does not perform the store operation OP2, as illustrated in FIG. 6, the driver 22 sets the voltage of the signal SSTRL to low level, and sets the voltage of the signal SSTRLB to high level. In addition, in this example, for both of the row that performs the store operation OP2 and the row that does not perform the store operation OP2, as illustrated in FIGS. 4 and 6, the driver 22 sets the signal SCTRL to the low level voltage VL in the first step, and sets the signal SCTRL to the high-level voltage VH in the second step, but this is not limitative. For the row that does not perform the store operation OP2, the signal SCTRL may be maintained at the low-level voltage VL.

(Standby Operation OP3)

Then, after the store operation OP2, the semiconductor circuit 1 performs the standby operation OP3 by turning off the power supply transistor 12.

In the standby operation OP3, as illustrated in FIG. 4, the controller 11 sets the voltage of the power control signal SPG to high level. This turns off the power supply transistor 12 (FIG. 1), to suspend the power supply to the memory circuit 20. This causes the voltage of each of tire signals SSTRL, SSTRLB, SCTRL and SRSTL to be low level. At this time, as illustrated in FIG. 5D, the resistance slates of the storage elements 33 and 34 are maintained.

(Restore Operation OP4)

Next, the restore operation OP4 is described. In the case of performing the normal operation OP1 after the standby operation OP3, the semiconductor circuit 1 performs the restore operation OP4, to cause the SRAM circuit 40 to store the information that is stored in the storage elements 33 and 34.

In the restore operation OP4, as illustrated in FIG. 4, the controller 11 sets the voltage of the power control signal SPG to low level. This turns on the power supply transistor 12 (FIG. 1), and the power voltage VDD is supplied to the memory circuit 20. Then, the driver 22 sets the voltage of the signal SRSTL to high level only for a period of a predetermined length immediately after the power supply transistor 12 turns on. As illustrated in FIG. 5E, during this period, this turns on each of the transistors 31 and 32. In other words, tire SRAM circuit 40 is electrically coupled to the storage elements 33 and 34 during this period. In addition, as illustrated in FIG. 4, the driver 22 sets the voltage of the signal SSTRL to low level, and sets the voltage of the signal SSTRLB to high level. As illustrated in FIG. 5E, this turns off each of the transistors 81, 84, 85, and 88. In addition, as illustrated in FIG. 4, the driver 22 sets the voltage of the signal SCTRL to the low-level voltage VL (ground level). This causes the node N1 to be grounded via the storage element 33, and causes the node N2 to be grounded via the storage element 34. At this time, since the resistance states of the storage elements 33 and 34 are different from each other, the voltage state at the SRAM circuit 40 is determined in accordance with the resistance state of each of the storage elements 33 and 34.

In this example, the resistance state of the storage element 33 is the high resistance state RH, and the resistance state of the storage element 34 is the low resistance state RL. Thus, the node N1 is pulled down by a high resistance value, and the node N2 is pulled down by a low resistance value, thus causing the voltage VN1 at the node N1 to be the high-level voltage VH and causing the voltage VN2 at the node N2 to be the low-level voltage VL. In this manner, in the memory cell 30, the SRAM circuit 40 stores information in accordance with the information stored in the storage elements 33 and 34.

It is to be noted that in this example, the voltage of the signal SRSTL is set to high level only for a period of a predetermined length immediately after the power supply transistor 12 turns on, but this is not limitative. Alternatively, for example, the voltage of the signal SRSTL may be set to high level in advance before the power supply transistor 12 turns on.

For example, the restore operation OP4 is simultaneously performed by all the memory cells 30 in the memory cell array 21. It is to be noted that this is not limitative, and some of the memory cells 30 in the memory cell array 21 may perform the restore operation OP4 with other memory cells 30 cot performing the restore operation OP4. In this case, as illustrated in FIG. 4, the driver 22 sets the signal SRSTL to high level for a predetermined period for the row that performs the restore operation OP4, and maintains the signal SRSTL at low level for the row that does not perform the restore operation OP4.

Thereafter, the semiconductor circuit 1 performs the normal operation OP1 (FIG. 5A). Then, subsequently, the semiconductor circuit 1 repeats the store operation OP2, the standby operation OP3, the restore operation OP4, and the normal operation OP1 in this order.

In this manner, the semiconductor circuit 1 performs the store operation OP2 immediately before the standby operation OP3, thereby causing the storage elements 33 and 34 that are nonvolatile memory to store the information stored in the SRAM circuit 40 that is volatile memory. Then, the semiconductor circuit 1 performs the restore operation OP4 immediately after the standby operation OP3, thereby causing the SRAM circuit 40 to store the information that is stored in the storage elements 33 and 34. This allows the semiconductor circuit 1 to return, in a short time after the power supply is resumed, the state of each memory cell 30 to the state before the power supply is suspended.

In addition, the semiconductor circuit 1 includes the transistors 81 to 88, and when performing the store operation OP2, as illustrated in FIGS. 5B and 5C, the store currents Istr1 and Istr2 are caused to flow in the circuit including these transistors 81 to 88. In other words, in the semiconductor circuit 1, the store currents Istr1 and Istr2 are prevented from flowing in the SRAM circuit 40. This allows the semiconductor circuit 1 to reduce the possibility of causing so-called disturb as compared to the case of a comparative example described below.

(Comparative Example)

Next, the workings of the present embodiment are described in comparison with a semiconductor circuit 1R according to the comparative example. As with the semiconductor circuit 1 (FIG. 1) according to the present embodiment, the semiconductor circuit 1R includes a memory circuit 20R. The memory circuit 20R includes a memory cell array 21R, a driver 22R, and a driver 23R.

FIG. 7 illustrates an example of a configuration of a memory cell 30R in the memory cell array 21R. The memory cell 30R includes the SRAM circuit 40, the transistors 31 and 32, and the storage elements 33 and 34. In other words, the memory cell 30R omits the transistors 81 to 88 from the memory cell 30 (FIG. 2) according to the present embodiment.

In the normal operation OP1, the semiconductor circuit 1R causes the SRAM circuit 40 that is volatile memory to store information. Then, the semiconductor circuit 1R performs the store operation OP2 immediately before the standby operation OP3, thereby causing the storage elements 33 and 34 that are nonvolatile memory to store the information stored in the SRAM circuit 40 that is volatile memory. Then, the semiconductor circuit 1R performs the restore operation OP4 immediately after the standby operation OP3, thereby causing the storage elements 33 and 34 to perform storage.

FIG. 8 illustrates an example of an operation of a specific memory cell 30R in the semiconductor circuit 1R. FIGS. 9A and 9B each illustrate the state of operation of the memory cell 30R in the store operation OP2. As illustrated in FIG. 8, in the store operation OP2, the driver 22R sets the voltage of the signal SRSTL to high level. As illustrated in FIGS. 9A and 9B, this turns on the transistors 31 and 32.

In the semiconductor circuit 1R according to the comparative example, using two steps, each memory cell 30R also causes the storage elements 33 and 34 to store the information that is stored in the SRAM circuit 40. First, in the first step, as illustrated in FIG. 8, the driver 22R sets the voltage of the signal SCTRL to the low-level voltage VL (ground level). In this example, since the voltage VN1 at the node N1 is the high-level voltage VH, as illustrated in FIG. 9A, the store current Istr1 flows in order from the transistor 43 in the inverter IV2 to the transistor 31, to the storage element 33, and to the transistor 25. At this time, in the storage element 33, the store current Istr1 flows from the pinned layer P to the free layer F, thus causing the resistance state of the storage element 33 to be the high resistance state RH. Next, in the second step, as illustrated in FIG. 8, the driver 22R sets the voltage of the signal SCTRL to the high-level voltage VH (power voltage level). In this example, since the voltage VN2 at the node N2 is the low-level voltage VL, as illustrated in FIG. 9B, the store current Istr2 flows in order from the transistor 24 to the storage element 34, to the transistor 32, and to the transistor 42 in the inverter IV1. At this time, in the storage element 34, the store current Istr2 flows from the free layer F to the pinned layer P, thus causing the resistance state of the storage element 34 to be the low resistance state RL.

Thus, in the semiconductor circuit 1R according to the comparative example, the store current Istr1 flows from the transistor 43 in the inverter IV2 in the first step, and the store current Istr2 flows to the transistor 42 in the inverter IV1 in the second step. Therefore, in a case where the store currents Istr1 and Istr2 have a large current value, there is a possibility of losing the information stored in the SRAM circuit 40 and causing so-called disturb. In addition, in the case of increasing the size of each transistor in the SRAM circuit 40 to avoid this, this results in an increase in the area of the semiconductor circuit 1R.

Meanwhile the semiconductor circuit 1 according to the present embodiment includes the transistors 81 to 88, and when performing the store operation OP2, as illustrated in FIGS. 5B and 50, the store currents Istr1 and Istr2 are caused to flow in the circuit including these transistors 81 and 88. In the semiconductor circuit 1, this prevents the store currents Istr1 and Istr2 from flowing in the SRAM circuit 40, thus making it possible to reduce the possibility of causing disturb.

Particularly, in the semiconductor circuit 1, the drain of each of the transistors 82 and 83 is coupled to one end of the storage element 34, and the drain of each of the transistors 86 and 87 is coupled to one end of the storage element 33 (drain coupling A). In other words, in the store operation OP2, the transistors 82 and 83 function as an inverter to drive the storage element 34, and the transistors 86 and 87 function as an inverter to drive the storage element 33. In the semiconductor circuit 1, when performing the store operation OP2, this makes it possible to secure a sufficient current value for the store currents Istr1 and Istr2. In other words, for example, in the case of a configuration in which the source of the transistor is coupled to one end of the storage element to cause the store current to flow in the store operation OP2 by a so-called source follower, there is a possibility of resulting in the store current having a smaller current value due to the negative feedback operation of the source follower. Whereas, in the semiconductor circuit 1, the drain of each transistor is coupled to one end of the storage element, thus preventing the occurrence of such a negative feedback and therefore making it possible to secure a sufficient current value for the store currents Istr1 and Istr2. In addition, since it is thus possible to secure a sufficient current value for the store currents Istr1 and Istr2, it is possible to reduce the size of the transistors 82, 83, 86, and 87, for example. As a result, this makes it possible to reduce the area of the memory cell 30, thus allowing for a reduction in the area of the semiconductor circuit 1.

It is to be noted that in this example, for example, the drain of each of the transistors 82 and 83 is coupled to the pinned layer P of the storage element 34, and the drain of each of the transistors 86 and 87 is coupled to the pinned layer P of the storage element 33. However, as with a memory cell 30H (FIG. 30) to be described later, even in a case where the drain of each of the transistors 82 and 83 is coupled to the free layer F of the storage element 34 and the drain of each of the transistors 86 and 87 is coupled to the free layer F of the storage element 33, this likewise makes it possible to secure a sufficient current value for the store currents Istr1 and Istr2 and allows for a reduction in the area of the semiconductor circuit 1.

In addition, in the semiconductor circuit 1, the drain of the transistor 81 and the drain of the transistor 84 are coupled to the inverter including the transistors 82 and 83, and the drain of the transistor 85 and the drain of the transistor 88 are coupled to the inverter including the transistors 86 and 87. Likewise, this drain coupling makes it possible to secure a sufficient current value for the store currents Istr1 and Istr2 and allows for a reduction in the area of the semiconductor circuit 1.

In addition, in the semiconductor circuit 1, the drains of the transistors 24 and 25 in the driver 22 are coupled to the other end of each of the storage elements 33 and 34 (drain coupling B). In other words, the transistors 24 and 25 function as an inverter to drive the storage elements 33 and 34. In the semiconductor circuit 1, as in the cases of the transistors 82 and 83 and of transistors 86 and 87 as described above, this makes it possible to secure a sufficient value for the store currents Istr1 and Istr2 and allows for a reduction in the area of the semiconductor circuit 1.

It is to be noted that in this example, both of the drain coupling A and the drain coupling B are applied, but this is not limitative. Only the drain coupling A may be performed, or only the drain coupling B may be performed.

(Layout Example)

FIG. 10 illustrates an example of a layout of the memory cell 30 according to the present embodiment. In this example, each of the transistors 41 to 46, 31, and 32 is configured with a transistor having a normal threshold voltage (standard Vth), and each of the transistors 81 to 88 is configured with a translator having a low threshold voltage (low Vth or ultra-low Vth). It is to be noted that in this example, the transistor having an ultra-low Vth is used. Thus configuring the transistors 81 to 88 with transistors having the low threshold voltage makes it possible to realize a sufficient store current with a small area. It is to be noted that this is not limitative, and all the transistors in the memory cell 30 may be configured with transistors having the normal threshold voltage, or may be configured with transistors having the low threshold voltage.

As described above, in the semiconductor circuit 1, the store currents Istr1 and Istr2 do not flow in the SRAM circuit 40. This makes it possible for each of the transistors 41 to 46 in the SRAM circuit 40 to have a size equivalent to the size of the transistors in a general SRAM circuit that are not coupled to the storage elements 33 and 34.

FIG. 64 schematically illustrates an example of coupling of storage elements and transistors. FIG. 64 illustrates some transistors TrN and some storage elements 163. The storage elements 163 correspond to the storage elements 33 and 34. A semiconductor layer 152P is a p-type semiconductor layer provided on the surface of a substrate 151 and is included in a so-called p-well Semiconductor layers 153N and 154N are each an n-type diffusion layer provided on the surface of the semiconductor layer 152P (p-w ell) and are included in the drain and the source of each transistor TrN. On the semiconductor layer 152P between the semiconductor layer 153N and the semiconductor layer 154N, a gate oxide film 156 is provided, and a gate electrode 157 is provided on the gate oxide film 156. The plurality of transistors TrN are separated from each other by an element isolation layer 155.

On the semiconductor layer 153N of the transistor TrN, a contact 161 and a contact 162 are provided in this order. Then, the semiconductor layer 153N is coupled to metal wiring 165 that is so-called a first metal layer (M1) via these contacts 161 and 162. In addition, on the semiconductor layer 154N of the transistor TrN, the contact 161, the storage element 163, and a via 164 are provided in this order. Then, the storage element 163 is coupled to the metal wiring 165 that is the first metal layer (M1) through the via 164. For example, the metal, wiring 165 is coupled to metal wiring 167 that is a second metal layer (M2) through a via 166.

FIG. 11 schematically illustrates an example of coupling of the storage element and the transistor. A semiconductor layer 202P is a p-type semiconductor layer provided on the suttee of a substrate 201 and is included in the so-called p-well. A semiconductor layer 205N is an n-type semiconductor layer provided on the suffice of the substrate 201 and is included in a so-called n-well. Semiconductor layers 204N and 205N are each an n-type diffusion layer provided on the surface of the semiconductor layer 202P (p-well). Semiconductor layers 206P and 207P are each a p-type diffusion layer provided on the surface of the semiconductor layer 205N (n-well). The semiconductor layers 203N, 204N, 206P, and 207P are separated from each other by an element isolation layer 208.

In this example, two contacts 212 (contacts 212A and 2128) are provided on the semiconductor layer 204N. The semiconductor layer 204N is coupled to one end of the storage element 214 (for example, the pinned layer P) via the contact 212A. This storage element 214 corresponds to the storage elements 33 and 34. Then, for example, the other end of the storage element 214 (for example, the free layer F) is coupled to metal wiring 216 that is so-called the first metal layer (M1) through a via 215. In addition, the semiconductor layer 204N is coupled to another element (in this example, the semiconductor layers 206P and 207P) via a contact 212B, a contact 213B, and other metal wiring 216. For example, the metal wiring 216 is coupled to metal wiring 218 that is the second metal layer (M2) through a via 217. The same applies to an upper metal layer (not illustrated) above the second metal layer (M2).

In the example in FIG. 11, the two contacts 212 are provided on the semiconductor layer 204N, but this is not limitative. Alternatively, for example, as illustrated in FIG. 12, a contact 212C having a large area may be provided. This contact 212C is so-called a rectangular-shaped contact (rectangular contact). In this example, on the contact 212C, the storage element 214 and the contact 213B are provided. The semiconductor layer 204N is coupled to one end of the storage element 214 (for example, the pinned layer P) via the contact 212C. Then, for example, the other end of the storage element 214 (for example, the free layer F) is coupled to the metal wiring 216 that is so-called the first metal layer (M1) through the via 215. In addition, the semiconductor layer 204N is coupled to another element (in this example, the semiconductor layers 206P and 207P) via the contact 212C, the contact 213B, and other metal wiring 216.

It is to be noted that in this example, a contact 212D that is so-called the rectangular-shaped contact is also provided on the semiconductor layer 206P, and on this contact 212D, a contact 213D that is so-called the rectangular-shaped contact is provided. Accordingly, in this example, the semiconductor layer 204N is coupled to the semiconductor layer 206P via the contacts 212C and 213B, the metal wiring 216, and the contacts 213D and 212D.

In addition, as illustrated in FIG. 13, a contact 212E that is so-called the rectangular-shaped contact may be provided in a wide area stretching from the semiconductor layer 204N to the semiconductor layer 206P. This also allows the contact 212E to function as wiring to couple a plurality of elements (in this example, the semiconductor layers 204N and 206P).

Thus, the semiconductor circuit 1 includes the semiconductor layer 204N that is the diffusion layer, the contact 212, and the storage element 214 (the storage elements 33 and 34) in this order in other words, the semiconductor circuit 1 includes the storage element 214 (the storage elements 33 and 34) below the first metal layer (M1). This prevents constraints of wiring layout, thus making it possible to increase the degree of freedom in arrangement of the storage elements 33 and 34. As a result, it is possible to reduce the area of the memory cell 30.

FIG. 14 schematically illustrates an example of coupling of a storage element and a plurality of transistors. FIG. 14 illustrates transistors TrN1 to TrN3 and a storage element 264. The storage element 264 corresponds to the storage elements 33 and 34.

The transistors TrN1 to TrN3 are each an n-type MOS transistor. The transistor TrN1 includes semiconductor layers 231N and 232N and a gate electrode 233. The semiconductor layers 231N and 232N are each an n-type semiconductor layer (diffusion layer) and are included in the drain and the source of the transistor TrN1. The transistor TrN2 includes semiconductor layers 241N and 242N and a gate electrode 243. The semiconductor layers 241N and 242N are each an n-type semiconductor layer (diffusion layer) and are included in the drain and the source of the transistor TrN2. The transistor TrN3 includes semiconductor layers 251 and 252 and a gate electrode 253. The semiconductor layers 251N and 252N are each an n-type semiconductor layer (diffusion layer) and are included in the drain and the source of the transistor TrN3.

In this example, on a portion of the semiconductor layer 232N of the transistor TrN1, the storage element 264 is provided via a contact that is not illustrated. In addition, the semiconductor layer 232N of the transistor TrN1 is coupled to a metal wiring 265 that is so-called the first metal layer (M1) via a contact 261. The semiconductor layer 242N of the transistor TrN2 is coupled to the metal wiring 265 via a contact 262. The semiconductor layer 251N of the transistor TrN3 is coupled to the metal wiring 265 via a contact 263.

Such a configuration makes it possible to perform the store operation OP2 and the restore operation OP4 more reliably. In other words, for example, as illustrated in FIG. 15, in the case of providing a semiconductor layer 266N that is an n-type diffusion layer between the semiconductor layer 232W and the semiconductor layer 242N and providing a semiconductor layer 267N that is an n-type diffusion layer between the semiconductor layer 232N and the semiconductor layer 251N, and coupling the semiconductor layers 232N, 242N, and 251N to one another via these semiconductor layers (diffusion layers), there is a possibility of the resistance values of the semiconductor layers 266N and 267N having an influence on the store operation OP2 and the restore operation OP4. Specifically, for example, in the case of causing a current to flow in a path P1 that includes the storage element 264, the semiconductor layer 232N, the semiconductor layer 266N, and the transistor TrN2, there is a possibility of the resistance value of the semiconductor layer 266N having an influence on the resistance value of the path. In addition, in the case of causing a current to flow in a path P2 that includes the storage element 264, the semiconductor layer 232N, the semiconductor layer 267N, and the transistor TrN3, there is a possibility of the resistance value of the semiconductor layer 267N having an influence on the resistance value of the path. Whereas, in the present embodiment, as illustrated in FIG. 14, the semiconductor layers 232N, 242N, and 251N are coupled to each other using the metal wiring 265 that is the first metal layer (M1). This allows for a smaller resistance value for coupling the semiconductor layers 232N, 242N, and 251N, thus making it possible to perform the store operation OP2 and the restore operation OP4 more reliably.

[Effects]

As described above, according to the present embodiment, the transistors 81 to 88 are provided, and when performing the store operation, the store current is caused to flow in the circuit including these transistors. This prevents the store current from flowing in the SRAM circuit, thus making it possible to reduce the possibility of causing disturb.

According to the present embodiment, the drains of the transistors 82 and 83 are coupled to one end of the storage element 34, and the drains of the transistors 86 and 87 are coupled to one end of the storage element 33. This makes it possible to secure a sufficient value for the store current and allows for a reduction in the area of the semiconductor circuit.

According to the present embodiment, the drains of the transistors 24 and 25 are coupled to the other ends of the storage elements 33 and 34. This makes it possible to secure a sufficient value for the store current and allows for a reduction in the area of the semiconductor circuit.

According to the present embodiment, the diffusion layer, the contact, and the storage element are provided in this order, thus making it possible to reduce the area of the memory cell.

[Modification Example 1-1]

In the foregoing embodiment, as illustrated in FIG. 4, the signals SSTRL and SSTRLB are inverted from each other in the store operation OP2, but this is not limitative. Alternatively, for example, as with a semiconductor circuit 1A illustrated in FIG. 16, the signals SSTRL and SSTRLB may be the same in the store operation OP2 In this example, as illustrated in FIG. 16, first, in the first step, a driver 22A in the semiconductor circuit 1A sets the voltages of the signals SSTRL and SSTRLB to low level. As illustrated in FIG. 17A, this turns on the transistors 81 and 85 and turns off the transistors 84 and 88. Also in this case, as in the case of the foregoing embodiment (FIG. 5B), the store current Istr1 flows in order from the transistor 85 to the transistor 86, to the storage element 33, and to the transistor 25, thus causing the resistance state of the storage element 33 to be the high resistance state RH. In addition, in the second step, as illustrated in FIG. 16, the driver 22A sets the voltages of the signals SSTRL and SSTRLB to high level. As illustrated in FIG. 17B, this turns off the transistors 81 and 85 and turns on the transistors 84 and 88. Also in this case, as in the case of the foregoing embodiment (FIG. 5C), the store current Istr2 flows in order from the transistor 24 to the storage element 34, to the transistor 83, and to the transistor 84, thus causing the resistance state of the storage element 34 to be the low resistance state RL.

[Modification Example 1-2]

In the foregoing embodiment, as illustrated in FIG. 2, each memory cell 30 includes the eight transistors 81 to 84, but this is not limitative. In the following, a semiconductor circuit 1B according to the present modification example is described in detail.

FIG. 18 illustrates an example of a configuration of a memory cell 30B in the semiconductor circuit 18. The memory cell 30B includes transistors 35 and 36. In this memory cell 30B, the two transistors 81 and 85 in the memory cell 30 (FIG. 2) according to the foregoing embodiment are replaced with one transistor 35, and the two transistors 84 and 88 in the memory cell 30 are replaced with the one transistor 36. The transistor 35 is a p-type MOS transistor, having a gate coupled to the store control line STRLB, a source supplied with the power voltage VDD, and a drain coupled to the source of each of the transistors 82 and 86. The transistor 36 is n-type MOS transistor, having a gate coupled to the store control line STRL, a drain coupled to the source of each of the transistors 83 and 87, and a source grounded.

Here, the transistor 35 corresponds to a specific example of a "twenty-first transistor" in the disclosure. The transistor 36 corresponds to, a specific example of a "twenty-second transistor" in the disclosure.

FIGS. 19A and 19B each illustrate a state of operation of the memory cell 30B in the store operation OP2. As illustrated in FIG. 4, in the store operation OP2, the driver 22 sets the voltage of the signal SSTRL to high level, and sets the voltage of the signal SSTRLB to low level. This turns on the transistors 35 and 36 as illustrated in FIGS. 19A and 19B.

In the first step of the store operation OP2, as illustrated in FIG. 4, the driver 22 sets the voltage of the signal SCTRL to the low-level voltage YL (ground level). In this example, the voltage VN1 at the node N1 is the high-level voltage VH, and the voltage VN2 at the node N2 is the low-level voltage VL, which turns on the transistors 83 and 86 and turns off the transistors 83 and 87. Thus, in the memory cell 30B, as illustrated in FIG. 19A, the store current Istr1 flows in order from the transistor 35 to the transistor 86, to the storage element 33, and to the transistor 25, thus causing the resistance state of the storage element 33 to be the high resistance state RH.

In addition, in the second step, as illustrated in FIG. 4, the driver 22 sets the voltage of the signal SCTRL to the high level voltage VH (power voltage level). In this example, the transistors 83 and 86 are on, and the transistors 82 and 87 are off. As illustrated in FIG. 19B, this causes the store current Istr2 to flow in order from the transistor 24 to the storage element 34, to the transistor 83, and to the transistor 36, thus causing the resistance state of the storage element 34 to be the low resistance state RL.

The current value of the store current Istr1 (FIG. 19A) flowing in the transistor 35 is almost the same as the current value of the store current Istr1 (FIG. 5B) flowing in one of the transistor 81 or the transistor 85. In other words, it is possible for the transistor 35 to have almost the same size as the transistors 81 and 85. Likewise, the current value of the store current Istr2 (FIG. 19B) flowing in the transistor 36 is almost the same as the current value of the store current Istr2 (FIG. 5C) flowing in one of the transistor 84 or the transistor 88. In other words, it is possible for the transistor 36 to have almost the same size as the transistors 84 and 88. Thus, replacing the two transistors 81 and 85 with the one transistor 35 and replacing the two transistors 84 and 88 with the one transistor 36 makes it possible to reduce the area of the memory cell 30B.

[Modification Example 1-3]

In the foregoing embodiment, as illustrated in FIG. 3, the driver 22 includes an inverter (transistors 24 and 25) that generates the signal SCTRL, but this is not limitative. Alternatively, for example, each memory cell may include an inverter that generates the signal SCTRL. In the following, a semiconductor circuit 1C according to the present modification example is described in detail. The semiconductor circuit 1C includes a memory circuit 20C. The memory circuit 20C includes a memory cell array 21C, a driver 22C, and the driver 23.

FIG. 20 illustrates an example of a configuration of a memory cell 30C in the memory cell array 21C. FIG. 21 illustrates an example of a configuration of the memory cell array 21C. The memory cell array 21C includes a plurality of control lines CTRLB. In other words, the memory cell array 21 according to the foregoing embodiment includes a plurality of control lines CTRL, whereas the memory cell array 21C according to the present modification example includes a plurality of control lines CTRLB in place of a plurality of control lines CTRL. The control lines CTRLB extend horizontally in FIGS. 20 and 21. Each control line CTRLB has one end coupled to the driver 22C, and the driver 22C applies the signal SCTRLB to the control line CTRLB. The signal SCTRLB is an inverted signal of the signal SCTRL according to the foregoing embodiment.

The memory cell 30C includes transistors 37 and 38. The transistor 37 is a p-type MOS transistor, having a gate coupled to the control line CTRLB, a source supplied with the power voltage VDD, and a drain coupled to the drain of the transistor 38 and another end of each of the storage elements 33 and 34. The transistor 38 is an n-type MOS transistor, having a gate coupled to the control line CTRLB, a drain coupled to the drain of the transistor 37 and the other end of each of the storage elements 33 and 34, and a source grounded. These transistors 37 and 38 are included in an inverter. Then, the inverter generates the signal SCTRL on the basis of the signal SCTRLB, and supplies the signal SCTRL to the other ends of the storage elements 33 and 34.

The driver 22C, on the basis of the control signal supplied from the controller 11, applies the signal SWL to the word line WL, applies the signal SCTRLB to the control line CTRLB, applies the signal SSTRL to the store control line STRL, applies the signal SSTRLB to the store control line STRLB, and applies the signal SRSTL to the restore control line RSTL.

Here, the transistor 37 corresponds to a specific example of a "twenty-third transistor" in the disclosure. The transistor 38 corresponds to a specific example of a "twenty-fourth transistor" in the disclosure.

[Modification Example 1-4]

In the foregoing embodiment, as illustrated in FIG. 2, the memory cell 30 includes the transistors 81, 84, 85, and 88, but this is not limitative. Alternatively, for example, the driver 22 may include a transistor that corresponds to these transistors. In the following, a semiconductor circuit 1D according to the present modification example is described in detail. The semiconductor circuit 1D includes a memory circuit 20D. The memory circuit 20D includes a memory cell array 21D, a driver 32D, and the driver 23.

FIG. 22 illustrates an example of a configuration of a memory cell 30D in the memory cell array 21D. FIG. 23 illustrates an example of a configuration of the memory cell array 21D. The memory cell array 21D includes a plurality of store control lines STRL1 and a plurality of store control lines STRLB1. The store control lines STRL1 extend horizontally in FIGS. 22 and 23. Each store control line STRL1 has one end coupled to the driver 22D, and the driver 22D applies a signal SSTRL1 to the store control line STRL1. The store control lines STRLB1 extend horizontally in FIGS. 22 and 23. Each store control line STRLB1 has one end coupled to the driver 22D, and the driver 22D applies a signal SSTRLB1 to the store control line STRLB1.

The memory cell 30C includes transistors 82, 83, 86, and 87. Each of the transistors 82 and 86 has a source coupled to the store control line STRLB1, and each of the transistors 83 and 87 has a source coupled to the store control line STRL1.

The driver 22D, on the basis of the control signal supplied from the controller 11, applies the signal SWL to the word line WL, applies the signal SCTRL to the control line CTRL, applies the signal SSTRL1 to the store control line STRL1, applies the signal SSTRLB1 to the store control line STRLB1, and applies the signal SRSTL to the restore control line RSTL.

As illustrated in FIG. 23, the driver 22D includes transistors 26 and 27. The transistor 26 is a p-type MOS transistor, having a gate supplied with the signal SSTRLB, a source supplied with the power voltage VDD, and a drain coupled to the store control line STRLB1. The transistor 26 corresponds to the transistors 81 and 85 in the memory cell 30 (FIG. 2) according to the foregoing embodiment. The transistor 27 is an n-type MOS transistor, having a gate supplied with the signal SSTRL, a drain coupled to the store control line STRL1, and a source grounded. The transistor 27 corresponds to the transistors 84 and 88 in the memory cell 30 (FIG. 2) according to the foregoing embodiment.

Here, the store control line STRLB1 corresponds to a specific example of a "first control line" in the disclosure. The store control line STRL1 corresponds to a specific example of a "second control line" in the disclosure. The transistor 26 corresponds to a specific example of a "sixth transistor" in the disclosure. The transistor 27 corresponds to a specific example of a "seventh transistor" in the disclosure.

FIG. 24 illustrates an example of a layout of the memory cell 30D according to the present embodiment. In the memory cell 30D as compared to the memory cell 30 (FIGS. 2 and 10) according to the foregoing embodiment, it is thus possible to reduce the number of transistors, thus allowing for a reduction in the area of the memory cell 30D.

In the semiconductor circuit 1D, as illustrated in FIG. 23, each transistor 26 in the driver 22D drives one store control line STRLB1, and each transistor 27 in the driver 22D drives one store control line STRL1, but this is not limitative. Alternatively, for example as with a semiconductor circuit 1E illustrated in FIG. 25, each transistor 26 in the driver 22E may drive a plurality of (in this example, two) store control lines STRLB1, and each transistor 27 in the driver 22E may drive a plurality of (in this example, two) store control lines STRL1.

[Modification Example 1-5]

In the foregoing embodiment, as illustrated in FIGS. 2 and 3, the word line WL, the control line CTRL, the store control lines STRL and STRLB, and the restore control line RSTL are configured to extend horizontally in FIGS. 2 and 3, and the bit lines BL and BLB are configured to extend vertically in FIGS. 2 and 3, but this is not limitative. In the following, as an example, a semiconductor circuit 1F having a configuration in which the store control lines STRL and STRLB extend vertically is described in detail. The semiconductor circuit 1F includes a memory circuit 20F. The memory circuit 20F includes a memory cell array 21F, a driver 22F, and a driver 23F.

FIG. 26 illustrates an example of a configuration of a memory cell 30F in the memory cell array 21F. FIG. 27 illustrates an example of a configuration of the memory cell array 21F. The memory cell array 21F includes a plurality of store control lines STRL2 and a plurality of store control lines STRLB2. The store control lines STRL2 extend vertically in FIGS. 26 and 27. Each store control line STRL2 has one end coupled to the driver 23F, and the driver 23F applies a signal SSTRL2 to the store control line STRL2. The store control lines STRLB2 extend vertically in FIGS. 26 and 27. Each store control line STRLB2 has one end coupled to the driver 23F, and the driver 23F applies a signal SSTRLB2 to the store control line STRLB2.

The memory cell 30F includes the transistors 81, 84, 85, and 88. Each of the transistors 81 and 85 has a gate coupled to the store control line STRLB2, and each of the transistors 84 and 88 has a gate coupled to the store control line STRL2.

The driver 22F, on the basis of the control signal supplied from the controller 11, applies the signal SWL to the word line WL, applies the signal SCTRL to the control line CTRL, and applies the signal SRSTL to the restore control line RSTL.

The driver 23F, via the bit lines BL and BLB, writes information to the memory cell array 21F or reads out information from the memory cell array 21F. In addition, the driver 23F also has a function to, on the basis of the control signal supplied from the controller 11, apply the signal SSTRL2 to the store control line STRL2 and apply the signal SSTRLB2 to the store control line STRLB2.

In this semiconductor circuit 1F, as illustrated in FIG. 26, the memory cell 30F includes the transistors 81, 84, 85, and 88. Alternatively, however, for example, as the modification example 1-4, the driver 23F may include a transistor that corresponds to these transistors. In the following, a semiconductor circuit 1G according to the present modification example is described in detail. The semiconductor circuit 1G includes a memory circuit 20G. The memory circuit 20G includes a memory cell array 21G, the driver 22F, and a driver 23G.

FIG. 28 illustrates an example of a configuration of a memory cell 30G in the memory cell array 21G. FIG. 29 illustrates an example of a configuration of the memory cell array 21G. The memory cell array 21G includes a plurality of store control lines STRL3 and a plurality of store control lines STRLB3. The store control lines STRL3 extend vertically in FIGS. 28 and 29. Each store control line STRL3 has one end coupled to the driver 23G, and the driver 23G applies a signal SSTRL3 to the store control line STRL3. The store control lines STRLB3 extend vertically in FIGS. 28 and 29. Each store control line STRLB3 has one end coupled to the driver 23G, and the driver 23G applies a signal SSTRLB3 to the stare control line STRLB3.

The memory cell 30G includes transistors 82, 83, 86, and 87. Each of the transistors 82 and 86 has a source coupled to the store control line STRLB3, and each of the transistors 83 and 87 has a source coupled to the store control line STRL3.

The driver 23G, via the bit lines BL and BLB, writes information to the memory cell array 21G or reads out information from the memory cell array 21G. In addition, the driver 23G also has a function to, on the basis of the control signal supplied from the controller 11, apply the signal SSTRL3 to the store control line STRL3 and apply the signal SSTRLB3 to the store control line STRLB3.

As illustrated in FIG. 29, the driver 230 includes transistors 28 and 29. The transistor 28 is a p-type MOS transistor, having a gate supplied with the signal SSTRLB2, a source supplied with the power voltage VDD, and a drain coupled to the store control line STRLB3. The transistor 28 corresponds to the transistors 81 and 85 in the memory cell 30F (FIG. 26). The transistor 29 is an it-type MOS transistor, having a gate supplied with the signal SSTRL2, a drain coupled to the store control line STRL3, and a source grounded. The transistor 29 corresponds to the transistors 84 and 88 in the memory cell 30F (FIG. 26).

In this semiconductor circuit 1G, as illustrated in FIG. 29, each transistor 28 in the driver 23G drives one store control line STRLB3, and each transistor 29 in the driver 23G drives one store control lines STRL3, but this is not limitative. Alternatively, as with the semiconductor circuit 1E illustrated in FIG. 25, each transistor 28 in the driver 23G may drive a plurality of (in this example, two) store control lines STRLB3, and each transistor 29 in the driver 23G may drive a plurality of (in this example, two) store control lines STRL3.

[Modification Example 1-6]

In the foregoing embodiment, as illustrated in FIG. 2, the pinned layer P of the storage element 33 is coupled to the source of the transistor 31 and the drain of each of the transistors 86 and 87 with the free layer F being coupled to the control line CTRL. The pinned layer P of the storage element 34 is coupled to the source of the transistor 32 and the drain of each of the transistors 82 and 83 with the free layer F being coupled to the control line CTRL, but this is not limitative. In the following, a semiconductor circuit 1H according to the present modification example is described in detail.

FIG. 30 illustrates an example of a configuration of the memory cell 30H in the semiconductor circuit 1H. The memory cell 30H includes storage elements 33H and 34H. In the storage element 33H, the free layer F is coupled to the source of the transistor 31 and the drain of each of the transistors 82 and 83, and the pinned layer P is coupled to the control line CTRL. In the storage element 34H, the free layer F is coupled to the source of the transistor 32 and the drain of each of the transistor 86 and 87, and the pinned layer P is coupled to the control line CTRL. In other words, in the memory cell 30H according to the present modification example, the orientation of the storage element 33 in the memory cell 30 (FIG. 2) according to the foregoing embodiment is reversed while the orientation of the storage element 34 is reversed. Furthermore, in the memory cell 30H, each of the transistors 82 and 83 has a drain coupled to the storage element 33H, and each of the transistors 86 and 87 has a drain coupled to the storage element 34H.

FIGS. 31A and 31B each illustrate a state of operation of the memory cell 30H in the store operation OP2. In the first step of the store operation OP2, as illustrated in FIG. 4, the driver 22 sets the voltage of the signal SCTRL to the low-level voltage VL (ground level). In this example, the voltage VN1 at the node N1 is the high-level voltage VH, and the voltage VN2 at the node N2 is the low-level voltage VL, which turns on the transistors 83 and 86 and turns off the transistors 82 and 87. Thus, in the memory cell 30H, as illustrated in FIG. 31A, the store current Istr1 flows in order from the transistor 85 to the transistor 86, to the storage element 34H, and to the transistor 25. At this time, in the storage element 34H, the store current Istr1 flows from the free layer F to the pinned layer P, thus causing the magnetization direction of the tree layer F to be the same direction (parallel state) as the magnetization direction of the pinned layer P. As a result, the resistance state of the storage element 34H becomes the low resistance state RL.

In addition, in the second step, as illustrated in FIG. 4, the driver 22 sets the voltage of the signal SCTRL to the high-level voltage (power voltage level). In this example, the transistors 83 and 86 are on, and the transistors 82 and 87 are off. As illustrated in FIG. 31B, this causes the store current Istr2 to flow in order from the transistor 24 to the storage element 33H to the transistor 83, and to the transistor 84. At this time, in the storage element 33H, the store current Istr2 flows from the pinned layer P to the free layer F, thus causing the magnetization direction of the free layer F to be opposite (antiparallel state) to the magnetization direction of the pinned layer P. As a result, the resistance state of the storage element 33H becomes the high resistance state RH.

[Modification Example 1-7]

In the foregoing embodiment, the storage elements 33 and 34 are configured using a magnetic tunnel junction element, but this is not limitative. As with a memory cell 30J illustrated in FIG. 32, it is possible to use various storage elements 33J and 34J with a reversibly changing resistance state. For example, the storage elements 33J and 34J may have a resistance state that changes in accordance with the direction of the current flowing between two terminals, or may have a resistance state that changes in accordance with the polarity of the voltage applied to the two terminals. Each of the storage elements 33J and 34J may be a unipolar element or may be a bipolar element. Specifically, it is possible to use a resistive random access storage element, a phase-change storage element, a ferroelectric storage element, and so on.

[Modification Example 1-8]

In tire foregoing embodiment, one power supply transistor 12 is provided, and the drain of this power supply transistor 12 is coupled to the memory circuit 20, but this is not limitative. Alternatively, for example, three power supply transistors 12A. 12B, and 12C may be provided, with the drain of the power supply transistor 12A being coupled to the memory cell array 21 in the memory circuit 20, with the drain of the power supply transistor 12B being coupled to the driver 22 in the memory circuit 20, and with the drain of the power supply transistor 12C being coupled to the driver 23 in the memory circuit 20. This allows the controller 11 to perform separate control on the power supply to each of the memory cell array 21 and the drivers 22 and 23.

[Modification Example 1-9]

In the foregoing embodiment, the power supply transistor 12 is configured using a p-type MOS transistor, but this is not limitative. Alternatively, for example, as with a semiconductor circuit 1K illustrated in FIG. 33, the power supply transistor may be configured using an n-type MOS transistor. The semiconductor circuit 1K includes a controller 11K, a power supply transistor 12K, and a memory circuit 20K. In this example, the power supply transistor 12K is an n-type MOS transistor, having a gate supplied with the power control signal, a drain coupled to the memory circuit 20K, and a source supplied with a ground voltage VSS1. With this configuration, in the case of using the memory circuit 20K, the semiconductor circuit 1K turns on the power supply transistor 12K, to supply the ground voltage VSS1 to the memory circuit 20K as a ground voltage VSS. In addition, in the case of not using the memory circuit 20K, the semiconductor circuit 1K turns off the power supply transistor 12K.

[Modification Example 1-10]

In the foregoing embodiment, the technology is applied to a SRAM circuit, but this is not limitative. For example, the technology may be applied to a flip-flop circuit. In the following, the present modification example is described with reference to some examples.

FIG. 34 illustrates an example of a configuration of a flip-flop circuit 101 according to the present application example. The flip-flop circuit 101 includes a master latch circuit 101M and a slave latch circuit 101S. To the slave latch circuit 101S, the technique according to the foregoing embodiment is applied. The slave latch circuit 101S includes inverters IV13 and IV14, a transmission gate TG2, a transistor TR2, the transistors 31, 32, and 81 to 88, and the storage elements 33 and 34. The inverter IV13 corresponds to the inverter IV1 in the foregoing embodiment, having an input terminal coupled to a node N13 while having an output terminal coupled to a node N14. The inverter IV14 corresponds to the inverter IV2 in the foregoing embodiment, having an input terminal coupled to the node N14 while having an output terminal coupled to one end of the transmission gate TG2 and a source of the transistor TR2. The transmission gate TG2 has one end coupled to the output terminal of the inverter IV14 and the source of the transistor TR2, while having another end coupled to the node N13. In this example, the transistor TR2 is an n-type MOS transistor, having a gate supplied with the signal SRSTL, a source coupled to the output terminal of the inverter IV14 and one end of the transmission gate TG2, and a drain coupled to the node N13.

Here, the inverter IV13 corresponds to a specific example of a "first circuit" in the disclosure. The inverter IV14, the transmission gate TG2, and the transistor TR2 correspond to a specific example of a "second circuit" in the disclosure.

FIG. 35 is an example of a configuration of another flip-flop circuit 102 according to the present modification example. The flip-flop circuit 102 includes a master latch circuit 102M and a slave latch circuit 102S. To the master latch circuit 102M, the technique according to the foregoing embodiment is applied. The master latch circuit 102M includes inverters IV11 and IV12, a transmission gate TG1, a transistor TR1, the transistors 31, 32, and 81 to 88, and the storage elements 33 and 34. The inverter IV11 corresponds to the inverter IV1 in the foregoing embodiment, having an input terminal coupled to the node N11 while having an output terminal coupled to the node N12. The inverter IV12 corresponds to the inverter IV2 in the foregoing embodiment, having an input terminal coupled to the node N12 while having an output terminal coupled to one end of the transmission gate TG1 and a source of the transistor TR1. The transmission gate TG1 has one end coupled to the output terminal of the inverter IV12 and the source of the transistor TR1, while having another end coupled to the node N11. In this example, the transistor TR1 is an n-type MOS transistor, having a gate supplied with the signal SRSTL, a source coupled to the output terminal of the inverter IV12 and one end of the transmission gate TG1, and a drain coupled to the node N11.

[Other Modification Example]

In addition, two or more of these modification examples may be combined

2. Second Embodiment

Next, a semiconductor circuit 2 according to a second embodiment is described. In the present embodiment, each memory cell includes one storage element. It is to be noted that the same reference numerals are assigned to substantially the same components as those in the semiconductor circuit 1 according to the foregoing first embodiment, and the descriptions thereof are omitted where appropriate.

As illustrated in FIG. 1, the semiconductor circuit 2 includes a memory circuit 50. The memory circuit 50 includes a memory cell array 51 and drivers 52 and 53.

FIG. 36 illustrates an example of a configuration of a memory cell 60 in the memory cell array 51. FIG. 37 illustrates an example of a configuration of the memory cell array 51. The memory cell array 51 includes a plurality of word lines WL, a plurality of bit lines BL, a plurality of bit lines BLB, a plurality of control lines CTRL, a plurality of store control lines STRL, a plurality of store control lines STRLB and a plurality of restore control lines RSTL.

The memory cell 60 includes an SRAM circuit 70, the transistors 31 and 85 to 88, and the storage element 33.

The SRAM circuit 70 includes transistors 71 to 74, 45, and 46. The transistors 71 to 74 correspond respectively to the transistors 41 to 44 in the foregoing embodiment. The transistors 71 and 72 are included in an inverter IV3, and the transistors 73 and 74 are included in an inverter IV4. In this example, a gate length L73 of the transistor 73 is equal to a gate length L71 of the transistor 71, and a gate width W73 of the transistor 73 is larger than a gate width W71 of the transistor 71 (W73>W71). In addition, a gate length L72 of the transistor 72 is equal to a gate length L74 of the transistor 74, and a gate width W72 of the transistor 72 is larger than a gate width W74 of the transistor 74 (W72>W74). Immediately after power activation, this makes it easier for the inverter IV4 to produce a high-level output, and makes it easier for the inverter IV3 to produce a low-level output.

In addition, in the memory cell 60, as described later, in the restore operation OP4, the current flowing from the transistor 73 in the inverter IV4 toward the node N1 becomes larger than the current flowing from the node N1 to the control line CTRL in a case where the resistance state of the storage element 33 is the high resistance state RH, and the current flowing from the transistor 73 of the inverter IV4 to the node N1 becomes smaller than the current flowing from the node N to the control line CTRL in a case where the resistance state of the storage element 33 is the low resistance state RL.

The transistor 31 has a gate coupled to the restore control line RSTL, a drain coupled to the node N1, and a source coupled to a drain of each of the transistors 86 and 87 and to one end of the storage element 33. The transistor 85 has a gate coupled to the store control line STRLB, a source supplied with the power voltage VDD, and a drain coupled to a source of the transistor 86. The transistor 86 has a gate coupled to the node N2, a source coupled to the drain of the transistor 85, and a drain coupled to the drain of the transistor 87, to the source of the transistor 31, and to one end of the storage element 33. The transistor 87 has a gate coupled to the node N2, a drain coupled to the drain of the transistor 86, to the source of the transistor 31, and to one end of the storage element 33, and a source coupled to a drain of the transistor 88. The transistor 88 has a gate coupled to the store control line STRL, a drain coupled to the source of the transistor 87, and a source grounded. The storage element 33 has one end (pinned layer P) coupled to the source of the transistor 31 and the drain of each of the transistors 86 and 87, while having another end (free layer) coupled to the control line CTRL.

The driver 52 on the basis of the control signal supplied from the controller 11 applies the signal SWL to the word line WL, applies the signal SCTRL to the control line CTRL, applies the signal SSTRL to the store control line STRL, applies the signal SSTRLB to the store control line STRLB, and applies the signal SRSTL to the restore control line RSTL. As illustrated in FIG. 37, the driver 52 includes the transistors 24 and 25. The transistors 24 and 25 are included in an inverter, and the driver 52 drives the control lines CTRL, using this inverter.

The driver 53, via the hit lines BL and BLB, writes information to the memory cell array 51 or reads out information from the memory cell array 51.

Here, the transistor 71 corresponds to a specific example of an "eleventh transistor" in the disclosure. The transistor 73 corresponds to a specific example of a "twelfth transistor" in the disclosure. The transistor 74 corresponds to a specific example of a "thirteenth transistor" in the disclosure. The transistor 72 corresponds to a specific example of a "fourteenth transistor" in the disclosure.

FIG. 38 illustrates an example of an operation of a specific memory cell 60 in the semiconductor circuit 2. FIG. 39, FIGS. 40A to 40D, and FIGS. 41A to 41C each illustrate a state of operation of the memory cell 60. FIG. 39 illustrates a state in the normal operation OP1. FIGS. 40A to 40D each illustrate a state in a case where the voltage VN1 at the node N1 is the high-level voltage VH (VN1=VH), FIGS. 40A and 40B each illustrate a state in the store operation OP2, FIG. 40C illustrates a state in the standby operation OP3, and FIG. 40D illustrates a state in the restore operation OP4. FIGS. 41A to 41D each illustrate a state in a case where the voltage VN1 at the node N1 is the low-level voltage VL (VN1=VL), FIGS. 41A and 41B each illustrate a state in the store operation OP2, FIG. 41C illustrates a state in the standby operation OP3, and FIG. 41D illustrates a state in the restore operation OP4.

(Normal Operation OP1)

In the normal operation OP1, as illustrated in FIG. 38, the controller 11 sets the voltage of the power control signal SPG to low level. This turns on the power supply transistor 12 (FIG. 1), and the power voltage VDD is supplied to the memory circuit 50. Then, as illustrated in FIG. 38, the driver 52 sets the voltage of the signal SRSTL to low level. This turns off the transistor 31 as illustrated in FIG. 39. In addition, as illustrated in FIG. 38, the driver 52 sets the voltage of the signal SSTRL to low level, and sets the voltage of the signal SSTRLB to high level. This turns off each of the transistors 85 and 88 as illustrated in FIG. 39. In addition, as illustrated in FIG. 38, the driver 52 sets the voltage of the signal SCTRL to the low-level voltage VL (ground level).

In this normal operation OP1, information is written to the SRAM circuit 70 in the memory cell 60, or information is read out from the SRAM circuit 70. At this time, as illustrated in FIG. 39, the transistors 31, 85, and 88 are off. Thus, no current flows in the storage element 33, and the resistance state of the storage element 33 is maintained.

(Store Operation OP2)

In the store operation OP2, as illustrated in FIG. 38, the driver 52 sets the voltage of the signal SSTRL to high level, and sets the voltage of the signal SSTRLB to low level. This turns off each of the transistors 85 and 88 as illustrated in FIGS. 40A and 40B. In addition, as illustrated in FIG. 38, the driver 52 sets the voltage of the signal SWL to low level. This turns off the transistor 45 and 46.

In this store operation OP2, as illustrated in FIG. 38, the driver 52 sets the voltage of the signal SCTRL to the low-level voltage VL (ground level) in the first step, and sets the voltage of the signal SCTRL to the high-level voltage VH (power voltage level) in the second step. In this manner, the resistance state of the storage element 33 is set in accordance with the information stored in the SRAM circuit 70.

Specifically, for example, as illustrated in FIGS. 40A and 40B, in a case where the voltage VN1 at the node N1 is the high-level voltage VH (VN1=VH), the voltage VN2 at the node N2 is the low-level voltage VL (VN2=VL), which turns on the transistor 86 and turns off the transistor 87. Thus, in the memory cell 60, in the first step, as illustrated in FIG. 40A, the store current Istr1 flows in order from the transistor 85 to the transistor 86, to the storage element 33, and to the transistor 25. At this time, in the storage element 33, the store current Istr1 flows from tire pinned layer P to the free layer F. As a result, the resistance state of the storage element 33 becomes the high resistance state RH. Whereas, in the second step, as illustrated in FIG. 40B, the store current does not flow. In this manner, the resistance state of the storage element 33 is set to the high resistance state RH.

In addition, for example, as illustrated in FIGS. 41A and 41B, in a case where the voltage VN1 at the node N1 is the low-level voltage VL (VN1=VL), the voltage VN2 at the node N2 is the high-level voltage VH (VN2=VH), which turns on the transistor 87 and turns off the transistor 86. Thus, in the first step, as illustrated in FIG. 41A, the store current does not flow in the memory cell 60. Whereas, in the second step, as illustrated in FIG. 41B, the store current Istr2 flows in order from the transistor 24 to the storage element 33, to the transistor 87, and to the transistor 88. At this time, in the storage element 33, the store current Istr2 flows from the free layer F to the pinned layer P. As a result, the resistance state of the storage element 33 is set to the low resistance state RL.

(Standby Operation OP3)

In the standby operation OP3, as illustrated in FIG. 38, the controller 11 sets the voltage of the power control signal SPG to high level. This turns off the power supply transistor 12 (FIG. 1), to suspend the power supply to the memory circuit 50. At this time, as illustrated in FIGS. 40C and 41C, the resistance state of the storage element 33 is maintained.

(Restore Operation OP4)

In the restore operation OP4, as illustrated in FIG. 38, the controller 11 sets the voltage of the power control signal SPG to low level. This turns on the power supply transistor 12 (FIG. 1), and the power voltage VDD is supplied to the memory circuit 50. In the memory cell 60, this makes it easier for the inverter IV4 to produce a high-level output immediately after power activation, and for the inverter IV3 to produce a low-level output, thus causing the voltage VN1 at the node N1 to shift toward the high-level voltage VH and causing the voltage VN2 at the node N2 to shift toward the low-level voltage VL. Then, the driver 52 sets the voltage of tire signal SRSTL to high level for a period of a predetermined length immediately after the power supply transistor 12 turns on. As illustrated in FIGS. 40D and 41D, this turns on the transistor 31 during this period. In other words, during this period, the node N1 is electrically coupled to the storage element 33. In addition, as illustrated in FIG. 38, the driver 52 sets the voltage of the signal SSTRL to low level, and sets the voltage of the signal SSTRLB to high level. This turns off each of the transistors 85 and 88 as illustrated in FIGS. 40D and 41D. In addition, as illustrated in FIG. 38, the driver 52 sets the voltage of the signal SCTRL to the low-level voltage VL (ground level). This causes the node N1 to be grounded via the storage element 33. At this time, the voltage state at the SRAM circuit 70 is set in accordance with the resistance state of the storage element 33.

Specifically, for example, as illustrated in FIG. 40D, in a case where the resistance state of the storage element 33 is the high resistance state RH, the node N1 is pulled down, using a high resistance value. At this lime, the current flowing from the transistor 73 of the inverter IV4 toward the node N1 is larger than the current flowing from the node N1 to the control line CTRL via the transistor 31 and the storage element 33. Thus, the voltage at the node N1 is set to the high-level voltage VH.

In addition, for example, as illustrated in FIG. 41D, in a case where the resistance state of the storage element 33 is the low resistance state RL, the node N1 is pulled down, using a low resistance value. At this time, the current flowing from the transistor 73 of the inverter IV4 toward the node N1 is smaller than the current flowing from tire node N1 to the control line CTRL via the transistor 31 and the storage element 33. Thus, the voltage at the node N1 is set to the low-level voltage VL.

In this manner, in the memory cell 60, the SRAM circuit 70 stores information in accordance with the information stored in the storage element 33.

FIG. 42 illustrates an example of a layout of the memory cell 60 according to the present embodiment. In this example, each of the transistors 41 to 46 and 31 is configured with a transistor having a normal threshold voltage (standard Vth), and each of the transistors 85 to 88 is configured with a transistor having a low threshold voltage (low Vth or ultra-low Vth). It is to be noted that in this example, transistors having the ultra-low Vth is used. Thus configuring the transistors 85 to 88 with transistors having the low threshold voltage makes it possible to realize a sufficient current with a small area. It is to be noted that this is not limitative, and all tire transistors in the memory cell 60 may be configured with transistors having the normal threshold voltage, or may be configure with transistors having the low threshold voltage.

Thus, in the semiconductor circuit 2, each memory cell 60 includes one storage element 33. In the semiconductor circuit 2, it is thus possible to reduce the number of elements as compared to the semiconductor circuit 1 according to the first embodiment, thus allowing for a reduction in the area of the memory cell 60. As a result, it is possible to reduce the entire area of the semiconductor circuit 2.

In addition, in the SRAM circuit 70, the gale width W73 of the transistor 73 in the inverter IV4 is larger than the gate width W71 of the transistor 71 in the inverter IV3 (W73>W71), and the gale width W72 of the transistor 12 in the inverter IV3 is larger than the gate width W74 of the transistor 74 in the inverter IV4 (W72>W74). In addition, in the SRAM circuit 70, the current flowing from the transistor 73 of the inverter IV4 toward the node N1 is larger than the current flowing from the node N1 to the control line CTRL in a case where the resistance state of the storage element 33 is the high resistance state RH (FIG. 40D), and the current flowing from the transistor 73 of the inverter IV4 toward the node N1 is smaller than the current flowing from the node N1 to the control line CTRL in a case where the resistance state of the storage element 33 is the low resistance state RL (FIG. 41D). This allows the semiconductor circuit 2 to realize the restore operation OP4 with one storage element 33.

In other words, in the semiconductor circuit 1 according to the first embodiment, in the restore operation OP4, for example, in a case where, as illustrated in FIG. 5E, the resistance state of the storage element 33 is the high resistance state RH and the resistance state of the storage element 34 is the low resistance state RL, the node N2 is pulled down by a low resistance value. Thus, the voltage VN2 at the node N2 becomes the low-level voltage VL, which, as a result, allows setting the voltage VN1 at the node N1 to the high-level voltage VH. However, a configuration simply omitting the transistors 32 and 81 to 84 and the storage element 34 from the memory cell 30 of the semiconductor circuit 1 only results in the node N1 being pulled down by a high resistance value. Thus, in this case, even if it is intended to perform the restore operation OP4, it is difficult to cause the voltage VN1 at the node N1 to be the high-level voltage VH.

Meanwhile, in the semiconductor circuit 2, the SRAM circuit 70 has a configuration in which the voltage VN1 at the node N1 easily becomes the high-level voltage VH immediately after power activation. In a case where the resistance state of the storage element 33 is the high resistance state RH, as illustrated in 40D, this allows the voltage VN1 to be the high-level voltage VH. In other words, the voltage VN1 is not much influenced even if the node N1 is pulled down by the high resistance value, and becomes the high-level voltage VH In addition, in a case where the resistance state of the storage element 33 is the low resistance state RL, as illustrated in FIG. 41D, the node N1 is pulled down by the low resistance value, thus causing the voltage VN1 to be the low-level voltage VL. This allows the semiconductor circuit 2 to realize the restore operation OP4 with one storage element 33.

As described above, according to the present embodiment, each memory cell includes one storage element, thus allowing for a reduction in the area of rive semiconductor circuit.

In the present embodiment, the SRAM circuit has a configuration in which the voltage at the node N1 easily becomes the high level voltage immediately after power activation, thus making it possible to realize the restore operation with one storage element.

Other effects are the same as those in the case of the foregoing first embodiment.

[Modification Example 2-1]

In the foregoing embodiment, the gate width W of each of the transistors 71 to 74 in the inverters IV3 and IV4 is set, but this is not limitative. Alternatively, for example, a gate length L of each of the transistors 71 to 74 in the inverters IV3 and IV4 may be set. Specifically, for example, the gate length L73 of the transistor 73 in the inverter IV4 may be smaller than the gate length L71 of the transistor 71 in the inverter IV3 (L73<L71), and the gate length L72 of the transistor 72 in the inverter IV3 may be smaller than the gate length L74 of the transistor 74 in the inverter IV4 (L72<L74). In this case, it is also possible for the voltage VN1 at the node N1 to easily become the high-level voltage VH immediately after power activation.

[Modification Example 2-2]

In the foregoing embodiment, the gate width W73 of the transistor 73 in the inverter IV4 is larger than the gate width W71 of the transistor 71 in the inverter IV3 (W73>W71), and the gate width W72 of the transistor 72 in the inverter IV3 is larger than the gate width W74 of the transistor 74 in the inverter IV4 (W72>W74), but this is not limitative. Alternatively, the gate widths W72 and W74 of the transistors 72 and 74 may be equal to each other, and the gate width W73 of the transistor 73 in the inverter IV4 may be larner than the gate width W71 of the transistor 71 in the inverter IV3 (W73>W71). In addition, for example, the gate widths W71 and W73 of the transistors 71 and 73 may be equal to each other, and the gate width W72 of the transistor 72 in the inverter IV3 may be larger than the gate width W74 of the transistor 74 in the inverter IV4 (W72>W74). In this case, it is also possible for the voltage VN1 at the node N1 to easily become the high-level voltage VH immediately after power activation.

[Modification Example 2-3]

In the foregoing embodiment, in the restore operation OP4, the current is caused to flow from the node N1 to the control lines CTRL, but this is not limitative. Furthermore, the current may be caused to flow from the node N2 to the control line CTRL. In the following, a semiconductor circuit 2C according to the present modification example is described in detail.

FIG. 43 illustrates an example of a configuration of a memory cell 60C in the semiconductor circuit 2C. The memory cell 60C includes the SRAM circuit 40, transistors 61, 62, and 85 to 88, and the storage element 33.

The SRAM circuit 40 includes the transistors 41 to 46. A gate length L41 of the transistor 41 is equal to a gate length L43 of the transistor 43, and a gate width W41 of the transistor 41 is equal to a gate width W43 of the transistor 43. Likewise, a gate length L42 of the transistor 42 is equal to a gate length L44 of the transistor 44, and a gate width W42 of the transistor 42 is equal to a gate width W44 of the transistor 44. In other words, in the foregoing second embodiment, the SRAM circuit 70 having a configuration in which the voltage VN1 easily becomes the high-level voltage VH immediately after power activation. Whereas, in the present modification example, the SRAM circuit 40 in the semiconductor circuit 1 (FIG. 2) in the foregoing first embodiment is used.

The transistors 61 and 62 are each art n-type MOS transistor. The transistor 61 has a gate coupled to the restore control line RSTL and a drain coupled to the node N1, while having a source coupled to a drain of each of the transistors 86 and 87 and one end of the storage element 33. The transistor 62 has a gate coupled to the restore control line RSTL and a drain coupled to the node N2, while having a source coupled to the control line CTRL. The on-resistance of the transistor 62 is set larger than the on-resistance of the transistor 61. Specifically, for example, a gate length L62 of the transistor 62 may be larger than a gate length L61 of the transistor 61, or a gate width W62 of the transistor 62 may be smaller than a gate width W61 of the transistor 61.

In the restore operation OP4, this configuration allows a current I62 flowing from the node N2 to the control line CTRL via the transistor 62 to be larger than a current IH flowing from the node N1 to the control line CTRL via the transistor 61 and the storage element 33 in a case where the resistance state of the storage element 33 is the high resistance state RH, and allows the current I62 to be smaller than a current IL flowing from the node N1 to the control line CTRL via the transistor 61 and the storage element 33 in a case where the resistance state of the storage element 33 is the low resistance state RL. As a result, as in the case of the foregoing embodiment, in the restore operation OP4, it is possible for the memory cell 60C to set the voltage state at the SRAM circuit 40 in accordance with the resistance state of the storage element 33.

In this example, the SRAM circuit 40 is used for the semiconductor circuit 2C, but this is not limitative. Alternatively, the SRAM70 in the semiconductor circuit 2 (FIG. 36) according to the foregoing embodiment may be used.

It is to be noted that in this example, the on-resistances of the transistors 61 and 62 are different from each other, but this is not limitative. Alternatively, for example, the on-resistances of the transistors 61 and 62 may be almost the same, and a resistance element 63 may be inserted between the source of the transistor 62 and the control line CTRL. For example, it is possible to set the resistance value of the resistance element 63 to around an average value between the resistance value of the storage element 33 in a case where the resistance state is the high resistance state RH and the resistance value of the storage element 33 in a case where the resistance state is the low resistance state RL.

[Modification Example 2-4]

In the foregoing embodiment, as illustrated in FIG. 38, the signals SSTRL and SSTRLB are inverted front each other in the store operation OP2, but this is not limitative. Alternatively, for example, as in the case of the semiconductor circuit 1A (FIG. 16), the signals SSTRL and SSTRLB may be the same in the store operation OP2.

[Modification Example 2-5]

In the foregoing embodiment, as illustrated in FIG. 37, the driver 52 includes an inverter (transistors 24 and 25) that generates the signal SCTRL, but this is not limitative. Alternatively, for example, each memory cell may include an inverter that generates the signal SCTRL. In the following, a semiconductor circuit 2E according to the present modification example is described in detail. The semiconductor circuit 2E includes a memory circuit 50E. The memory circuit 50E includes a memory cell array 51E, a driver 52E, and the driver 53.

FIG. 44 illustrates an example of a configuration of the memory cell 60C in the memory cell array 51E. FIG. 45 illustrates an example of a configuration of the memory cell array 51E. The memory cell array 51E includes a plurality of control lines CTRLB. The control lines CTRLB extend horizontally in FIGS. 44 and 45. Each control line CTRLB has one end coupled to the driver 52E, and the driver 52E applies the signal SCTRLB to the control line CTRLB.

The memory cell 60E includes the transistors 37 and 38. The transistors 37 and 38 are included in an inverter. Then, the inverter generates the signal SCTRL on the basis of the signal SCTRLB, and supplies the signal SCTRL to another end of the storage element 33.

The driver 52E, on the basis of the control signal supplied from the controller 11, applies the signal SWL to the word line WL, applies the signal SCTRLB to the control line CTRLB, applies the signal SSTRL to the store control line STRL, applies the signal SSTRLB to the store control line STRLB, and applies the signal SRSTL to the restore control line RSTL.

[Modification Example 2-6]

In the foregoing embodiment, as illustrated in FIG. 36, the memory cell 60 includes the transistors 85 and 88, but this is not limitative. Alternatively, for example, the driver 52 may include a transistor that corresponds to these transistors. In the following, a semiconductor circuit 2F according to the present modification example is described in detail. The semiconductor circuit 2F includes a memory circuit 50F. The memory circuit 50F includes a memory cell array 51F, a driver 52F, and the driver 53.

FIG. 46 illustrates an example of a configuration of a memory cell 60F in the memory cell array 51F. FIG. 47 illustrates an example of a configuration of the memory cell array 51F. The memory cell array 51F includes a plurality of store control lines STRL1 and a plurality of store control lines STRLB1. The store control lines STRL1 extend horizontally in FIGS. 46 and 47. Each store control line STRL1 has one end coupled to the driver 52F, and the driver 52F applies the signal SSTRL1 to the store control line STRL1. The store control lines STRLB1 extend horizontally in FIGS. 46 and 47. Each store control line STRLB1 has one end coupled to the driver 52F, and the driver 52F applies the signal SSTRLB1 to the store control line STRLB1.

The memory cell 60F includes the transistors 86 and 87. The transistor 86 has a source coupled to the store control line STRLB1, and the transistor 87 has a source coupled to the store control line STRL1.

The driver 52F, on the basis of the control signal supplied from the controller 11, applies the signal SWL to the word line WL, applies the signal SCTRL to the control line CTRL, applies the signal SSTRL1 to the store control line STRL1, applies the signal SSTRLB1 to the store control line STRLB1, and applies the signal SRSTL to the restore control line RSTL.

As illustrated in FIG. 46, the driver 52F includes the transistors 26 and 27. The transistor 26 corresponds to the transistor 85 in the memory cell 60 (FIG. 36) according to the foregoing embodiment. The transistor corresponds to the transistor 88 the memory cell 60 according to the foregoing embodiment.

FIG. 48 illustrates at example of a layout of the memory cell 60F according to the present embodiment. In the memory cell 60F as compared to the memory cell 60 (FIGS. 36 and 42) according to the foregoing embodiment, it is thus possible to reduce the number of transistors, thus allowing a reduction its the area of the memory cell 60F.

In this semiconductor circuit 2F, as illustrated FIG. 46, each transistor 26 in the driver 52F drives one store control line STRLB1, and each transistor 27 in the driver 52F drives one store control line STRL1, but this is not limitative. Alternatively, for example, as with a semiconductor circuit 2G illustrated in FIG. 49, each transistor 26 in the driver 52G may drive a plurality of (in this example, two) control lines STRLB1, and each transistor 27 in the driver 52G may drive a plurality of (in this example, two) store control lines STRL1.

[Modification Example 2-7]

In the foregoing embodiment, as illustrated in FIGS. 36 and 37, the word line WL, the control line CTRL, the store control lines STRL and STRLB, and the restore control line RSTL are configured to extend horizontally in FIGS. 36 and 37, and bit lines BL and BLB are configured to extend vertically in FIGS. 36 and 37, but this is not limitative. In the following, as an example, a semiconductor circuit 2H having a configuration in which the store control lines STRL and STRLB extend vertically is described in detail. The semiconductor circuit 2H includes a memory circuit 50H. The memory circuit 50H includes a memory cell array 51H, a driver 52H, and a driver 53H.

FIG. 50 illustrates an example of a configuration of a memory cell 60H in the memory cell array 51H. FIG. 51 illustrates an example of a configuration of the memory cell array 51H. The memory cell array 51H includes a plurality of store control lines STRL2 and a plurality of store control lines STRLB2. The store control lines STRL2 extend vertically in FIGS. 50 and 51. Each store control line STRL2 has one end coupled to the driver 53H, and the driver 53H applies the signal SSTRL2 to the store control line STRL2. The store control lines STRLB2 extend vertically in FIGS. 50 and 51. Each store control line STRLB2 has one end coupled to the driver 53H, and the driver 53H applies the signal SSTRLB2 to the store control line STRLB2.

The memory cell 60H includes the transistors 85 and 88. The transistor 85 has a gate coupled to the store control line STRLB2, and the transistor 88 has a gate coupled to the store control line STRL2.

The driver 52H, on the basis of the control signal supplied from the controller 11, applies the signal SWL to the word line WL, applies the signal SCTRL to the control line CTRL, and applies the signal SRSTL to the restore control line RSTL.

The driver 53H, via the bit lines BL and BLB, writes information to the memory cell array 51H or reads out information from the memory cell array 51H. In addition, the driver 53H has a function to, on the basis of the control signal supplied from the controller 11, apply the signal SSTRL2 to the store control line STRL2, and apply the signal SSTRLB2 to the store control line STRLB2.

As illustrated in FIG. 50, in the semiconductor circuit 2H, the memory cell 60H includes the transistors 85 and 88. Alternatively, however, for example, as in the modification example 2-6, the driver 53H may include a transistor that corresponds to these transistors. In the following, a semiconductor circuit 2J according to the present modification example is described in detail. The semiconductor circuit 2J includes a memory circuit 50J. The memory circuit 50J includes a memory cell array 51J, the driver 52H, and a driver 53J.

FIG. 52 illustrates an example of a configuration of a memory cell 60J in the memory cell array 51J. FIG. 53 illustrates an example of a configuration of the memory cell array 51J. The memory cell array 51J includes a plurality of store control lines STRL3 and a plurality of store control lines STRLB3. The store control lines STRL3 extend vertically in FIGS. 52 and 53. Each store control line STRL3 has one end coupled to the driver 53J, and the driver 53J applies the signal SSTRL3 to the store control line STRL3. The store control lines STRLB3 extend vertically in FIGS. 52 and 53. Each store control line STRLB3 has one end coupled to the driver 53J, and the driver 53J applies the signal SSTRLB3 to the store control line STRLB3.

The memory cell 603 includes the transistors 86 and 87. The transistor 86 has a source coupled to the store control line STRLB3, and the transistor 87 has a source coupled to the store control line STRL3.

The driver 53J, via the bit lines BL and BLB, writes information to the memory cell array 51J or reads out information from the memory cell array 51J. In addition, the driver 53J also has a function to, on the basis of the control signal supplied from the controller 11, apply the signal SSTRL3 to the store control line STRL3 and apply the signal SSTRLB3 to the store control line STRLB3.

As illustrated in FIG. 53, the driver 53J includes the transistors 28 and 29. The transistor 28 corresponds to the transistor 85 in the memory cell 60H (FIG. 50). The transistor 29 corresponds to the transistor 88 in the memory cell 60H.

As illustrated in FIG. 53, in the semiconductor circuit 2J, each transistor 28 in the driver 53J drives one store control line STRLB3, and each transistor 29 in the driver 53J drives one store control line STRL3, but this is not limitative. Alternatively, as with the semiconductor circuit 2G illustrated in FIG. 49, each transistor 28 in the driver 53J may drive a plurality of (in this example, two) store control lines STRLB3, and each transistor 29 in the driver 53J may drive a plurality of (in this example, two) store control lines STRL3.

[Modification Example 2-8]

In the foregoing embodiment, as illustrated in FIG. 36, the pinned layer P of the storage element 33 is coupled to the source of the transistor 31 and the drain of each of the transistors 86 and 87, and the free layer F is coupled to the control line CTRL, but this is not limitative. In the following, a semiconductor circuit 2K according to the present modification example is described in detail.

FIG. 54 illustrates an example of a configuration of a memory cell 60K in the semiconductor circuit 2K. The memory cell 60K includes the transistors 81 to 84 and the storage element 33H. The transistor 82 has a drain coupled to the drain of the transistor 83, to the source of the transistor 31, and to the free layer F of the storage element 33H. The transistor 83 has a drain coupled to the drain of the transistor 82, to the source of the transistor 31, and to the free layer F of the storage element 33H. The storage element 33H has the free layer F coupled to the source of the transistor 31 and the drain of each of the transistors 82 and 83, while having a pinned layer P coupled to the control line CTRL FIGS. 55A, 55B, 56A, and 56B each illustrate a state of operation of the memory cell 60K in the store operation OP2. FIGS. 55A and 55B illustrate a case where the voltage VN1 at the node N1 is the high-level voltage VH (VN1=VH), and FIGS. 56A and 56B illustrate a case where the voltage VN1 at the node N1 is the low-level voltage VL (VN1=VL).

For example, as illustrated in FIGS. 55A and 55B, in a case where the voltage VN1 at the node N1 is the high-level voltage VH (VN1=VH), the transistor 83 is on, and the transistor 82 is off. Thus, in the first step, as illustrated in FIG. 55A, the store current does not flow in the memory cell 60K. Whereas, in the second step, as illustrated in FIG. 55B, the store current Istr2 flows in order from the transistor 24 to the storage element 33H, to the transistor 83, and to the transistor 84. At this time, in the storage element 33H, the store current Istr2 flows from the pinned layer P to the free layer F, and the resistance state of the storage element 33H is set to the high resistance state RH.

In addition, for example, as illustrated in FIGS. 56A and 56B, in a case where the voltage VN1 at the node N1 is the low-level voltage VL (VN1=VL), the transistor 82 is on, and the transistor 83 is off. Thus, in the first step, as illustrated in FIG. 56A, the store current Istr1 flows in order from the transistor 81 to the transistor 82, to the storage element 33H, and to the transistor 25. At this time, in the storage element 33H, the store current Istr1 flows from the free layer F to the pinned layer P, thus causing the resistance state of the storage element 33H to be the low resistance state RL. Whereas, in the second step, as illustrated in FIG. 56B, the store current does not flow. This, sets the resistance state of the storage element 33H to the low resistance state RE

[Modification Example 2-9]

In the foregoing embodiment, the storage element 33 is configured using a magnetic tunnel junction element, but this is not limitative. As with a memory cell 60L illustrated in FIG. 57, it is possible to use various storage elements 311 with a reversibly changing resistance state. For example, the storage element 311 may have a resistance state that changes in accordance with the direction of the current flowing between two terminals, or may have a resistance state that changes in accordance with the polarity of the voltage applied to the two terminals. The storage elements 333 may be a unipolar element or may be a bipolar element. Specifically, it is possible to use a resistive random access storage element a phase-change storage element, a ferroelectric storage element, and so on.

[Modification Example 2-10]

In the foregoing embodiment, one power supply transistor 12 is provided, and the drain of this power supply transistor 12 is coupled to the memory circuit 50, but this is not limitative. Alternatively, for example, three power supply transistors 12A, 12B, and 12C may be provided, with the drain of the power supply transistor 12A being coupled to the memory cell array 21 of the memory circuit 50, with the drain of the power supply transistor 12B being coupled to the driver 52 of the memory circuit 50, and with the drain of the power supply transistor 12C being coupled to the driver 53 of the memory circuit 50. This allows the controller 11 to perform separate control on the power supply to each of the memory cell array 51 and the drivers 52 and 53.

[Modification Example 2-11]

In the foregoing embodiment, the power supply transistor 12 is configured using to p-type MOS transistor, but this is not limitative. Alternatively, for example, as in the case of the semiconductor circuit 1K (FIG. 33), the power supply transistor may be configured using an n-type MOS transistor.

[Modification Example 2-12]

In the foregoing embodiment, the technology is applied to the SRAM circuit, but this is not limitative. For example, the technology may be applied to the flip-flop circuit. In the following, the present modification example is described in detail with reference to some examples.

FIG. 58 illustrates an example of a configuration of a flip-flop circuit 111 according to the present application example. The flip-flop circuit 111 includes a master latch circuit 111M and a slave latch circuit 111S. To the slave latch circuit 111S, the technique according to the foregoing embodiment is applied. The slave latch circuit 111S includes the inverters IV13 and IV14, the transmission at TG2, the transistor TR2, the transistors 31 and 85 to 88, and the storage element 33. The inverter IV13 corresponds to the inverter IV1 in the foregoing embodiment, and the inverter IV14 corresponds to the inverter IV2 in the foregoing embodiment. In this example, in the restore operation OP4, the node N13 is coupled to the storage element 33.

FIG. 59 is an example of a configuration of another flip-flop circuit 112 according to the present application example. The circuit 112 includes a master latch circuit 112M and a slave latch circuit 112S. To the slave latch circuit 112S, the technique at to the foregoing embodiment is applied. The slave latch circuit 112S includes the inverters IV13 and IV14, the transmission gate TG2, the transistor TR2, the transistors 31 and 85 to 88, and the storage element 33. The inverter IV13 corresponds to the inverter IV2 in the foregoing embodiment, and the inverter IV14 corresponds to the inverter IV1 in the foregoing embodiment. In this example, in the restore operation OP4, the node N14 is coupled to the storage element 33.

FIG. 60 is an example of a configuration of another flip-flop circuit 113 according to the present modification example. The flip-flop circuit 113 includes a master latch circuit 113M and a slave latch circuit 113S. To the master latch circuit 113M, the technique according to the foregoing embodiment is applied. The master latch circuit 113M includes the inverters IV11 and IV12, the transmission gate TG1, the transistor TRI, the transistors 31 and 85 to 88, and the storage element 33. The inverter IV11 corresponds to the inverter IV1 in the foregoing embodiment, and the inverter IV12 corresponds to the inverter IV2 in the foregoing embodiment. In this example, in the restore operation OP4, the node N11 is coupled to the storage element 33.

FIG. 61 is an example of a configuration of another flip-flop circuit 114 according to the present modification example. The flip-flop circuit 114 includes a master latch circuit 114M and a slave latch circuit 114S. To the master latch circuit 114M, the technique according to the foregoing embodiment is applied. The master latch circuit 114M includes the inverters IV11 and IV12, the transmission gate TG1, the transistor TR1, the transistors 31 and 85 to 88, and the storage element 33. The inverter IV11 corresponds to the inverter IV2 in the foregoing embodiment, and the inverter IV12 corresponds to the inverter IV1 in the foregoing embodiment. In this example, in the restore operation OP4, the node N12 is coupled to the storage element 33.

[Other Modification Example]

In addition, two or more of these modification examples may be combined.

3. Application Example

Next, application examples of the techniques described in the foregoing embodiments and the modification examples thereof are described.

FIG. 62 illustrates an example of an information processor 300 according to the present application example. The information processor 300 is so-called a multi-core processor, and includes, in this example, two processor-core sections 310 and 320, a secondary cache memory section 330, and a power supply controller 301. It is to be noted that in this example, the two processor-core sections 310 and 320 are provided, but this is not limitative, and three or more processor-core sections may be provided. In addition, the information processor 300 may be realized using one semiconductor chip or may be realized using a plurality of semiconductor chips.

The processor-core section 310 includes a power supply transistor 311 and a processor core 312. In this example, the power supply transistor 311 is a p-type MOS transistor, having a gate supplied with the power control signal, a source supplied with the power voltage VDD1, and a drain coupled to the processor core 312. The processor core 312 includes a flip-flop circuit 313 and a primary cache memory 314. For the flip-flop circuit 313, for example, it is possible to use flip-flop circuits 101 and 102 (FIGS. 34 and 35) each of which includes two storage elements 33 and 34, or flip-flop circuits 111 to 114 (FIGS. 58 to 61) each of which includes one storage element 33. For the primary cache memory 314, it is possible to use the various memory cells described in the foregoing embodiments. This allows the processor core 312 to perform, on the basis of the control signal supplied from the power supply controller 301, the normal operation OP1, the store operation OP2, the standby operation OP3, and the restore operation OP4.

The processor-core section 320 has the same configuration as the processor-core section 310. A power supply transistor 321, a processor core 322, a flip-flop circuit 323, and a primary cache memory 324 in the processor-core section 320 correspond respectively to the power supply transistor 311, the processor core 312, the flip-flop circuit 313, and the primary cache memory 314 in the processor-core section 310.

The secondary cache memory section 330 includes a power supply transistor 331 and a secondary cache memory 332. In this example, the power supply transistor 331 is a p-type MOS transistor, having a gate supplied with the power control signal, a source supplied with the power voltage VDD1, and a drain coupled to the secondary cache memory 332. For the secondary cache memory 332, it is possible use the various memory cells, described in the foregoing embodiments. This allows the secondary cache memory 332 to perform, on the basis of the control signal supplied from the power supply controller 301, the normal operation OP1, the store operation OP2, the standby operation OP3, and the restore operation OP4.

The power supply controller 301 determines the processor-core section to operate from among the processor-core sections 310 and 320, on the basis of the load on the processing to be performed in the information processor 300, a method of supplying power to the information processor 300 (for example, whether or not the power is supplied from the battery), and so on, and controls the operation of the processor-core sections 310 and 320 the secondary cache memory section 330 on the basis of the determination result.

Specifically, for example, in the case of operating the processor-core section 310 and not operating the processor-core section 320 the power supply controller 301 turns on the power supply transistor 311 in the processor-core section 310 and the power supply transistor 331 the secondary cache memory section 330, and turns off the power supply transistor 321 in the processor-core section 320. In addition, for example in the case of operating the processor-core sections 310 and 320 the power supply controller 301 turns on the power supply transistor 311 processor-core section 310, the power supply transistor 321 in the processor-core section 320, and the power supply transistor 331 in the secondary cache memory section 330. In addition for example, in the case of operating neither the processor-core section 310 nor the processor-core section 320, the power supply controller 301 turns off the power supply transistor 311 in the processor-core section 310, the power supply transistor 321 in the processor-core section 320, and the power supply transistor 331 in the secondary cache memory section 330.

In addition, for example, in a case where it is intended to stop the operation of the processor-core section 310, the power supply controller 301 instructs the processor-core section 310 to perform the store operation OP2 immediately before turning off the power supply transistor 311 in the processor-core section 310. In addition, for example, in a case where it is intended to start the operation of the processor-core section 310, the power supply controller 301 instructs the processor-core section 310 to perform the restore operation OP4 immediately after turning on the power supply transistor 311 in the processor-core section 310. The same applies to the processor-core section 320 and the secondary cache memory section 330.

In the information processor 300, each of the processor-core sections 310 and 320 and the secondary cache memory section 330 includes a power supply transistor, but this is not limitative. Alternatively, for example, as with an information processor 300A illustrated in FIG. 63, the power supply controller may include a power supply transistor. The information processor 300A includes processor cores 312 and 322, the secondary cache memory 332, and a power supply controller 340. The power supply controller 340 includes power supply transistors 341 to 343. In this example, each of the power supply transistors 341 to 343 is a p-type MOS transistor. The power supply transistor 341 has a source supplied with the power voltage VDD1 and a drain coupled to the processor core 312. The power supply transistor 342 has a source supplied with the power voltage VDD1 and a drain coupled to the processor core 322. The power supply transistor 343 has a source supplied with the power voltage VDD1 and a drain coupled to the secondary cache memory 332.

Although the technology has been described above referring to some embodiments and modification examples as well as application examples thereof, the technology is not limited to these embodiments, etc., and may be modified in a variety of ways.

For example, in the foregoing embodiments, etc., the technology is applied to a SRAM circuit and a D-type flip-flop circuit, but this is not limitative. Specifically, for example, the technology may be applied to another flip-flop circuit, and may be applied to a latch circuit.

It is to be noted that effects described herein are merely illustrative and are not limitative, and may have other effects.

It is to be noted that the technology may have the following configuration.

(1)

A semiconductor circuit including:

a first circuit that is able to generate an inverted voltage of a voltage at a first node and apply the inverted voltage to a second node;

a second circuit that is able to generate an inverted voltage of a voltage at the second node and apply the inverted voltage to the first node;

a first transistor that couples the first node to a third node by turning on;

a first storage element having a first terminal coupled to the third node and a second terminal supplied with a control voltage, the first storage element being able to take a first resistance state or a second resistance state;

a first voltage setting circuit coupled to the third node, the first voltage setting circuit being able to set a voltage at the third node to a voltage corresponding to a voltage at a predetermined node out of the first node and the second node; and a driver that controls an operation of the first transistor and sets the control voltage.

(2)

The semiconductor circuit according to (1), in which the first voltage setting circuit includes:

a second transistor having source and a drain coupled to the third node, the second transistor turning on and off on the basis of the voltage at the predetermined node out of the first node and the second node and supplying a first voltage to the third node by turning on, and a third transistor having a source, and a drain coupled to the third node, the third transistor turning on and off on the basis of the voltage at the predetermined node out of the first node and the second node and supplying a second voltage to the third node by turning on.

(3)

The semiconductor circuit according to (2), further including:

a fourth transistor having a source to which the first voltage is applied and a drain coupled to the source of the second transistor, the fourth transistor supplying the first voltage to the source of the second transistor by turning on; and a fifth transistor having a source to which the second voltage is applied and a drain coupled to the source of the third transistor, the fifth transistor supplying the second voltage to the source of the third transistor by turning on, in which the driver further controls an operation of each of the fourth transistor and the fifth transistor.

(4)

The semiconductor circuit according to (3), in which in a first sub period in a first period, the driver performs a first driving for setting the control voltage, the first driving being to turn off the first transistor and turn on the fourth transistor, and set a polarity of the control voltage as viewed from the first voltage to a first polarity, in a second sub period in the first period, the driver performs a second driving for setting the control voltage, the second driving being to turn off the first transistor and turn on the fifth transistor, and set the polarity of the control voltage as viewed from the second voltage to a second polarity that is different from the first polarity, and through the first driving and the second driving, the driver sets a resistance state of the first storage element to a resistance state corresponding to the voltage at the first node.

(5)

The semiconductor circuit according to (4), in which in a second period after the first period, the driver turns on the first transistor and turn off the fourth transistor and the fifth transistor, thereby setting the voltage at the first node to the voltage corresponding to the resistance state of the first storage element.

(6)

The semiconductor circuit according to (5), including a controller that controls power supply to the first circuit and the second circuit, in which in a third period between the first period and the second period, the controller stops the power supply to the first circuit and the second circuit.

(7)

The semiconductor circuit according to (2), in which the source of the second transistor is coupled to a first control line, the source of the third transistor is coupled to a second control line, and the driver includes:

a sixth transistor having a source to which the first voltage is applied and a drain coupled to the first control line, the sixth transistor supplying the first voltage to the first control line by turning on, and a seventh transistor having a source to which the second voltage is applied and a drain coupled to the second control line, the seventh transistor supplying the second voltage to the second control line by turning on.

(8)

The semiconductor circuit according to (7), further including:

a third circuit that is able to generate an inverted voltage of a voltage at a fourth node and apply the inverted voltage to a fifth node;

a fourth circuit that is able to generate an inverted voltage of a voltage at the fifth node and apply the inverted voltage to the fourth node;

an eighth transistor that couples the fourth node to a sixth node by turning on;

a second storage element having a first terminal coupled to the sixth node and a second terminal supplied with the control voltage, the second storage element being able to take the first resistance state or the second resistance state; and a second voltage setting circuit coupled to the sixth node, the second voltage setting circuit being able to set a voltage at the sixth node to a voltage corresponding to a voltage at a predetermined node out of the fourth node and the fifth node, in which the second voltage setting circuit includes:

a ninth transistor having a drain coupled to the sixth node and a source coupled to the first control line, the ninth transistor turning on and off on the basis of the voltage at the predetermined node out of the fourth node and the fifth node and supplying the first voltage to the sixth node by turning on, and a tenth transistor having a drain coupled to the sixth node and a source coupled to the second control line, the tenth transistor turning on and off on the basis of the voltage at the predetermined node out of the fourth node and the fifth node and supplying the second voltage to the sixth node by turning on.

(9)

The semiconductor circuit according to any one of (1) to (8), in which each of the first circuit and the second circuit has a configuration in which the voltage at the first node easily becomes a predetermined voltage after power activation.

(10)

The semiconductor circuit according to (9), in which the first circuit includes an eleventh transistor that couples a first power supply and the second node by turning on, the first power supply corresponding to the predetermined voltage, and the second circuit includes a twelfth transistor that couples the first power supply and the first node by turning on, the twelfth transistor having a larger gate width than a gate width of the eleventh transistor.

(11)

The semiconductor circuit according to (9) or (10), in which the second circuit includes a thirteenth transistor that couples a second power supply and the first node by turning on, the second power supply corresponding to a voltage different from the predetermined voltage, and the first circuit includes a fourteenth transistor that couples the second power supply and the second node by turning on, the fourteenth transistor having a larger gate width than a gate width of the thirteenth transistor.

(12)

The semiconductor circuit according to any one of (9) to (11), in which the first circuit includes an eleventh transistor that couples a first power supply and the second node by turning on, the first power supply corresponding to the predetermined voltage, and the second circuit includes a twelfth transistor that couples the first power supply and the first node by turning on, the twelfth transistor having a smaller gate length than a gate length of the eleventh transistor.

(13)

The semiconductor circuit according to any one of (9) to (12), in which the second circuit includes a thirteenth transistor that couples a second power supply and the first node by turning on, the second power supply corresponding to a voltage different from the predetermined voltage, and the first circuit includes a fourteenth transistor that couples the second power supply and the second node by turning on, the fourteenth transistor having, a smaller gate length than a gate length of the thirteenth transistor.

(14)

The semiconductor circuit according to any one of (9) to (13), in which the second circuit includes a twelfth transistor that couples a first power supply and the first node by turning on, the first power supply corresponding to the predetermined voltage, the driver turns on the first transistor in a second period, and in the second period, a current value of a current that flows, after power activation, from the first power supply to the first node via the twelfth transistor is between a first current value and a second current value, the first current value being of a current that flows from the first node to the first storage element via the first transistor when the first storage element is in the first resistance state, and the second current value being of a current that flows from the first node to the first storage element via the first transistor when the first storage element is in the second resistance state.

(15)

The semiconductor circuit according to any one of (1) to (8), in which the first circuit includes an eleventh transistor and a fourteenth transistor, the eleventh transistor coupling a first power supply and the second node by turning on, the fourteenth transistor coupling a second power supply and the second node by turning on, and the second circuit includes a twelfth transistor and a thirteenth transistor, the twelfth transistor coupling the first power supply and the first node by turning on and having the same size as the eleventh transistor, the thirteenth transistor coupling the second power supply and the first node by turning on and having the same size as the fourteenth transistor.

(16)

The semiconductor circuit according to any one of (1) to (15), including a fifteenth transistor that couples the second node to the second terminal of the first storage element by turning on.

(17)

The semiconductor circuit according to (16), in which the fifteenth transistor has a larger gate length than a gate length of the first transistor.

(18)

The semiconductor circuit according to (16) or (17), in which the fifteenth transistor has a smaller gate width than a gate width of the first transistor.

(19) The semiconductor circuit according to any one of (16) to (18), in which the driver turns on the first transistor and the fifteenth transistor in a second period, and in the second period, a current that flows from the second node to the fifteenth transistor is between a first current value and a second current value, the first current value being of a current that flows from the first node to the first storage element via the first transistor when the first storage element is in the first resistance state, the second current value being of a current that flows from the first node to the first storage element via the first transistor when the first storage element is in the second resistance state.

(20)

The semiconductor circuit according to (2), further including:

a sixteenth transistor that couples the second node to a seventh node by turning on;

a third storage element having a first terminal coupled to the seventh node and a second terminal supplied with the control voltage, the third storage element being able to take the first resistance state or the second resistance state; and a third voltage setting circuit coupled to the seventh node, the third voltage setting circuit setting a voltage at the seventh node to a voltage corresponding to the voltage at the predetermined node out of the first node and the second node, in which the third voltage setting circuit includes:

a seventeenth transistor having a source, and a drain coupled to the seventh node, the seventeenth transistor turning on and off on the basis of a voltage at a different node from the predetermined node and supplying the first voltage to the seventh node by turning on, the different node being one out of the first node and the second node, and an eighteenth transistor having a source, and a drain coupled to the seventh node, the eighteenth transistor turning on and off on the basis of the voltage at the different node from the predetermined node and supplying the second voltage to the seventh node by turning on, the different node being one out of the first node and the second node.

(21)

The semiconductor circuit according to (20), further including:

a fourth transistor having a source to which the first voltage is applied and a drain coupled to the source of the second transistor, the fourth transistor supplying the first voltage to the source of the second transistor by turning on;

a fifth transistor having a source to which the second voltage is applied and a drain coupled to the source of the third transistor, the fifth transistor supplying the second voltage to the source of the third transistor by turning on;

a nineteenth transistor having a source to which the first voltage is applied and a drain coupled to the source of the seventeenth transistor, the nineteenth transistor drain supplying the first voltage to the source of the seventeenth transistor by turning on; and a twentieth transistor having a source to which the second voltage is applied and a drain coupled to the source of the eighteenth transistor, the twentieth transistor supplying the second voltage to the source of the eighteenth transistor by turning on, in which the driver further controls an operation of each of the fourth transistor, the fifth transistor, the nineteenth transistor, and the twentieth transistor, (22)

The semiconductor circuit according to (20), further including;

a twenty-first transistor having a source to which the first voltage is applied and a drain coupled to the source of the second transistor and the source of the seventeenth transistor, the twenty-first transistor supplying the first voltage to the source of the second transistor and the source of the seventeenth transistor by turning on; and a twenty-second transistor having a source to which the second voltage is applied and a drain coupled to the source of the third transistor and the source of the eighteenth transistor, the twenty-second transistor supplying the second voltage to the source of the third transistor and the source of the eighteenth transistor by turning on, in which the driver further controls an operation of each of the twenty-first transistor and the twenty-second transistor.

(23)

The semiconductor circuit according to any one of (20) to (22), in which the source of the second transistor is coupled to a first control line, the source of the third transistor is coupled to a second control line, the source of the seventeenth transistor is coupled to the first control line, the source of the eighteenth transistor is coupled to the second control line, and the driver includes:

a sixth transistor having a source to which the first voltage is applied and a drain coupled to the first control line, the sixth transistor supplying the first voltage to the first control line by turning on, and a seventh transistor having a source to which the second voltage is applied and a drain coupled to the second control line, the seventh transistor supplying the second voltage to the second control line by turning on.

(24)

The semiconductor circuit according to any one of (1) to (23), in which the driver generates the control voltage.

(25)

The semiconductor circuit according to any one of (1) to (23), further including:

a twenty-third transistor having a source to which a first voltage is applied and a drain coupled to a second terminal of the first storage element, the twenty-third transistor supplying the fast voltage to the second terminal of the first storage element by turning on; and a twenty-fourth transistor having a source to which a second voltage is applied and a drain coupled to the second terminal of the first storage element, the twenty-fourth transistor supplying the second voltage to the second terminal of the first storage element by turning on, in which the driver further controls an operation of each of the twenty-third transistor and the twenty-fourth transistor, (26)

The semiconductor circuit according to any one of (1) to (25), further including a power supply transistor that performs power supply to the first circuit and the second circuit by turning on.

(27)

The semiconductor circuit according to any one of (2) to (8), further including a contact, in which a predetermined transistor among the first transistor, the second transistor, and the third transistor includes a diffusion layer, and the diffusion layer, the contact, and the first storage element are stacked in this order.

(28)

The semiconductor circuit according to any one of (1) to (27), further including a plurality of metal wiring layers, in which the first storage element is provided below a bottommost metal wiring layer among the plurality of metal wiring layers.

(29)

The semiconductor circuit according to any one of (1) to (28), in which the first storage element stores information by using a resistance state changing reversibly in accordance with a direction of a current that flows between the first terminal and the second terminal.

(30)

The semiconductor circuit according to (29), in which the first storage element is one of a unipolar element or a bipolar element.

(31)

The semiconductor circuit according to any one of (1) to (28), in which the first storage element is one of a magnetic tunnel junction storage element, a resistive random access storage element, a phase-change storage element, or a ferroelectric storage element.

(32)

The semiconductor circuit according to any one of (1) to (28), in which the first storage element stores information by using a resistance state changing reversibly in accordance with a polarity of a voltage that is applied between the first terminal and the second terminal.

(33)

The semiconductor circuit according to any one of (1) to (32), in which the first circuit and the second circuit are included in a SRAM circuit.

(34)

The semiconductor circuit according to any one of (1) to (32), in which the first circuit and the second circuit are included in a latch circuit.

(35)

A semiconductor circuit system, including:

a storage section; and a controller that controls power supply to the storage section, in which the storage section includes:

a first circuit that is able to generate an inverted voltage of a voltage at a first node and apply the inverted voltage to a second node, a second circuit that is able to generate an inverted voltage of a voltage at the second node and apply the inverted voltage to the first node;

a first transistor that couples the first node to a third node by turning on, a first storage element having a first terminal coupled to the third node and a second terminal supplied with a control voltage, the first storage element being able to take a first resistance state or a second resistance state, a first voltage setting circuit coupled to the third node, the first voltage setting circuit being able to set a voltage at the third node to a voltage corresponding to a voltage at a predetermined node out of the first node and the second node, and a driver that controls, on the basis of an instruction from the controller, an operation of the first transistor and sets the control voltage.

This application claims the benefit of Japanese Priority Patent Application JP2016-221977 filed with the Japan Patent Office on Nov. 14, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A semiconductor circuit, comprising:
a first circuit that is able to generate an inverted voltage of a voltage at a first node and apply the inverted voltage to a second node;
a second circuit that is able to generate an inverted voltage of a voltage at the second node and apply the inverted voltage to the first node;
a first transistor that couples the first node to a third node by turning on;
a first storage element having a first terminal coupled to the third node and a second terminal supplied with a control voltage, the first storage element being able to take a first resistance state or a second resistance state;
a first voltage setting circuit coupled to the third node the first voltage setting circuit being able to set a voltage at the third node to a voltage corresponding to a voltage at a predetermined node out of the first node and the second node, wherein the first voltage setting circuit includes:
a second transistor having a source, and a drain coupled to the third node, the second transistor turning on and off on a basis of the voltage at the predetermined node out of the first node and the second node and supplying a first voltage to the third node by turning on, and
a third transistor having a source, and a drain coupled to the third node, the third transistor turning on and off on the basis of the voltage at the predetermined node out of the first node and the second node and supplying a second voltage to the third node by turning on;
a driver that controls an operation of the first transistor and sets the control voltage;
a fourth transistor having a source to which the first voltage is applied and a drain coupled to the source of the second transistor, the fourth transistor supplying the first voltage to the source of the second transistor by turning on; and
a fifth transistor having a source to which the second voltage is applied and a drain coupled to the source of the third transistor, the fifth transistor supplying the second voltage to the source of the third transistor by turning on, wherein
the driver further controls an operation of each of the fourth transistor and the fifth transistor.

2. The semiconductor circuit according to claim 1, wherein
in a first sub period in a first period, the driver performs a first driving for setting the control voltage, the first driving being to turn off the first transistor and turn on the fourth transistor, and set a polarity of the control voltage as viewed from the first voltage to a first polarity,
in a second sub period in the first period, the driver performs a second driving for setting the control voltage, the second driving being to turn off the first transistor and turn on the fifth transistor, and set the polarity of the control voltage as viewed from the second voltage to a second polarity that is different from the first polarity, and
through the first driving and the second driving, the driver sets a resistance state of the first storage element to a resistance state corresponding to the voltage at the first node.

3. The semiconductor circuit according to claim 2, wherein
in a second period after the first period, the driver turns on the first transistor and turn off the fourth transistor and the fifth transistor, thereby setting the voltage at the first node to the voltage corresponding to the resistance state of the first storage element.

4. The semiconductor circuit according to claim 3, comprising a controller that controls power supply to the first circuit and the second circuit, wherein
in a third period between the first period and the second period, the controller stops the power supply to the first circuit and the second circuit.

5. The semiconductor circuit according to claim 1, wherein
each of the first circuit and the second circuit has a configuration in which the voltage at the first node becomes a predetermined voltage after power activation.

6. The semiconductor circuit according to claim 5, wherein
the first circuit includes an eleventh transistor that couples a first power supply and the second node by turning on, the first power supply corresponding to the predetermined voltage, and
the second circuit includes a twelfth transistor that couples the first power supply and the first node by turning on, the twelfth transistor having a larger gate width than a gate width of the eleventh transistor.

7. The semiconductor circuit according to claim 6, wherein
the second circuit includes a thirteenth transistor that couples a second power supply and the first node by turning on, the second power supply corresponding to a voltage different from the predetermined voltage, and
the first circuit includes a fourteenth transistor that couples the second power supply and the second node by turning on, the fourteenth transistor having a larger gate width than a gate width of the thirteenth transistor.

8. The semiconductor circuit according to claim 6, wherein
the first circuit includes an eleventh transistor that couples a first power supply and the second node by turning on, the first power supply corresponding to the predetermined voltage, and
the second circuit includes a twelfth transistor that couples the first power supply and the first node by turning on, the twelfth transistor having a smaller gate length than a gate length of the eleventh transistor.

9. The semiconductor circuit according to claim 6, wherein
the second circuit includes a thirteenth transistor that couples a second power supply and the first node by turning on, the second power supply corresponding to a voltage different from the predetermined voltage, and
the first circuit includes a fourteenth transistor that couples the second power supply and the second node by turning on, the fourteenth transistor having a smaller gate length than a gate length of the thirteenth transistor.

10. The semiconductor circuit according to claim 5, wherein
the second circuit includes a thirteenth transistor that couples a second power supply and the first node by turning on, the second power supply corresponding to a voltage different from the predetermined voltage, and
the first circuit includes a fourteenth transistor that couples the second power supply and the second node by turning on, the fourteenth transistor having a larger gate width than a gate width of the thirteenth transistor.

11. The semiconductor circuit according to claim 10, wherein
the first circuit includes an eleventh transistor that couples a first power supply and the second node by turning on, the first power supply corresponding to the predetermined voltage, and
the second circuit includes a twelfth transistor that couples the first power supply and the first node by turning on, the twelfth transistor having a smaller gate length than a gate length of the eleventh transistor.

12. The semiconductor circuit according to claim 5, wherein
the first circuit includes an eleventh transistor that couples a first power supply and the second node by turning on, the first power supply corresponding to the predetermined voltage, and
the second circuit includes a twelfth transistor that couples the first power supply and the first node by turning on, the twelfth transistor having a smaller gate length than a gate length of the eleventh transistor.

13. The semiconductor circuit according to claim 5, wherein
the second circuit includes a thirteenth transistor that couples a second power supply and the first node by turning on, the second power supply corresponding to a voltage different from the predetermined voltage, and
the first circuit includes a fourteenth transistor that couples the second power supply and the second node by turning on, the fourteenth transistor having a smaller gate length than a gate length of the thirteenth transistor.

14. The semiconductor circuit according to claim 5, wherein
the second circuit includes a twelfth transistor that couples a first power supply and the first node by turning on, the first power supply corresponding to the predetermined voltage,
the driver turns on the first transistor in a second period, and
in the second period, a current value of a current that flows, after power activation, from the first power supply to the first node via the twelfth transistor is between a first current value and a second current value, the first current value being of a current that flows from the first node to the first storage element via the first transistor when the first storage element is in the first resistance state, and the second current value being of a current that flows from the first node to the first storage element via the first transistor when the first storage element is in the second resistance state.

15. The semiconductor circuit according to claim 1, wherein
the first circuit includes an eleventh transistor and a fourteenth transistor, the eleventh transistor coupling a first power supply and the second node by turning on, the fourteenth transistor coupling a second power supply and the second node by turning on, and
the second circuit includes a twelfth transistor and a thirteenth transistor, the twelfth transistor coupling the first power supply and the first node by turning on and having the same size as the eleventh transistor, the thirteenth transistor coupling the second power supply and the first node by turning on and having the same size as the fourteenth transistor.

16. The semiconductor circuit according to claim 1, wherein
the driver generates the control voltage.

17. The semiconductor circuit according to claim 1, further comprising a power supply transistor that performs power supply to the first circuit and the second circuit by turning on.

18. The semiconductor circuit according to claim 1, further comprising a plurality of metal wiring layers, wherein
the first storage element is provided below a bottommost metal wiring layer among the plurality of metal wiring layers.

19. The semiconductor circuit according to claim 1, wherein
the first storage element stores information by using a resistance state changing reversibly in accordance with a direction of a current that flows between the first terminal and the second terminal.

20. The semiconductor circuit according to claim 19, wherein
the first storage element is one of a unipolar element or a bipolar element.

21. The semiconductor circuit according to claim 1, wherein
the first storage element is one of a magnetic tunnel junction storage element, a resistive random access storage element, a phase-change storage element, or a ferroelectric storage element.

22. The semiconductor circuit according to claim 1, wherein
the first storage element stores information by using a resistance state changing reversibly in accordance with a polarity of a voltage that is applied between the first terminal and the second terminal.

23. The semiconductor circuit according to claim 1, wherein
the first circuit and the second circuit are included in a SRAM circuit.

24. The semiconductor circuit according to claim 1, wherein
the first circuit and the second circuit are included in a latch circuit.

25. A semiconductor circuit, comprising:
a first circuit that is able to generate an inverted voltage of a voltage at a first node and apply the inverted voltage to a second node;
a second circuit that is able to generate an inverted voltage of a voltage at the second node and apply the inverted voltage to the first node;
a first transistor that couples the first node to a third node by turning on;
a first storage element having a first terminal coupled to the third node and a second terminal supplied with a control voltage, the first storage element being able to take a first resistance state or a second resistance state;
a first voltage setting circuit coupled to the third node the first voltage setting circuit being able to set a voltage at the third node to a voltage corresponding to a voltage at a predetermined node out of the first node and the second node, wherein the first voltage setting circuit includes:
a second transistor having a source, and a drain coupled to the third node, the second transistor turning on and off on a basis of the voltage at the predetermined node out of the first node and the second node and supplying a first voltage to the third node by turning on, and
a third transistor having a source, and a drain coupled to the third node, the third transistor turning on and off on the basis of the voltage at the predetermined node out of the first node and the second node and supplying a second voltage to the third node by turning on; and
a driver that controls an operation of the first transistor and sets the control voltage, wherein
the source of the second transistor is coupled to a first control line,
the source of the third transistor is coupled to a second control line, and
the driver includes:
a sixth transistor having a source to which the first voltage is applied and a drain coupled to the first control line, the sixth transistor supplying the first voltage to the first control line by turning on, and
a seventh transistor having a source to which the second voltage is applied and a drain coupled to the second control line, the seventh transistor supplying the second voltage to the second control line by turning on.

26. The semiconductor circuit according to claim 25, further comprising:
a third circuit that is able to generate an inverted voltage of a voltage at a fourth node and apply the inverted voltage to a fifth node;
a fourth circuit that is able to generate an inverted voltage of a voltage at the fifth node and apply the inverted voltage to the fourth node;
an eighth transistor that couples the fourth node to a sixth node by turning on;
a second storage element having a first terminal coupled to the sixth node and a second terminal supplied with the control voltage, the second storage element being able to take the first resistance state or the second resistance state; and
a second voltage setting circuit coupled to the sixth node, the second voltage setting circuit being able to set a voltage at the sixth node to a voltage corresponding to a voltage at a predetermined node out of the fourth node and the fifth node, wherein
the second voltage setting circuit includes:
a ninth transistor having a drain coupled to the sixth node and a source coupled to the first control line, the ninth transistor turning on and off on a basis of the voltage at the predetermined node out of the fourth node and the fifth node and supplying the first voltage to the sixth node by turning on, and a tenth transistor having a drain coupled to the sixth node and a source coupled to the second control line, the tenth transistor turning on and off on the basis of the voltage at the predetermined node out of the fourth node and the fifth node and supplying the second voltage to the sixth node by turning on.

27. A semiconductor circuit, comprising:
a first circuit that is able to generate an inverted voltage of a voltage at a first node and apply the inverted voltage to a second node;
a second circuit that is able to generate an inverted voltage of a voltage at the second node and apply the inverted voltage to the first node;
a first transistor that couples the first node to a third node by turning on;
a first storage element having a first terminal coupled to the third node and a second terminal supplied with a control voltage, the first storage element being able to take a first resistance state or a second resistance state;
a first voltage setting circuit coupled to the third node, the first voltage setting circuit being able to set a voltage at the third node to a voltage corresponding to a voltage at a predetermined node out of the first node and the second node;
a driver that controls an operation of the first transistor and sets the control voltage; and
a fifteenth transistor that couples the second node to the second terminal of the first storage element by turning on.

28. The semiconductor circuit according to claim 27, wherein
the first voltage setting circuit includes:
a second transistor having a source, and a drain coupled to the third node, the second transistor turning on and off on a basis of the voltage at the predetermined node out of the first node and the second node and supplying a first voltage to the third node by turning on, and
a third transistor having a source, and a drain coupled to the third node, the third transistor turning on and off on the basis of the voltage at the predetermined node out of the first node and the second node and supplying a second voltage to the third node by turning on.

29. The semiconductor circuit according to claim 27, wherein
the fifteenth transistor has a larger gate length than a gate length of the first transistor.

30. The semiconductor circuit according to claim 27, wherein
the fifteenth transistor has a smaller gate width than a gate width of the first transistor.

31. The semiconductor circuit according to claim 27, wherein
the driver turns on the first transistor and the fifteenth transistor in a second period, and
in the second period, a current that flows from the second node to the fifteenth transistor is between a first current value and a second current value, the first current value being of a current that flows from the first node to the first storage element via the first transistor when the first storage element is in the first resistance state, the second current value being of a current that flows from the first node to the first storage element via the first transistor when the first storage element is in the second resistance state.

32. A semiconductor circuit, comprising:
a first circuit that is able to generate an inverted voltage of a voltage at a first node and apply the inverted voltage to a second node;
a second circuit that is able to generate an inverted voltage of a voltage at the second node and apply the inverted voltage to the first node;
a first transistor that couples the first node to a third node by turning on;
a first storage element having a first terminal coupled to the third node and a second terminal supplied with a control voltage, the first storage element being able to take a first resistance state or a second resistance state;
a first voltage setting circuit coupled to the third node, the first voltage setting circuit being able to set a voltage at the third node to a voltage corresponding to a voltage at a redetermined node out of the first node and the second node; and
a driver that controls an operation of the first transistor and sets the control voltage;
a twenty-third transistor having a source to which a first voltage is applied and a drain coupled to a second terminal of the first storage element, the twenty-third transistor supplying the first voltage to the second terminal of the first storage element by turning on; and
a twenty-fourth transistor having a source to which a second voltage is applied and a drain coupled to the second terminal of the first storage element, the twenty-fourth transistor supplying the second voltage to the second terminal of the first storage element by turning on, wherein
the driver further controls an operation of each of the twenty-third transistor and the twenty-fourth transistor.

33. The semiconductor circuit according to claim 32, wherein
the first voltage setting circuit includes:
a second transistor having a source, and a drain coupled to the third node, the second transistor turning on and off on a basis of the voltage at the predetermined node out of the first node and the second node and supplying a first voltage to the third node by turning on, and
a third transistor having a source, and a drain coupled to the third node, the third transistor turning on and off on the basis of the voltage at the predetermined node out of the first node and the second node and supplying a second voltage to the third node by turning on.

34. A semiconductor circuit, comprising:
a first circuit that is able to generate an inverted voltage of a voltage at a first node and apply the inverted voltage to a second node;
a second circuit, that is able to generate an inverted voltage of a voltage at the second node and apply the inverted voltage to the first node;
a first transistor that couples the first node to a third node by turning on;
a first storage element having a first terminal coupled to the third node and a second terminal supplied with a control voltage, the first storage element being able to take a first resistance state or a second resistance state;
a first voltage setting circuit coupled to the third node the first voltage setting circuit being able to set a voltage at the third node to a voltage corresponding to a voltage at a predetermined node out of the first node and the second node wherein the first voltage setting circuit includes:
a second transistor having a source, and a drain coupled to the third node, the second transistor turning on and off on a basis of the voltage at the predetermined node out of the first node and the second node and supplying a first voltage to the third node by turning on, and
a third transistor having a source, and a drain coupled to the third node, the third transistor turning on and off on the basis of the voltage at the predetermined node out of the first node and the second node and supplying a second voltage to the third node by turning on;
a driver that controls an operation of the first transistor and sets the control voltage; and
a contact, wherein
a predetermined transistor among the first transistor, the second transistor, and the third transistor includes a diffusion layer, and
the diffusion layer, the contact, and the first storage element are stacked in this order.

35. A semiconductor circuit, comprising:
a first circuit that is able to generate an inverted voltage of a voltage at a first node and apply the inverted voltage to a second node;
a second circuit that is able to generate an inverted voltage of a voltage at the second node and apply the inverted voltage to the first node;
a first transistor that couples the first node to a third node by turning on;
a first storage element having a first terminal coupled to the third node and a second terminal supplied with a control voltage, the first storage element being able to take a first resistance state or a second resistance state;
a first voltage setting circuit coupled to the third node, the first voltage setting circuit being able to set a voltage at the third node to a voltage corresponding to a voltage at a predetermined node out of the first node and the second node, wherein the first voltage setting circuit includes:
  a second transistor having a source, and a drain coupled to the third node, the second transistor turning on and off on a basis of the voltage at the predetermined node out of the first node and the second node and supplying a first voltage to the third node by turning on, and
  a third transistor having a source, and a drain coupled to the third node, the third transistor turning on and off on the basis of the voltage at the predetermined node out of the first node and the second node and supplying a second voltage to the third node by turning on;
a sixteenth transistor that couples the second node to a seventh node by turning on;
a third storage element having a first terminal coupled to the seventh node and a second terminal supplied with the control voltage, the third storage element being able to take the first resistance state or the second resistance state;
a third voltage setting circuit coupled to the seventh node, the third voltage setting circuit setting a voltage at the seventh node to a voltage corresponding to the voltage at the predetermined node out of the first node and the second node, wherein the third voltage setting circuit includes:
  a seventeenth transistor having a source, and a drain coupled to the seventh node, the seventeenth transistor turning on and off on a basis of a voltage at a different node from the predetermined node and supplying the first voltage to the seventh node by turning on, the different node being one out of the first node and the second node, and
  an eighteenth transistor having a source, and a drain coupled to the seventh node, the eighteenth transistor turning on and off on the basis of the voltage at the different node from the predetermined node and supplying the second voltage to the seventh node by turning on, the different node being one out of the first node and the second node;
a driver that controls an operation of each of the first transistor and the sixteenth transistor and sets the control voltage;
a fourth transistor having a source to which the first voltage is applied and a drain coupled to the source of the second transistor, the fourth transistor supplying the first voltage to the source of the second transistor by turning on;
a fifth transistor having a source to which the second voltage is applied and a drain coupled to the source of the third transistor, the fifth transistor supplying the second voltage to the source of the third transistor by turning on;
a nineteenth transistor having a source to which the first voltage is applied and a drain coupled to the source of the seventeenth transistor, the nineteenth transistor supplying the first voltage to the source of the seventeenth transistor by turning on; and
a twentieth transistor having a source to which the second voltage is applied and a drain coupled to the source of the eighteenth transistor, the twentieth transistor supplying the second voltage to the source of the eighteenth transistor by turning on, wherein
the driver further controls an operation of each of the fourth transistor, the fifth transistor, the nineteenth transistor, and the twentieth transistor.

36. The semiconductor circuit according to claim 35, wherein
each of the first storage element and the third storage element is one of a unipolar element or a bipolar element.

37. The semiconductor circuit according to claim 35, wherein
each of the first storage element and the third storage element is one of a magnetic tunnel junction storage element, a resistive random access storage element, a phase-change storage element, or a ferroelectric storage element.

38. The semiconductor circuit according to claim 35, further comprising
a power supply transistor that performs power supply to the first circuit and the second circuit by turning on.

39. A semiconductor circuit, comprising:
a first circuit that is able to generate an inverted voltage of a voltage at a first node and apply the inverted voltage to a second node;
a second circuit that is able to generate an inverted voltage of a voltage at the second node and apply the inverted voltage to the first node;
a first transistor that couples the first node to a third node by turning on;
a first storage element having a first terminal coupled to the third node and a second terminal supplied with a control voltage, the first storage element being able to take a first resistance state or a second resistance state;
a first voltage setting circuit coupled to the third node, the first voltage setting circuit being able to set a voltage at the third node to a voltage corresponding to a voltage at a predetermined node out of the first node and the second node, wherein the first voltage setting circuit includes:
- a second transistor having a source, and a drain coupled to the third node, the second transistor turning on and off on a basis of the voltage at the predetermined node out of the first node and the second node and supplying a first voltage to the third node by turning on, and
- a third transistor having a source, and a drain coupled to the third node, the third transistor turning on and off on the basis of the voltage at the predetermined node out of the first node and the second node and supplying a second voltage to the third node by turning on;

a sixteenth transistor that couples the second node to a seventh node by turning on;
a third storage element having a first terminal coupled to the seventh node and a second terminal supplied with the control voltage, the third storage element being able to take the first resistance state or the second resistance state;
a third voltage setting circuit coupled to the seventh node, the third voltage setting circuit setting a voltage at the seventh node to a voltage corresponding to the voltage at the predetermined node out of the first node and the second node, wherein the third voltage setting circuit includes:
- a seventeenth transistor having a source, and a drain coupled to the seventh node, the seventeenth transistor turning on and off on a basis of a voltage at a different node from the predetermined node and supplying the first voltage to the seventh node by turning on, the different node being one out of the first node and the second node, and
- an eighteenth transistor having a source, and a drain coupled to the seventh node, the eighteenth transistor turning on and off on the basis of the voltage at the different node from the predetermined node and supplying the second voltage to the seventh node turning on, the different node being one out of the first node and the second node;
- a driver that controls an operation of each of the first transistor and the sixteenth transistor and sets the control voltage;

a twenty-first transistor having a source to which the first voltage is applied and a drain coupled to the source of the second transistor and the source of the seventeenth transistor, the twenty-first transistor supplying the first voltage to the source of the second transistor and the source of the seventeenth transistor by turning on; and
a twenty-second transistor having a source to which the second voltage is applied and a drain coupled to the source of the third transistor and the source of the eighteenth transistor, the twenty-second transistor supplying the second voltage to the source of the third transistor and the source of the eighteenth transistor by turning on, wherein
the driver further controls an operation of each of the twenty-first transistor and the twenty-second transistor.

40. A semiconductor circuit, comprising
a first circuit that is able to generate an inverted voltage of a voltage at a first node and apply the inverted voltage to a second node,
a second circuit that is able to generate an inverted voltage of a voltage at the second node and apply the inverted voltage to the first node;
a first transistor that couples the first node to a third node by turning on:
a first storage element having a first terminal coupled to the third node and a second terminal supplied with a control voltage, the first storage element being able to take a first resistance state or a second resistance state;
a first voltage setting circuit coupled to the third node, the first voltage setting circuit being able to set a voltage at the third node to a voltage corresponding to a voltage at a predetermined node out of the first node and the second node, wherein the first voltage setting circuit includes:
- a second transistor having a source, and a drain coupled to the third node, the second transistor turning on and off on a basis of the voltage at the predetermined node out of the first node and the second node and supplying a first voltage to the third node by turning on, and
- a third transistor having a source, and a drain coupled to the third node, the third transistor turning on and off on the basis of the voltage at the predetermined node out of the first node and the second node and supplying a second voltage to the third node by turning on;

a sixteenth transistor that couples the second node to a seventh node by turning on;
a third storage element having a first terminal coupled to the seventh node and a second terminal supplied with the control voltage, the third storage element being able to take the first resistance state or the second resistance state;
a third voltage setting circuit coupled to the seventh node, the third voltage setting circuit setting a voltage at the seventh node to a voltage corresponding to the voltage at the predetermined node out of the first node and the second node, wherein the third voltage setting circuit includes:
- a seventeenth transistor having a source, and a drain coupled to the seventh node, the seventeenth transistor turning on and off on a basis of a voltage at a different node from the predetermined node and supplying the first voltage to the seventh node by turnig on, the different node being one out of the first node and the second node, and
- an eighteenth transistor having a source, and a drain coupled to the seventh node, the eighteenth transistor turning on and off on the basis of the voltage at the different node from the predetermined node and supplying the second voltage to the seventh node by turning on, the different node being one out of the first node and the second node; and
- a driver that controls an operation of each of the first transistor and the sixteenth transistor and sets the control voltage, wherein the source of the second transistor is coupled to a first control line,
the source of the third transistor is coupled to a second control line,
the source of the seventeenth transistor is coupled to the first control line,
the source of the eighteenth transistor is coupled to the second control line, and
the driver includes:
a sixth transistor having a source to which the first voltage is applied and a drain coupled to the first control line, the sixth transistor supplying the first voltage to the first control line by turning on, and a seventh transistor having a source to which the second voltage is applied and a drain coupled to the second control line, the seventh transistor supplying the second voltage to the second control line by turning on.

41. A semiconductor circuit, comprising:

a first circuit that is able to generate an inverted voltage of a voltage at a first node and apply the inverted voltage to a second node;

a second circuit, that is able to generate an inverted voltage of a voltage at the second node and apply the inverted voltage to the first node;

a first transistor that couples the first node to a third node by turning on;

a first storage element having a first terminal coupled to the third node and a second terminal supplied with a control voltage, the first storage element being able to take a first resistance state or a second resistance state;

a first voltage setting circuit coupled to the third node, the first voltage setting circuit being able to set a voltage at the third node to a voltage corresponding to a voltage at a predetermined node out of the first node and the second node, wherein the first voltage setting circuit includes:
- a second transistor having a source, and a drain coupled to the third node, the second transistor turning on and off on a basis of the voltage at the predetermined node out of the first node and the second node and supplying a first voltage to the third node by turning on, and
- a third transistor having a source, and a drain coupled to the third node, the third transistor turning on and off on the basis of the voltage at the predetermined node out of the first node and the second node and supplying a second voltage to the third node by turning on;

a sixteenth transistor that couples the second node to a seventh node by turning on;

a third storage element having a first terminal coupled to the seventh node and a second terminal supplied with the control voltage, the third storage element being able to take the first resistance state or the second resistance state;

a third voltage setting circuit coupled to the seventh node, the third voltage setting circuit setting a voltage at the seventh node to a voltage corresponding to the voltage at the predetermined node out of the first node and the second node, wherein the third voltage setting circuit includes:
- a seventeenth transistor having a source, and a drain coupled to the seventh node, the seventeenth transistor turning on and off on a basis of a voltage at a different node from the predetermined node and supplying the first voltage to the seventh node by turning on, the different node being one out of the first node and the second node, and
- an eighteenth transistor having a source, and a drain coupled to the seventh node, the eighteenth transistor turning on and off on the basis of the voltage at the different node from the predetermined node and supplying the second voltage to the seventh node by turning on, the different node being one out of the first node and the second node; and a driver that controls an operation of each of the first, transistor and the sixteenth transistor and sets the control voltage, wherein a predetermined transistor among the first transistor, the second transistor, and the third transistor includes a diffusion layer, and the diffusion layer, the contact, and the first storage element are stacked in this order.

\* \* \* \* \*